(12) United States Patent
Kodama

(10) Patent No.: US 6,808,862 B2
(45) Date of Patent: Oct. 26, 2004

(54) POSITIVE PHOTOSENSITIVE COMPOSITION

(75) Inventor: Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/174,944

(22) Filed: Jun. 20, 2002

(65) Prior Publication Data

US 2003/0044717 A1 Mar. 6, 2003

(30) Foreign Application Priority Data

Jun. 21, 2001 (JP) ..................... P.2001-188499

(51) Int. Cl.⁷ .............................. G03F 7/004
(52) U.S. Cl. .................. 430/270.1; 430/905; 430/914; 430/921; 430/923
(58) Field of Search .............. 430/270.1, 914

(56) References Cited

U.S. PATENT DOCUMENTS 6,200,728 B1 * 3/2001 Cameron et al. ........ 430/270.1
6,280,898 B1 * 8/2001 Hasegawa et al. ....... 430/270.1
6,365,321 B1 * 4/2002 Chen et al. ............. 430/270.1
6,444,396 B1 * 9/2002 Watanabe et al. ........ 430/270.1

FOREIGN PATENT DOCUMENTS

| | | |
|---|---|---|
| EP | 1 041 442 A1 | 10/2000 |
| JP | 2000-241965 A | 10/2000 |
| JP | 2000-275845 A | 10/2000 |
| JP | 2000-292917 A | 10/2000 |

* cited by examiner

*Primary Examiner*—Rosemary Ashton
(74) *Attorney, Agent, or Firm*—Sughrue Mion, PLLC

(57) ABSTRACT

A positive photosensitive composition comprising (A1) a compound that generates an alkanesulfonic acid in which the α-position is substituted with a fluorine atom upon irradiation of an actinic ray or radiation, (A2) an onium salt of an alkanesulfonic acid in which the α-position is not substituted with a fluorine atom, and (B) a resin that has a monocyclic or polycyclic alicyclic hydrocarbon structure and is decomposed by the action of an acid to increase a solubility rate in an alkali developing solution.

21 Claims, No Drawings

POSITIVE PHOTOSENSITIVE COMPOSITION

FIELD OF THE INVENTION

The present invention relates to a positive photosensitive composition used in the production process of semiconductor devices, for example, IC, in the production of circuit substrates for liquid crystals or thermal heads, or in other photofabrication processes. More specifically, the present invention pertains to a positive photosensitive composition suitable for use a far ultraviolet ray of not more than 250 nm as a light source for exposure.

BACKGROUND OF THE INVENTION

A chemically amplified positive resist composition is a pattern formation material in which an acid is generated in the exposed area upon irradiation of radiation, for example, a far ultraviolet ray, and solubility in a developer between the exposed area and unexposed area is differentiated by a reaction using the acid as a catalyst, whereby a pattern is formed on a substrate.

Since the composition is mainly composed of a resin having as a basic skeleton, poly(hydroxystyrene) that has a small absorption in a region of 248 nm, a good pattern with high sensitivity and high resolution is formed, when a KrF excimer laser is used as a light source for exposure. Thus, the composition is superior to a conventional resist composition using a naphthoquinonediazide/novolac resin.

When a light source having a shorter wavelength, e.g., an ArF excimer laser (193 nm) is used for exposure, on the other hand, since an aromatic group-containing compound essentially has a large absorption in a region of 193 nm, the above-described chemically amplified composition is still insufficient.

The use of poly(meth)acrylate as a polymer having a small absorption in a wavelength range of 193 nm is described in *J. Vac. Sci. Technol.*, B9, 3357(1991). The polymer has, however, a problem in that resistance to dry etching ordinarily performed in a semiconductor production process is low in comparison with conventional phenolic resins having an aromatic group.

A mixed acid generator of a specific sulfonium salt (an anion having from 1 to 15 carbon atoms) and a triarylsulfonium salt is described in JP-A-2000-292917 (the term "JP-A" as used herein means an "unexamined published Japanese patent application"), a mixed acid generator of a triphenylsulfonium salt of a perfluoroalkanesulfonic acid having from 4 to 8 carbon atoms and a 2-alkyl-2-adamantyl (meth)acrylate is described in JP-A-2000-275845, and a mixed acid generator of a specific sulfonium salt (an anion having from 1 to 8 carbon atoms) and a triphenylsulfonium salt or iodonium salt of a perfluoroalkanesulfonic acid having from 4 to 8 carbon atoms is described in EP 1041442A.

As increasing fine processing of semiconductor device, it has been desired more and more for a photoresist to have a low pitch dependency, specifically, to be capable of forming good patterns in both a dense portion and a sparse portion, in addition to improved sensitivity and resolution in lithography using a chemically amplified resist for far ultraviolet ray exposure. However, means for improving the pitch dependency of chemically amplified resist for far ultraviolet ray exposure has been scarcely disclosed. The addition of an orthoester compound to a chemically amplified resist composition for a KrF excimer laser for improving the pitch dependency is just described in JP-A-11-160876.

A resist composition containing a resin based on hydroxystyrene having a high hydrophilicity and a mixture of acid generators generating acids having acidities different from each other is described in JP-A-2000-241965. However, since the hydroxystyrene structure has an excessively high absorption to light of not more than 220 nm, e.g., an ArF excimer laser (193 nm), a problem of the formation of a pattern profile called taper arises, when such a resist composition is used for the formation of resist pattern.

SUMMARY OF THE INVENTION

Therefore, an object of the present invention is to provide a positive photosensitive composition that is excellent in sensitivity and resolution.

Another object of the present invention is to provide a positive photosensitive composition that exhibits a low pitch dependency as well as excellent sensitivity and resolution.

Other objects of the present invention will become apparent from the following description.

As a result of the intensive investigations, it has been found that the above-described objects can be accomplished by using compounds generating acids having specific structures in combination to complete the present invention.

Specifically, the present invention includes the following positive photosensitive compositions:

1. A positive photosensitive composition comprising (A1) a compound that generates an alkanesulfonic acid in which the α-position is substituted with a fluorine atom upon irradiation of an actinic ray or radiation, (A2) an onium salt of an alkanesulfonic acid in which the α-position is not substituted with a fluorine atom, and (B) a resin that has a monocyclic or polycyclic alicyclic hydrocarbon structure and is decomposed by the action of an acid to increase a solubility rate in an alkali developing solution.

2. The positive photosensitive composition as described in item (1) above, wherein the resin of component (B) contains a repeating unit having a lactone structure.

3. The positive photosensitive composition as described in item (1) or (2) above, wherein the compound of component (A1) is a sulfonium salt.

4. The positive photosensitive composition as described in any one of items (1) to (3) above, wherein the onium salt of component (A2) is a sulfonium salt, an iodonium salt or an ammonium salt.

DETAILED DESCRIPTION OF THE INVENTION

The positive photosensitive composition according to the present invention will be described in more detail below.

<<Component (A1)>>

Any compound that generates an alkanesulfonic acid in which the α-position is substituted with a fluorine atom upon irradiation of an actinic ray or radiation (hereinafter, also referred to as an acid generator) can be used as the compound of component (A1) in the present invention.

The compound that generates an alkanesulfonic acid in which the α-position is substituted with a fluorine atom includes an onium salt, e.g., a sulfonium salt or an iodonium salt, an oxymesulfonate compound, an imidosulfonate compound and o-nitrobenzylsulfonate compound.

Preferred examples thereof include a sulfonium salt, which is composed of an anion portion and a cation portion, represented by the following formula (A1):

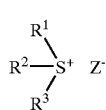

(A1)

In formula (A1), $R^1$, $R^2$ and $R^3$, which may be the same or different, each independently represent an organic residue. A number of carbon atom included in the organic residue represented by $R^1$, $R^2$ or $R^3$ is ordinarily from 1 to 30, and preferably from 1 to 20.

Alternatively, two of $R^1$, $R^2$ and $R^3$ may be combined with each other to form a ring, and the ring may contain an oxygen atom, a sulfur atom, an ester bond, an amido bond or a carbonyl group. The group formed by combining two of $R^1$, $R^2$ and $R^3$ includes an alkylene group (e.g., butylene or pentylene group).

Specific examples of the organic residue represented by $R^1$, $R^2$ or $R^3$ include corresponding groups in Compounds (A1-1), (A1-2) and (A1-3) described below.

$Z^-$ represents a counter anion, specifically an alkanesulfonic acid anion in which the carbon atom at the α-position is substituted with a fluorine atom and which is represented by $R^FSO_3^-$.

The $R^F$, which represents the alkane portion of the alkanesulfonic acid, is not particularly limited and includes a straight chain, branched or cyclic alkyl group having from 1 to 20 carbon atoms, e.g., methyl, ethyl, propyl, butyl, hexyl, octyl, dodecyl, tetradecyl or hexadecyl group, and preferably a straight chain, branched or cyclic alkyl group having from 4 to 16 carbon atoms.

At least one fluorine atom should be present at the α-position of the alkanesulfonic acid, and the alkanesulfonic acid may also have other fluorine atoms in other portions thereof.

Preferred examples of the $R^F$ include a fluorine-substituted straight chain alkyl group represented by $CF_3(CF_2)_y$, wherein y represents an integer of from 0 to 15, preferably an integer of from 1 to 9, and more preferably an integer of from 1 to 5. By using the fluorine-substituted straight chain alkyl group represented by $CF_3(CF_2)_y$, excellent balance of sensitivity and resolution is achieved and change in performance with the passage of time from exposure to post heating is reduced.

Specific examples of the $R^F$ include $CF_3$—, $CF_3CF_2$—, $CF_3CHFCF_2$—, $CF_3(CF_2)_2$—, $CF_3(CF_2)_3$—, $CF_3(CF_2)_4$—, $CF_3(CF_2)_5$—, $CF_3(CF_2)_7$—, $CF_3(CF_2)_9$—, $CF_3(CF_2)_{11}$—, $CF_3(CF_2)_{13}$— and $CF_3(CF_2)_{15}$—, preferably $CF_3CF_2$—, $CF_3(CF_2)_2$—, $CF_3(CF_2)_3$—, $CF_3(CF_2)_4$—, $CF_3(CF_2)_5$—, $CF_3(CF_2)_7$— and $CF_3(CF_2)_9$—, more preferably $CF_3CF_2$—, $CF_3(CF_2)_2$—, $CF_3(CF_2)_3$—, $CF_3(CF_2)_4$— and $CF_3(CF_2)_5$—, and particularly preferably $CF_3(CF_2)_3$—.

The alkane portion may have a substituent. Examples of the substituent include an alkyl group, a hydroxy group, a halogen atom, an alkoxy group (preferably having from 1 to 5 carbon atoms, e.g., methoxy, ethoxy, propoxy or butoxy group), an alkoxycarbonyl group (preferably having from 2 to 6 carbon atoms, e.g., methoxycarbonyl, ethoxycarbonyl, propoxycarbonyl or butoxycarbonyl group), an acyl group (preferably having from 2 to 15 carbon atoms), an acyloxy group (preferably having from 2 to 15 carbon atoms), an amino group, a carboxy group, an alkylsulfonylamino group (preferably having from 1 to 5 carbon atoms), an alkylsulfonyloxy group (preferably having from 1 to 5 carbon atoms), a cyano group and an oxo group.

The alkane portion may also have a connecting group in the alkyl chain. Preferred examples of the connecting group include an ester bond, an amido bond, a sulfonamido bond, —O—, —S— and a combination of two or more thereof.

A compound having two or more structures represented by formula (A1) may also be employed. Such a compound includes, for example, a compound wherein at least one of $R^1$, $R^2$ and $R^3$ in the compound represented by formula (A1) is connected with at least one of $R^1$, $R^2$ and $R^3$ in another compound represented by formula (A1).

Of the compounds of component (A1), Compounds (A1-1), (A1-2) and (A1-3) described below are preferred.

Now, Compound (A1-1) is described below.

Compound (A1-1) is a triarylsulfonium compound represented by formula (A1) wherein $R^1$, $R^2$ and $R^3$ each represent an aryl group. Specifically, the compound has a triarylsulfonium as a cation.

The aryl group of the triarylsulfonium cation is preferably a phenyl group or a naphthyl group, and more preferably a phenyl group. Three aryl groups of the triarylsulfonium cation may be the same or different.

The aryl group may have a substituent, for example, an alkyl group (e.g., an alkyl group having from 1 to 15 carbon atoms), an alkoxy group (e.g., an alkoxy group having from 1 to 15 carbon atoms), a halogen atom, a hydroxy group or a phenylthio group. Preferred examples of the substituent include a straight chain, branched or cyclic alkyl group having from 1 to 12 carbon atoms and a straight chain, branched or cyclic alkoxy group having from 1 to 12 carbon atoms, and an alkyl group having from 1 to 4 carbon atoms and an alkoxy group having from 1 to 4 carbon atoms are most preferred. The substituent may be present on one of the three aryl groups. Also, the substituents may present on all of three aryl groups. It is preferred that the substituent is present on the p-position of aryl group.

The anion of triarylsulfonium compound is an alkanesulfonic acid anion in which the carbon atom at the α-position is substituted with a fluorine atom and includes the above-described sulfonic acid anion. Preferred examples of the anion include a perfluoroalkanesulfonic acid anion having from 1 to 8 carbon atoms, and a perfluorobutanesulfonic acid anion, a perfluorooctanesulfonic acid anion, a trifluoromethanesulfonic acid anion and a perfluoroethoxyethanesulfonic acid anion are more preferred. By using such an alkanesulfonic acid anion, a decomposition rate of an acid-decomposable group is amplified to increase sensitivity, and diffusion of the acid generated is controlled to improve resolution.

The triarylsulfonium structure may be connected with another triarylsulfonium structure through a connecting group, e.g., —S— to form a compound having two or more of the triarylsulfonium structures.

Specific examples of the triarylsulfonium compound for use in the present invention are set forth below, but the present invention should not be construed as being limited thereto.

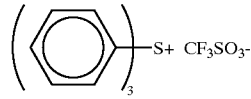

(I-1)

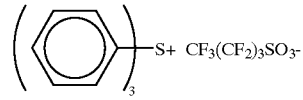

(I-2)

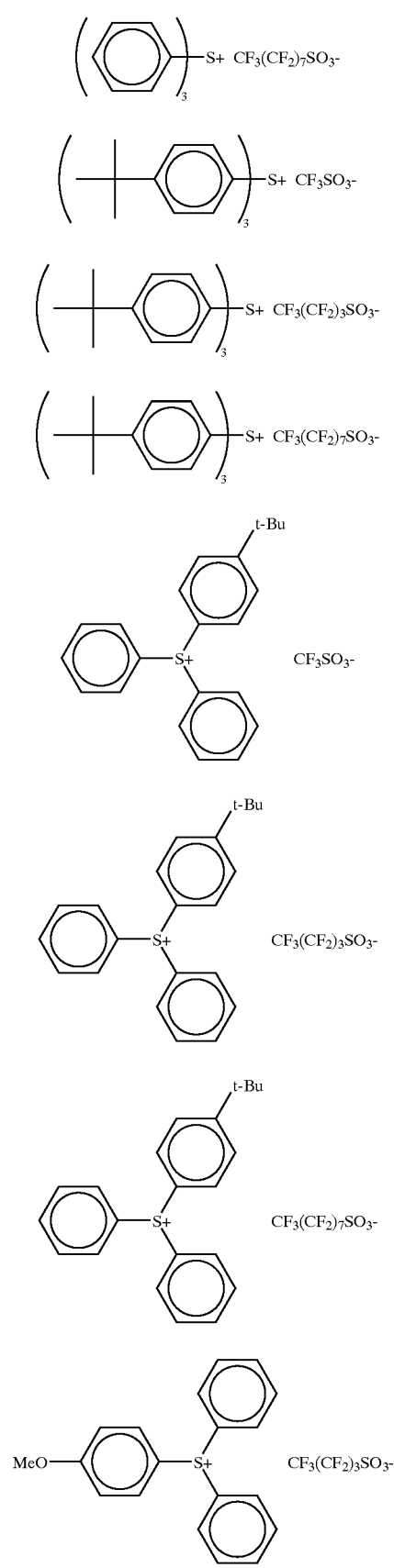
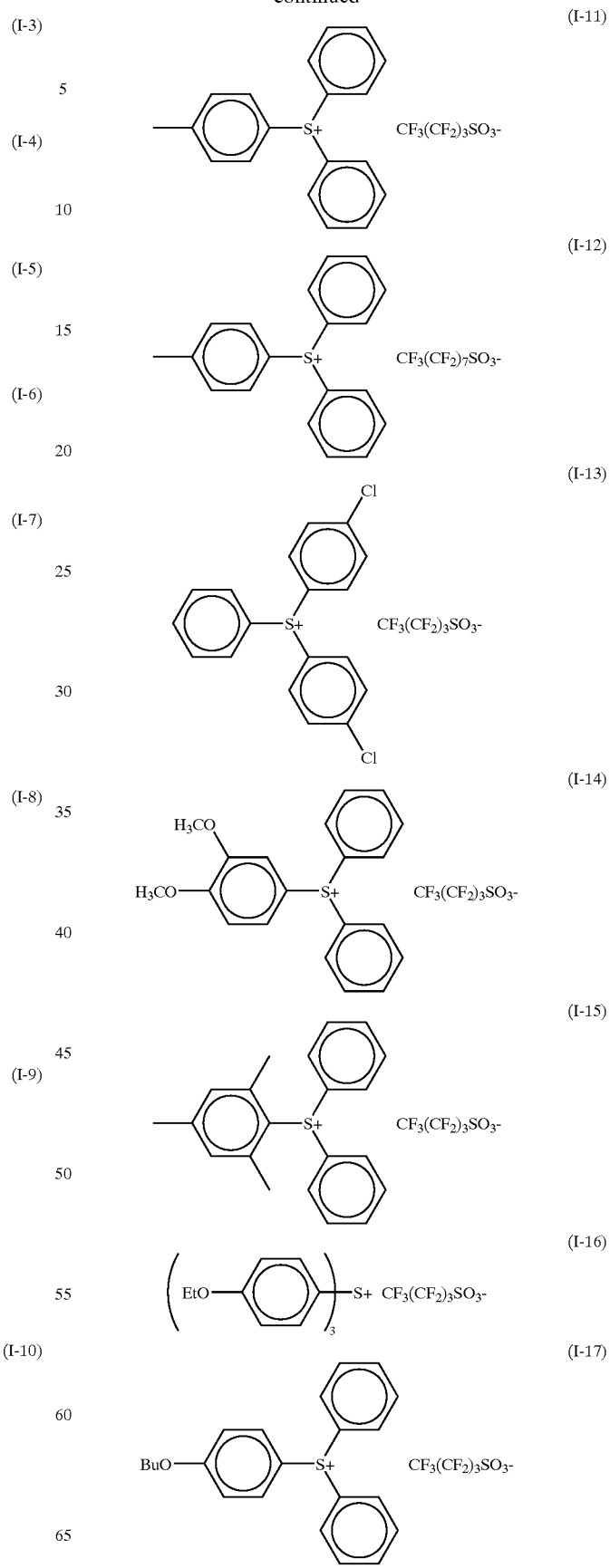

-continued (I-18)
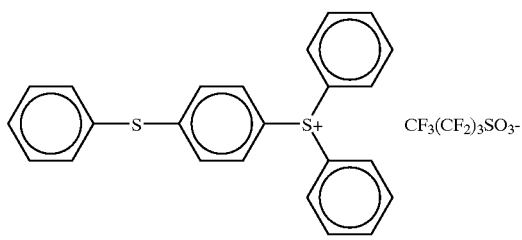

(I-19)
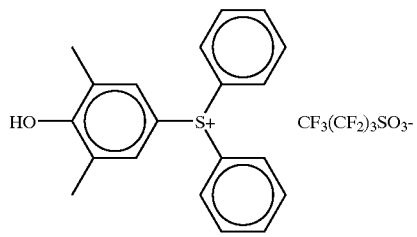

(I-20)
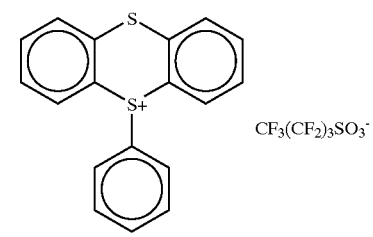

(I-21)
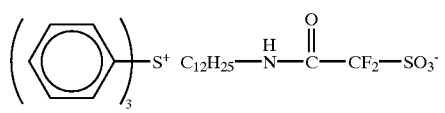

(I-22)
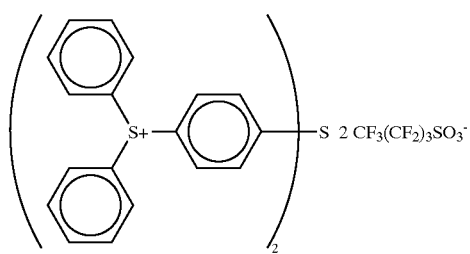

(I-23)
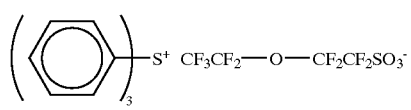

(I-24)
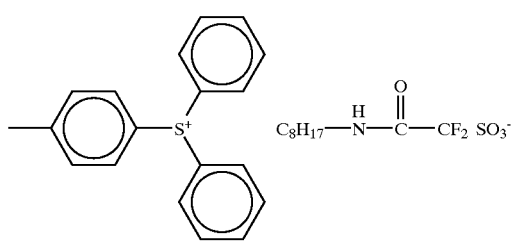

(I-25)
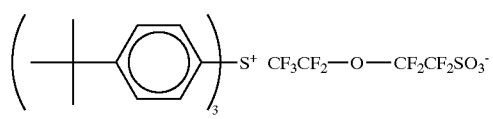

-continued (I-26)
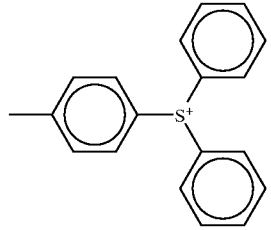 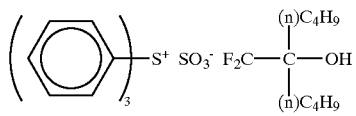

(I-27)
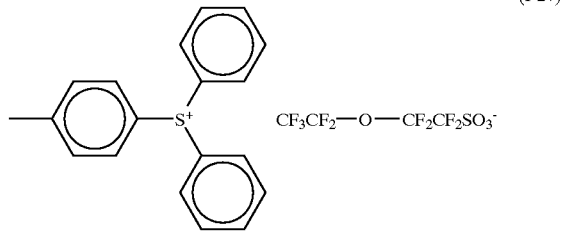

Now, Compound (A1-2) is described below.

Compound (A1-2) is a compound represented by formula (A1) wherein $R^1$, $R^2$ and $R^3$ each independently represent an organic residue that does not contain an aromatic ring. The term "aromatic ring" used herein includes an aromatic ring containing a hetero atom.

The organic residue that does not contain an aromatic ring has ordinarily from 1 to 30 carbon atoms, and preferably from 1 to 20 carbon atoms.

In Compound (A1-2), $R^1$, $R^2$ and $R^3$ each preferably represent an alkyl group, a 2-oxoalkyl group, an alkoxycarbonylmethyl group, an allyl group or a vinyl group, more preferably a straight chain, branched or cyclic 2-oxoalkyl group or an alkoxycarbonylmethyl group, and most preferably a straight chain or branched 2-oxoalkyl group.

The alkyl group represented by $R^1$, $R^2$ or $R^3$ may be a straight chain, branched or cyclic alkyl group, and is preferably a straight chain or branched alkyl group having from 1 to 10 carbon atoms (e.g., methyl, ethyl, propyl, butyl or pentyl group) or a cyclic alkyl group having from 3 to 10 carbon atoms (e.g., cyclopentyl, cyclohexyl or norbornyl group).

The 2-oxoalkyl group represented by $R^1$, $R^2$ or $R^3$ may be a straight chain, branched or cyclic 2-oxoalkyl group, and is preferably a group having >C=O on the 2-position of the alkyl group described above.

The alkoxy group in the alkoxycarbonylmethyl group is preferably an alkoxy group having from 1 to 5 carbon atoms (e.g., methoxy, ethoxy, propoxy, butoxy or pentoxy group).

The organic residue represented by. $R^1$, $R^2$ or $R^3$ may be further substituted with a halogen atom, an alkoxy group (e.g., an alkoxy group having from 1 to 5 carbon atoms), a hydroxy group, a cyano group or a nitro group.

Alternatively, two of $R^1$, $R^2$ and $R^3$ may be combined with each other to form a ring, and the ring may contain an oxygen atom, a sulfur atom, an ester bond, an amido bond or a carbonyl group. The group formed by combining two of $R^1$, $R^2$ and $R^3$ includes an alkylene group (e.g., butylene or pentylene group).

It is preferred from the standpoint of photo reactivity that one of $R^1$, $R^2$ and $R^3$ represents a group containing a carbon-carbon double bond or a carbon-oxygen double bond.

The anion of sulfonium compound having no aromatic ring is an alkanesulfonic acid anion in which the carbon atom at the α-position is substituted with a fluorine atom and includes the above-described sulfonic acid anion. Preferred examples of the anion include a perfluoroalkanesulfonic acid anion having from 1 to 8 carbon atoms, and a perfluorobutanesulfonic acid anion and a perfluorooctanesulfonic acid anion are more preferred. By using such an alkanesulfonic acid anion, a decomposition rate of an acid-decomposable group is amplified to increase sensitivity, and diffusion of the acid generated is controlled to improve resolution.

Specific examples of the sulfonium compound having no aromatic ring for use in the present invention are set forth below, but the present invention should not be construed as being limited thereto.

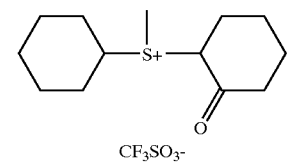
(II-1)

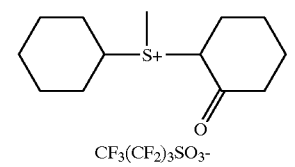
(II-2)

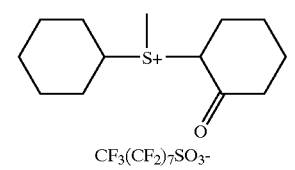
(II-3)

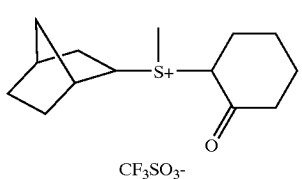
(II-4)

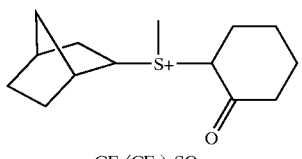
(II-5)

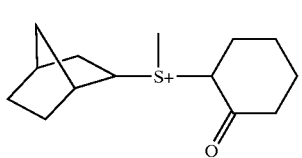
(II-6)

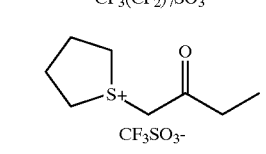
(II-7)

(II-8)

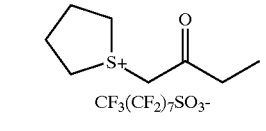
(II-9)

-continued

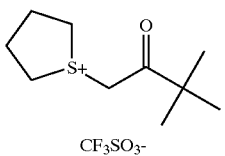
(II-10)

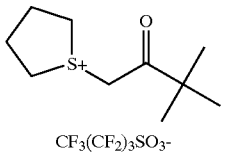
(II-11)

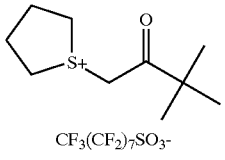
(II-12)

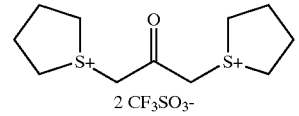
(II-13)

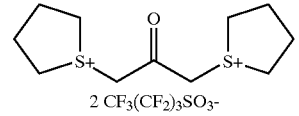
(II-14)

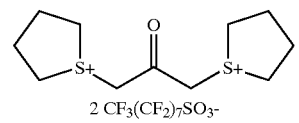
(II-15)

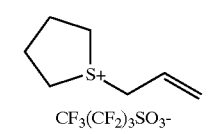
(II-16)

(II-17)

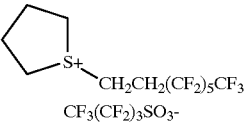
(II-18)

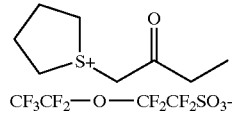
(II-19)

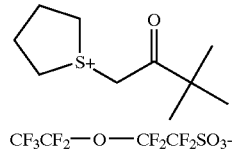
(II-20)

-continued (II-21)
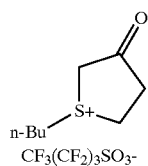
CF₃(CF₂)₃SO₃⁻

(II-22)
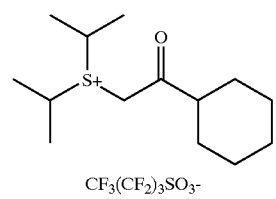
CF₃(CF₂)₃SO₃⁻

(II-23)
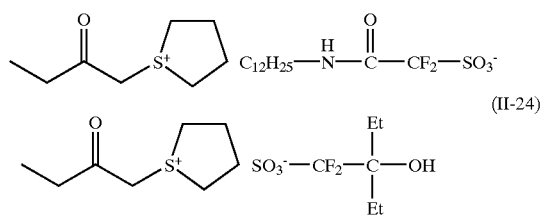

(II-24)
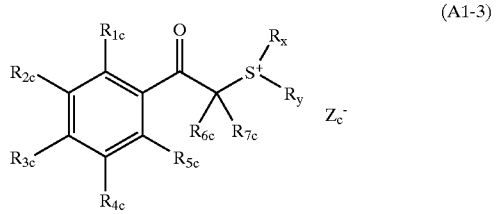

Now, Compound (A1-3) is described below.

Compound (A1-3) is a compound represented by formula (A1-3) shown below. Specifically, the compound has a phenacylsulfonium salt structure.

(A1-3)

In formula (A1-3), $R_{1c}$ to $R_{5c}$, which may be the same or different, each independently represent a hydrogen atom, an alkyl group, an alkoxy group or a halogen atom.

$R_{6c}$ and $R_{7c}$, which may be the same or different, each independently represent a hydrogen atom, an alkyl group or an aryl group.

$R_x$ and $R_y$, which may be the same or different, each independently represent an alkyl group, a 2-oxoalkyl group, an alkoxycarbonylmethyl group, an allyl group or a vinyl group.

Two or more of $R_{1c}$ to $R_{7c}$ and $R_x$ and $R_y$ may be combined with each other to form a ring structure, respectively, and the ring structure may contain an oxygen atom, a sulfur atom, an ester bond or an amido bond.

$Z_c^-$ represents an alkanesulfonio acid anion in which the carbon atom at the α-position is substituted with a fluorine atom.

The alkyl group represented by any one of $R_{1c}$ to $R_{5c}$ may be a straight chain, branched or cyclic alkyl group, includes, for example, an alkyl group having from 1 to 10 carbon atoms, and is preferably a straight chain or branched alkyl group having from 1 to 5 carbon atoms (e.g., methyl, ethyl, straight chain or branched propyl, straight chain or branched butyl or straight chain or branched pentyl group) or a cyclic alkyl group having from 3 to 8 carbon atoms (e.g., cyclopentyl or cyclohexyl group).

The alkoxy group represented by any one of $R_{1c}$ to $R_{5c}$ may be a straight chain, branched or cyclic alkoxy group, includes, for example, an alkoxy group having from 1 to 10 carbon atoms, and is preferably a straight chain or branched alkoxy group having from 1 to 5 carbon atoms (e.g., methoxy, ethoxy, straight chain or branched propoxy, straight chain or branched butoxy or straight chain or branched pentoxy group) or a cyclic alkoxy group having from 3 to 8 carbon atoms (e.g., cyclopentyloxy or cyclohexyloxy group).

Preferably, any one of $R_{1c}$ to $R_{5c}$ is a straight chain, branched or cyclic alkyl group or a straight chain, branched or cyclic alkoxy group, and more preferably, the total number of carbon atoms included in $R_{1c}$ to $R_{5c}$ is from 2 to 15. Using such a compound having an alkyl group or alkoxy group in any one of $R_{1c}$ to $R_{5c}$, solvent solubility is further improved to restrain the occurrence of particles during preservation.

The alkyl group represented by $R_{6c}$ or $R_{7c}$ is sane as the alkyl group represented by any one of $R_{1c}$ to $R_{5c}$. The aryl group represented by $R_{6c}$ or $R_{7c}$ includes, for example, an aryl group having from 6 to 14 carbon atoms (e.g., phenyl group).

The alkyl group represented by $R_x$ or $R_y$ is same as the alkyl group represented by any one of $R_{1c}$ to $R_{5c}$.

The 2-oxoalkyl group represented by $R_x$ or $R_y$ includes a group having >C=O on the 2-position of the alkyl group represented by any one of $R_{1c}$ to $R_{5c}$.

The alkoxy group in the alkoxycarbonylmethyl group represented by $R_x$ or $R_y$ is same as the alkoxy group represented by any one of $R_{1c}$ to $R_{5c}$.

The group formed by connecting $R_x$ and $R_y$ includes, for example, butylene and pentylene groups.

$Z_c^-$ represents an alkanesulfonic acid anion in which the carbon atom at the α-position is substituted with a fluorine atom and includes the above-described sulfonic acid anion. The alkane portion of the alkanesulfonic anion may be substituted with a substituent, for example, an alkoxy group (e.g., an alkoxy group having from 1 to 8 carbon atoms) or a perfluoroalkoxy group (e.g., a perfluoroalkoxy group having from 1 to 8 carbon atoms).

$Z_c^-$ preferably represents a perfluoroalkanesulfonic acid anion having from 1 to 8 carbon atoms, particularly preferably a perfluorooctanesulfonic acid anion, a perfluorobutanesulfonic acid anion or a trifluoromethanesulfonic acid anion, and most preferably a perfluorobutanesulfonic acid anion. By using such an alkanesulfonic acid anion, a decomposition rate of an acid-decomposable group is amplified to increase sensitivity, and diffusion of the acid generated is controlled to improve resolution.

Specific examples of the compound having the phenacylsulfonium salt structure for use in the present invention are set forth below, but the present invention should not be construed as being limited thereto.

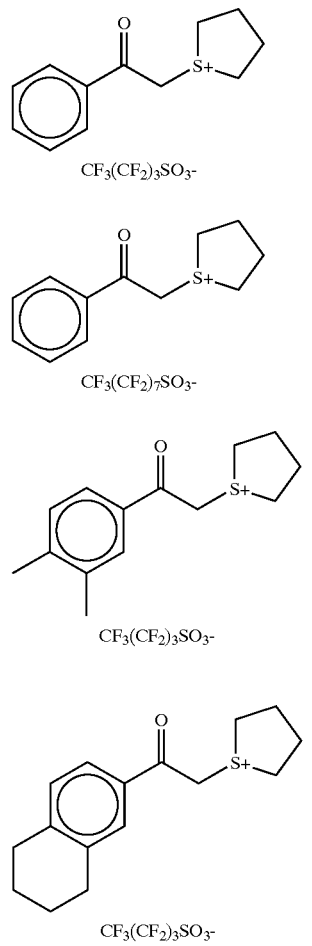
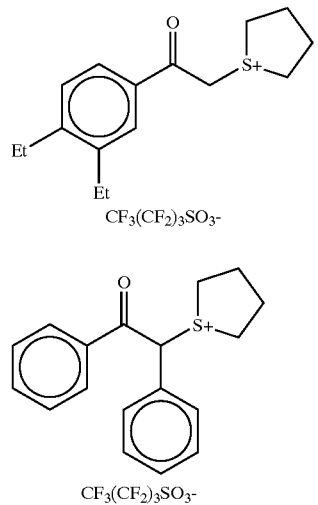
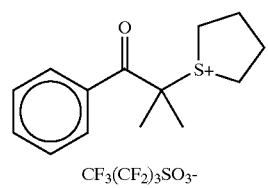
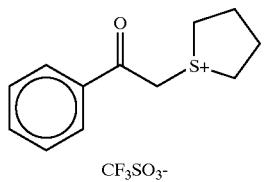

-continued
(III-20)
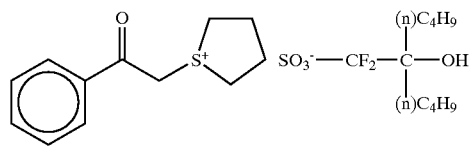
(A1-4-1)
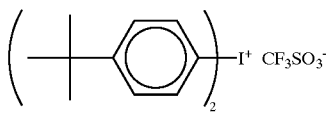
(A1-4-2)
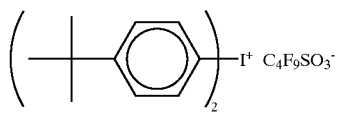
(A1-4-3)
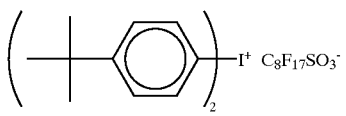
(A1-5-1)
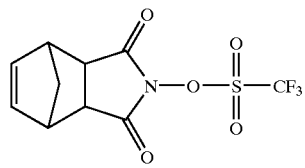
(A1-5-2)
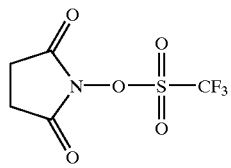
(A1-5-3)
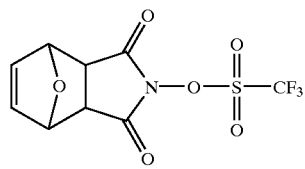
(A1-5-4)
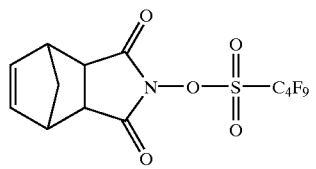
(A1-5-5)
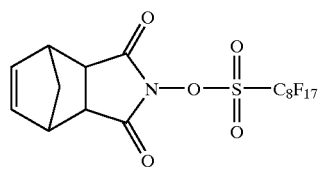
(A1-6-1)
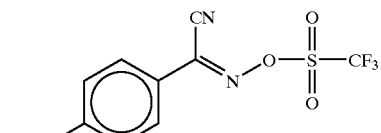
(A1-6-2)
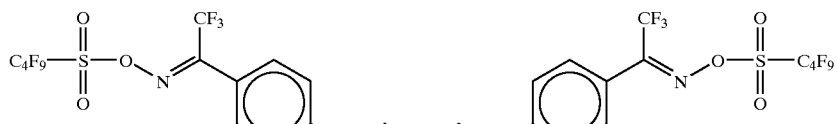
(A1-7-1)
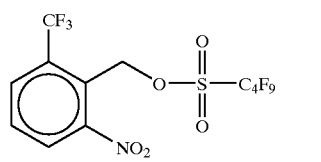
(A1-7-2)
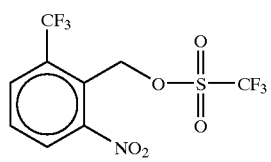
(A1-7-3)
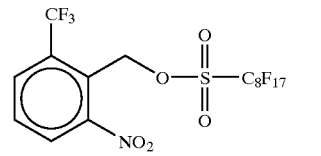

<<Component (A2)>>

Any onium salt of an alkanesulfonic acid in which the α-position is not substituted with a fluorine atom can be used as the compound of component (A2) in the present invention. The compound of component (A2) is preferably a sulfonium salt, an iodonium salt or an ammonium salt.

Preferred examples of the compound of component (A2) include compounds represented by the following formulae (A2-1), (A2-2) and (A2-3).

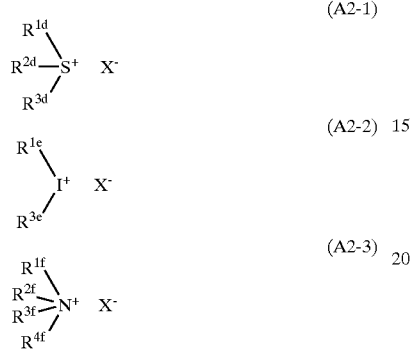

In the above formulae, $R^{1d}$, $R^{2d}$ and $R^{3d}$ have the same meaning as defined for $R^1$, $R^2$ and $R^3$ in formula (A1) described above, respectively.

$R^{1e}$, $R^{2e}$, $R^{1f}$, $R^{2f}$, $R^{3f}$ and $R^{4f}$, which may be the same or different, each independently represent a substituted or unsaturated alkyl group or a substituted or unsaturated aryl group. The alkyl group is preferably an alkyl group having from 1 to 8 carbon atoms, The aryl group is preferably an aryl group having from 6 to 14 carbon atoms.

Also, $R^{1f}$, $R^{2f}$, $R^{3f}$ and $R^{4f}$ each may represent a hydrogen atom.

$R^{1e}$ and $R^{2e}$ each preferably represent a substituted or unsaturated aryl group. $R^{1f}$, $R^{2f}$, $R^{3f}$ and $R^{4f}$ each preferably represent a substituted or unsaturated alkyl group.

Preferred examples of the substituent for the aryl group include an alkoxy group having from 1 to 8 carbon atoms, an alkyl group having from 1 to 8 carbon atoms, a nitro group, a carboxy group, a hydroxy group and a halogen atom. Preferred examples of the substituent for the alkyl group include an alkoxy group having from 1 to 8 carbon atoms, a carboxy group, an alkoxycarbonyl group having from 2 to 9 carbon atoms and an alkoxyalkoxy group having from 2 to 9 carbon atoms.

Specific examples of the cation in the compound represented by formula (A2-1) include those described for the cations in the compounds represented by formulae (A1-1) to (A1-3).

An anion portion represented by $X^-$ is an alkanesulfonic acid anion in which the carbon atom at the α-position is not substituted with a fluorine atom and represented by $RSO_3^-$.

The alkane portion of the alkanesulfonic acid represented by R is not particularly restricted and includes a straight chain, branched or cyclic alky group having from 1 to 20 carbon atoms, e.g., methyl, ethyl, propyl, butyl, hexyl, octyl, dodecyl, tetradecyl or hexadecyl group, and preferably a straight chain, branched or cyclic alkyl group having from 4 to 16 carbon atoms.

The alkane portion may have a substituent provided that it does not constitute the alkanesulfonic acid in which the carbon atom at the α-position has a fluorine atom. Examples of the substituent include an alkyl group, a hydroxy group, a halogen atom, an alkoxy group (preferably having from 1 to 5 carbon atoms, e.g., methoxy, ethoxy, propoxy or butoxy group), an alkoxycarbonyl group (preferably having from 2 to 6 carbon atoms, e.g., methoxycarbonyl, ethoxycarbonyl, propoxycarbonyl or butoxycarbonyl group), an acyl group (preferably having from 2 to 15 carbon atoms), an acyloxy group (preferably having from 2 to 15 carbon atoms), an amino group, a carboxy group, an alkylsulfonylamino group (preferably having from 1 to 5 carbon atoms), an alkylsulfonyloxy group (preferably having from 1 to 5 carbon atoms), a cyano group and an oxo group.

Preferred examples of the alkanesulfonic acid for $X^-$ include an alkanesulfonic acid having from 4 to 16 carbon atoms and an alkanesulfonic acid having a polycyclic alicyclic structure, e.g., camphorsulfonic acid.

Specific examples of the compound of component (A2) are set forth as A2-1-1 to A2-3-9 below, but the present invention should not be construed as being limited thereto.

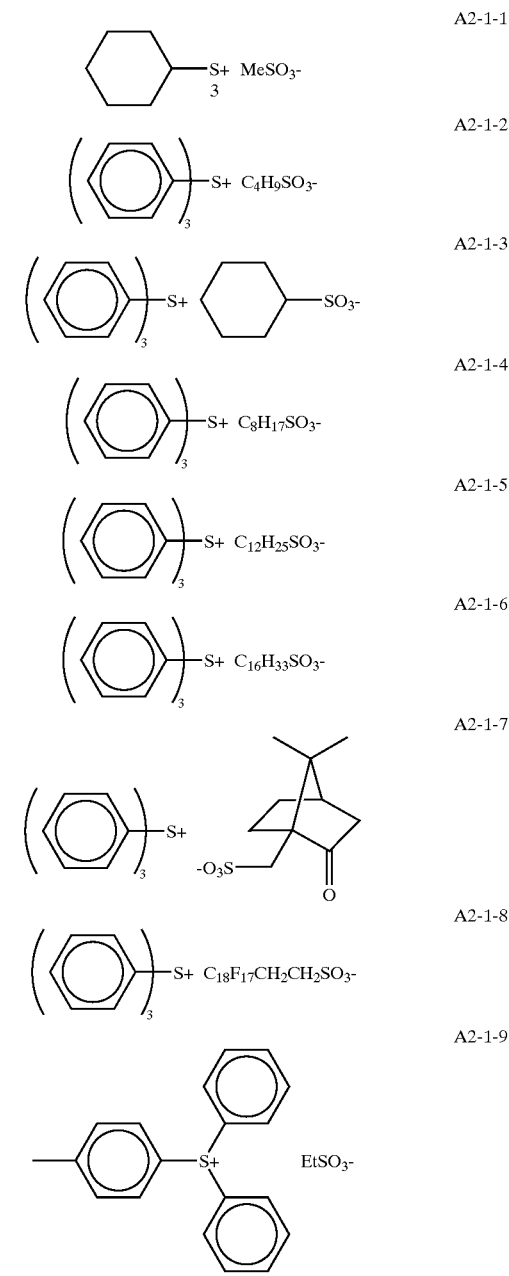

A2-1-10 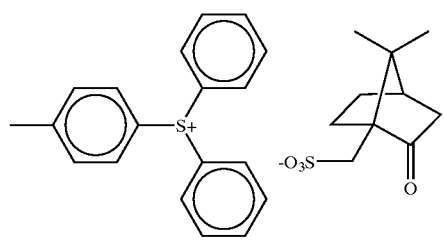
A2-1-17 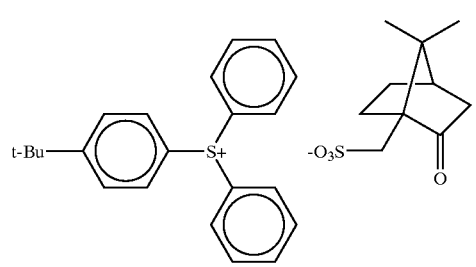
A2-1-11 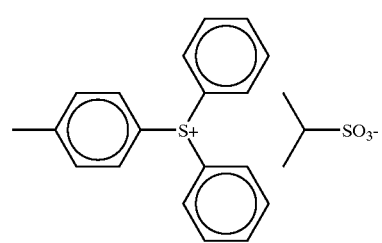
A2-1-18 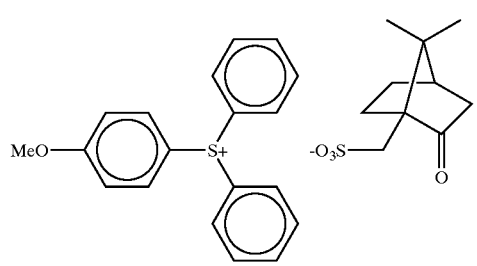
A2-1-12 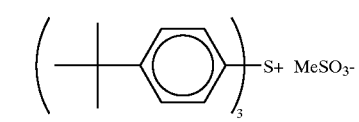
A2-1-19 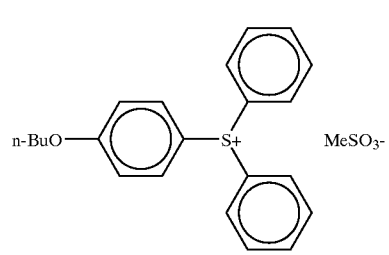
A2-1-13 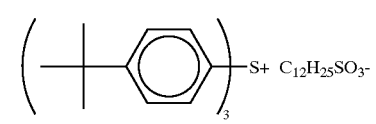
A2-1-14 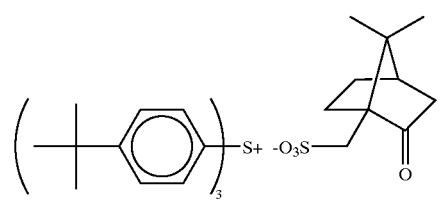
A2-1-20 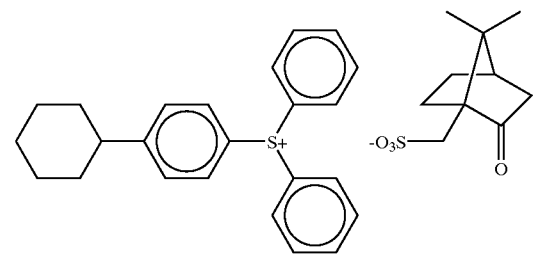
A2-1-15 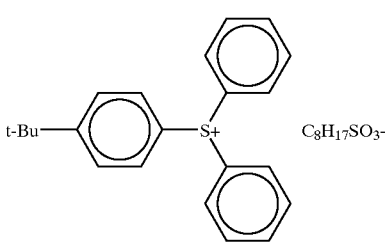
A2-1-21 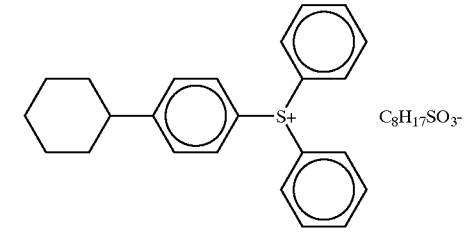
A2-1-16 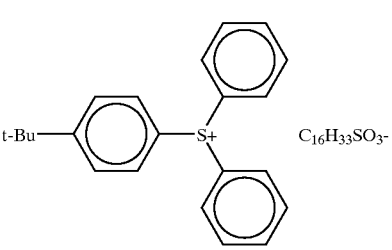
A2-1-22 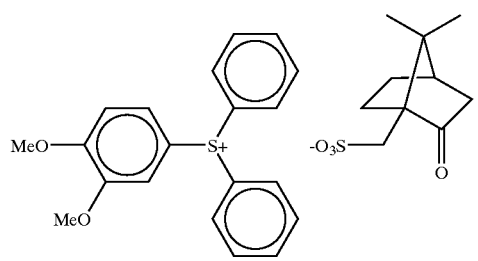

A2-1-23
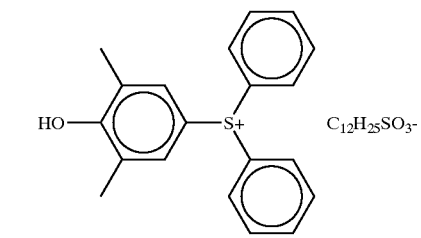
A2-1-24
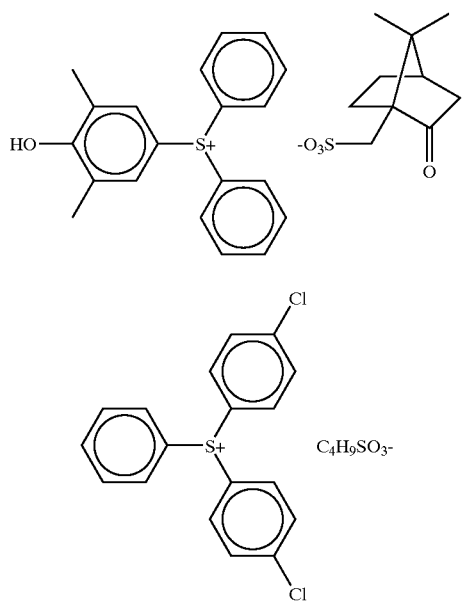
A2-1-25
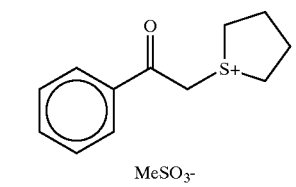
A2-1-26
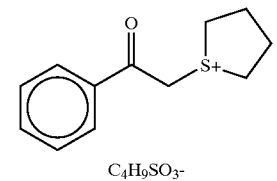
A2-1-27
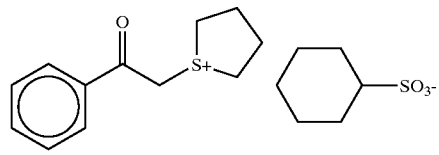
A2-1-28
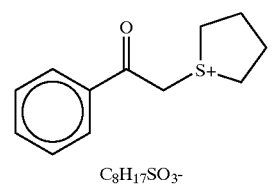
A2-1-29
A2-1-30
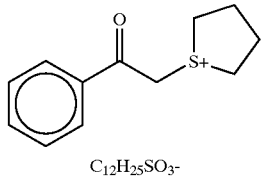
A2-1-31
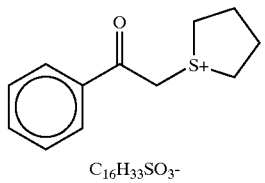
A2-1-32
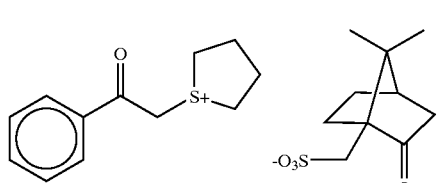
A2-1-33
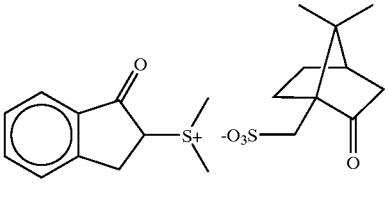
A2-1-34
A2-1-35
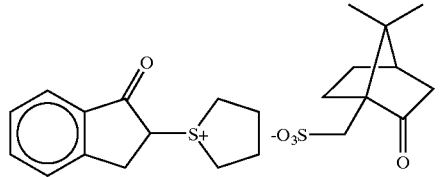
A2-1-36
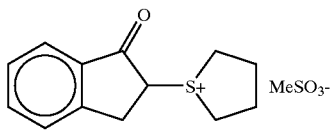
A2-1-37
A2-1-38
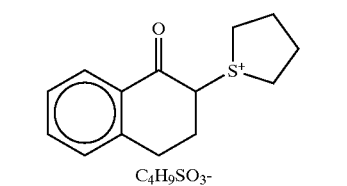

-continued
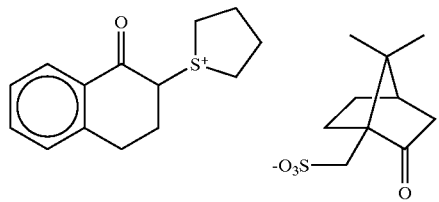 A2-1-39
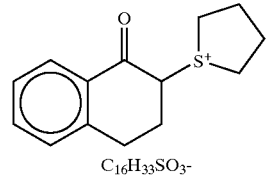 A2-1-40
C₁₆H₃₃SO₃-
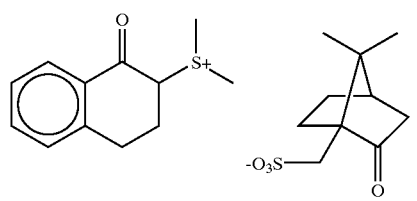 A2-1-41
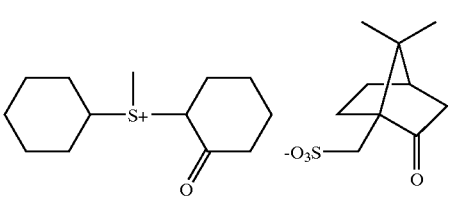 A2-1-42
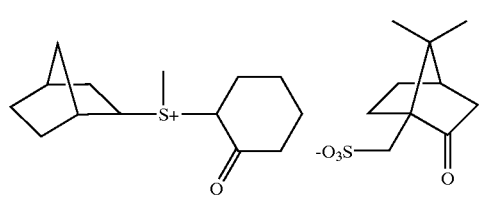 A2-1-43
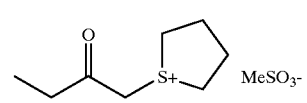 MeSO₃- A2-1-44
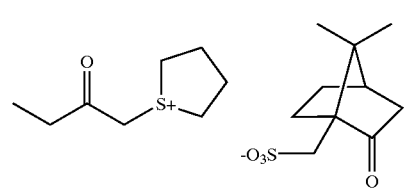 A2-1-45
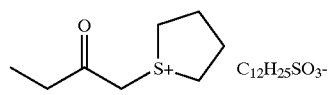 C₁₂H₂₅SO₃- A2-1-46
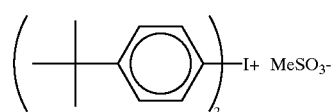 I+ MeSO₃- A2-2-1
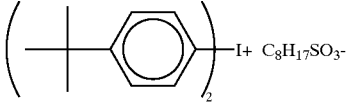 I+ C₈H₁₇SO₃- A2-2-2
-continued
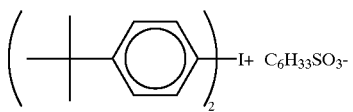 I+ C₆H₃₃SO₃- A2-2-3
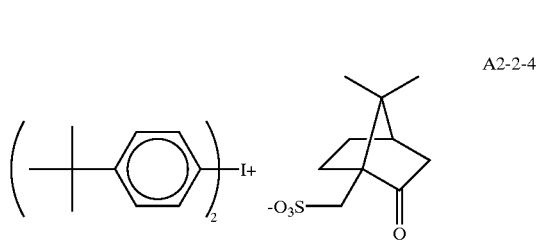 A2-2-4
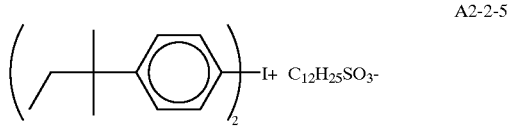 I+ C₁₂H₂₅SO₃- A2-2-5
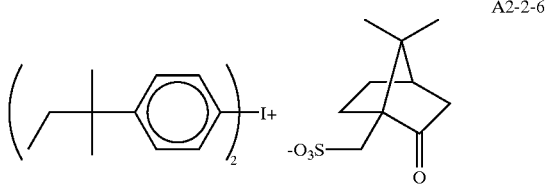 A2-2-6
Bu₄N+ C₁₂H₂₅SO₃- A2-3-1
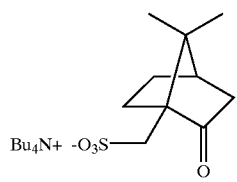 Bu₄N+ -O₃S A2-3-2
Bu₄N+ C₁₄H₉₅SO₃- A2-3-3
Bu₄N+ C₁₈F₁₇CH₂CH₂SO₃- A2-3-4
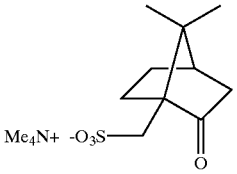 Me₄N+ -O₃S A2-3-5
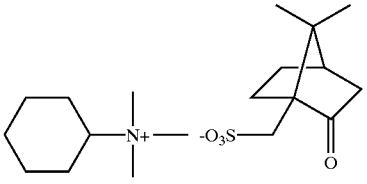 A2-3-6
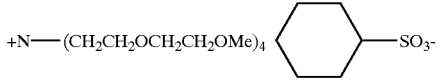 +N—(CH₂CH₂OCH₂CH₂OMe)₄ —SO₃- A2-3-7

-continued

A2-3-8

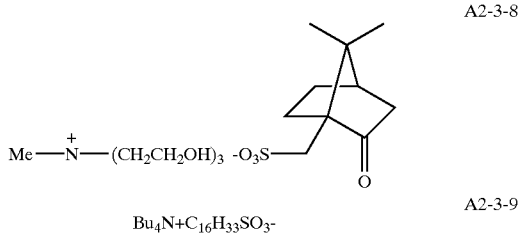

Me—N⁺—(CH₂CH₂OH)₃ -O₃S—

A2-3-9

Bu₄N+C₁₆H₃₃SO₃-

The content of component (A1) is ordinarily from 0.01 to 10% by weight, preferably from 0.1 to 7% by weight, and more preferably from 0.1 to 5% by weight, based on the total solid content of positive photosensitive composition.

The content of component (A2) is ordinarily from 0.01 to 10% by weight, preferably from 0.1 to 7% by weight, and more preferably from 0.1 to 5% by weight, based on the total solid content of positive photosensitive composition.

A weight ratio of the content of component (A1) to the content of component (A2) is ordinarily from 99/1 to 1/99, preferably from 99/1 to 30/70, and more preferably from 99/1 to 50/50. It is preferred that the content of component (A1) is larger than the content of component (A2).

The sulfonic acid in which the α-position is substituted with a fluorine atom exhibits a high acidity and has a high ability for decomposing an acid-decomposable resin in comparison with the sulfonic acid in which the α-position is not substituted with a fluorine atom. When a compound that generates a sulfonic acid in which the α-position is substituted with a fluorine atom is used alone, a problem of inferior resolution and pitch dependency causes, while high sensitivity is achieved. On the other hand, when the sulfonium salt of sulfonic acid having no fluorine substituent is used as a photo-acid generator together with an alicyclic resin, a problem in that the sensitivity is severely decreased occurs, because the acid generated has a low ability for decomposing the resin. On the contrary, in case of using these two kinds of compounds in combination, the compound that generates a sulfonic acid in which the α-position is substituted with a fluorine atom generates the sulfonic acid in which the α-position is substituted with a fluorine atom upon exposure. The sulfonic acid in which the α-position is substituted with a fluorine atom acts to decompose an acid-decomposable resin in a high efficiency and then encounters with the onium salt of sulfonic acid having no fluorine substituent, thereby forming an onium salt of sulfonic acid in which the α-position is substituted with a fluorine atom and releasing a sulfonic acid having no fluorine substituent by means of salt exchange. Since the sulfonic acid having no fluorine substituent has a low ability for decomposing an acid-decomposable resin, diffusion of the acid-decomposing reaction is restrained. As a result, disturbance in exposure latent images due to the diffusion is controlled, and it is believed that the resolution and pitch dependency are improved without decrease in the sensitivity.

Acid Generating Compound Usable Together with the Compounds of Components (A1) and (A2)

A compound (photo-acid generator) that decomposes upon irradiation of an actinic ray or radiation to generate an acid other than the compounds of components (A1) and (A2) may be further used together in the present invention.

An amount of the photo-acid generator used together with the compounds of components (A1) and (A2) according to the present invention is ordinarily from 100/0 to 20/80, preferably from 100/0 to 40/60, and more preferably from 100/0 to 50/50, in terms of a molar ratio of compounds of components (A1) and (A2)/other photo-acid generators.

Such a photo-acid generator used together with the compounds of components (A1) and (A2) can be appropriately selected from photoinitiators for photo-cationic polymerization, photoinitiators for photo-radical polymerization, photo-achromatic agents for dyes, photo-discoloring agents, known compounds generating an acid upon irradiation of an actinic ray or radiation used for microresists, and mixtures thereof.

Examples of such photo-acid generators include a diazonium salt, a phosphonium salt, a sulfonium salt, an iodonium salt, an imidosulfonate, an oxymesulfonate, a diazodisulfone, a disulfone and an o-nitrobenzylsulfonate.

Also, polymer compounds in which a group or compound generating an acid upon irradiation of an actinic ray or radiation is introduced into the main chain or side chain thereof, for example, compounds as described, for example, in U.S. Pat. No. 3,849,137, West German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds generating an acid with light as described, for example, in U.S. Pat. No. 3,779,778 and European Patent 126,712 can be used.

Particularly preferred examples of the photo-acid generator used together with the compounds of components (A1) and (A2) according to the present invention are set forth below.

(a1)

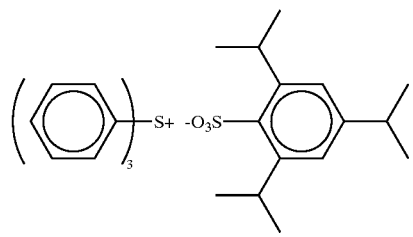

(a2)

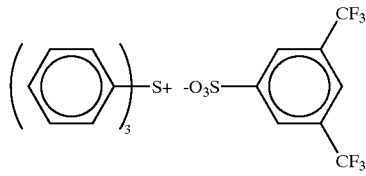

-continued
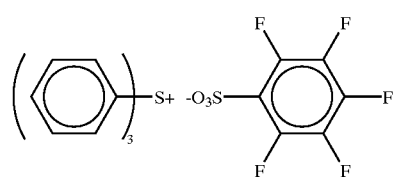 (a3)
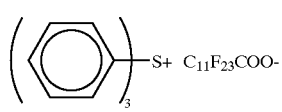 (a4)
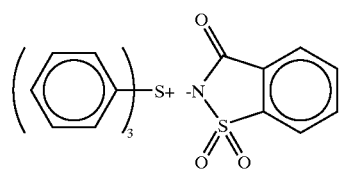 (a5)
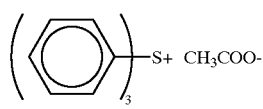 (a6)
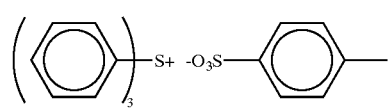 (a7)
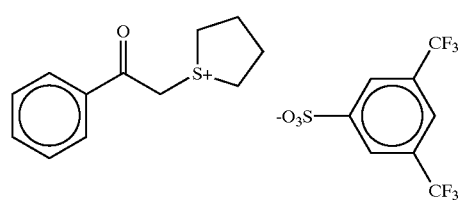 (a8)
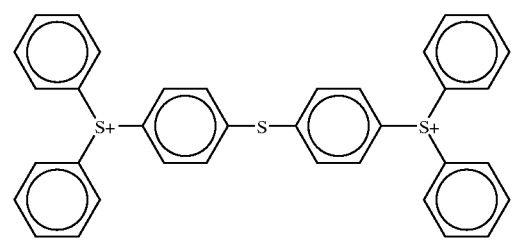 (a9)
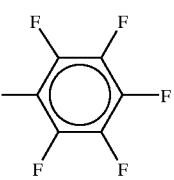
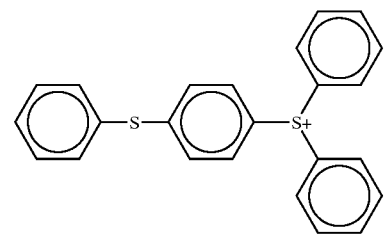 (a10)
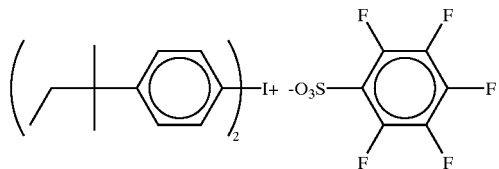 (a11)
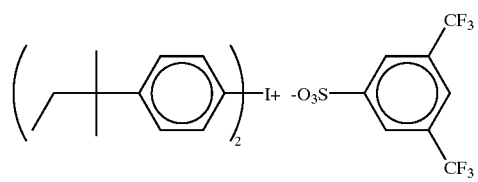 (a12)
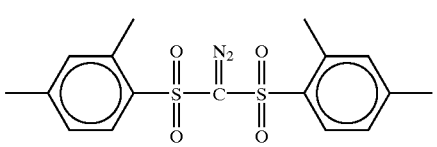 (a13)
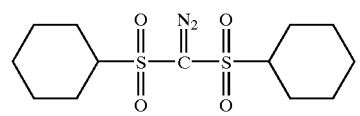 (a14)
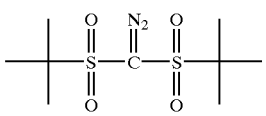 (a15)
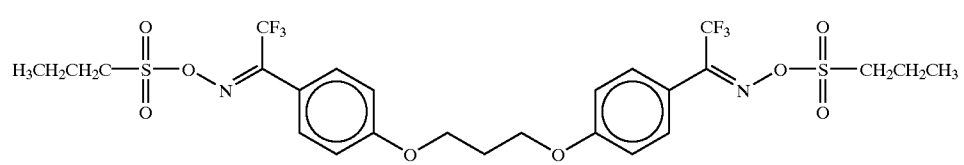 (a16)

(a17)

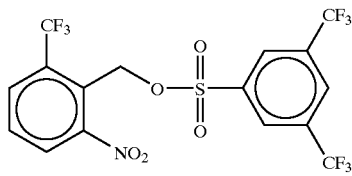

<<(B) Resin Increasing a Solubility Rate in an Alkali Developing Solution by the Action of an Acid (Hereinafter, also Referred to as an "Acid-decomposable Resin")>>

Any resin that has a monocyclic or polycyclic alicyclic hydrocarbon structure and is decomposed by the action of an acid to increase a solubility rate in an alkali developing solution can be used as the acid-decomposable resin of component (B). Preferred examples of the resin of component (B) include resins containing at least one repeating unit selected from a repeating unit having a partial structure including an alicyclic hydrocarbon represented by formula (pI), (pII), (pIII), (pIV), (pV) or (pVI) described below and a repeating unit represented by formula (II) described below.

$R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group.

$R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, Alternatively, $R_{23}$ and $R_{24}$ may be combined with each other to form a ring.

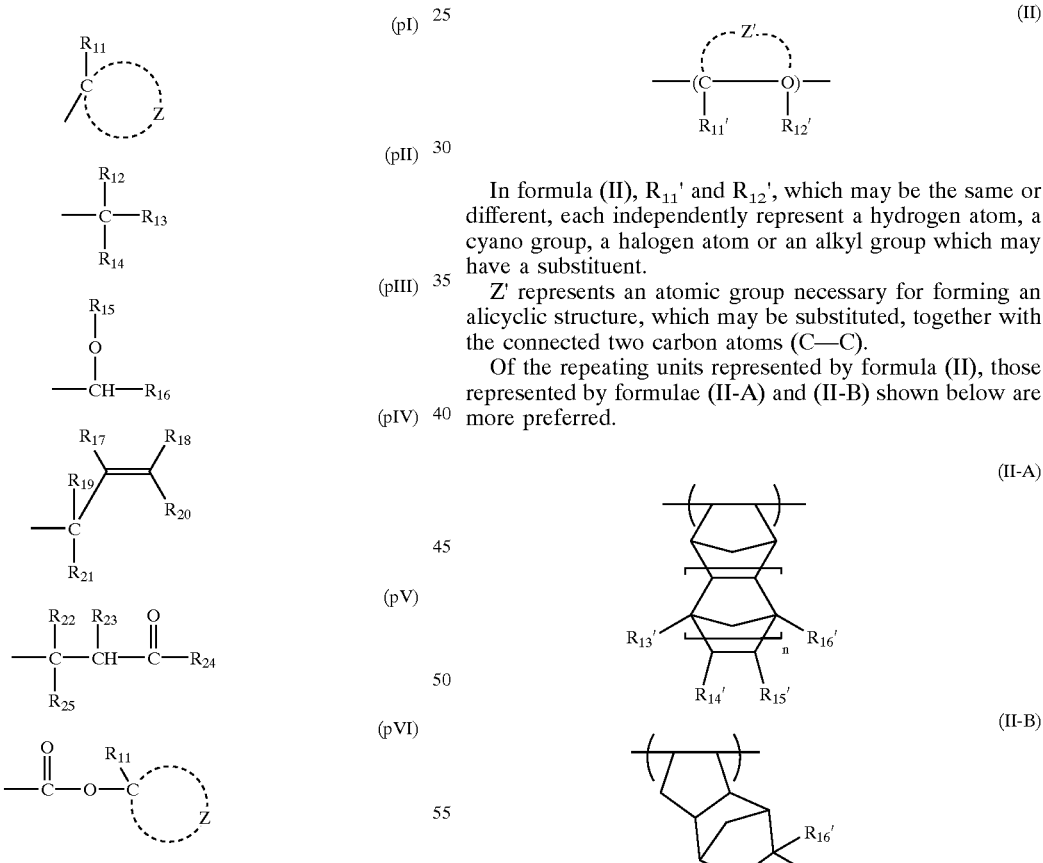

In formula (II), $R_{11}'$ and $R_{12}'$, which may be the same or different, each independently represent a hydrogen atom, a cyano group, a halogen atom or an alkyl group which may have a substituent.

Z' represents an atomic group necessary for forming an alicyclic structure, which may be substituted, together with the connected two carbon atoms (C—C).

Of the repeating units represented by formula (II), those represented by formulae (II-A) and (II-B) shown below are more preferred.

In the above formulae, $R_{11}$, represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

$R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group.

In formulae (II-A) and (II-B), $R_{13}'$ to $R_{16}'$, which may be the same or different, each independently represents a hydrogen atom, a halogen atom, a cyano group, —COOS, —COOR$_5$, a group capable of decomposing by the action of acid, —C(=O)—X—A'—$R_{17}'$, an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$— or —NHSO$_2$NH—.

A' represents a single bond or a divalent linkage group.

Alternatively, at least two of $R_{13}'$ to $R_{16}'$ may be combined with each other to form a ring, n represents 0 or 1.

$R_{17}'$ represents —COOH, —COOR$_5$, —CN, a hydroxy group, an alkoxy group which may have a substituent, —CO—NH—R$_6$, —CO—NH—SO$_2$—R$_6$ or a group represented by Y. R$_6$ represents an alkyl group which may have a substituent or a cyclic hydrocarbon group which may have a substituent.

The group represented by Y has the following formula:

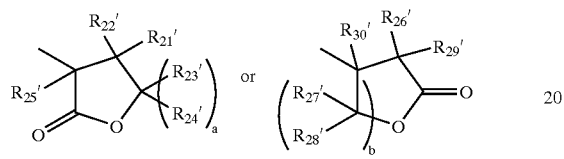

wherein $R_{21}'$ to $R_{30}'$, which may be the same or different, each independently represents a hydrogen atom or an alkyl group which may have a substituent, and a and b each represent 1 or 2.

In formulae (pI) to (pVI), the alkyl group for $R_{12}$ to $R_{25}$ includes a straight chain or branched alkyl group having from 1 to 4 carbon atoms, which may be substituted. Examples of the alkyl group include methyl, ethyl, n-propyl, isopropyl, n-butyl, isobutyl, sec-butyl and tert-butyl groups.

Examples of the substituent for the alkyl group include an alkoxy group having from 1 to 4 carbon atoms, a halogen atom (e.g., fluorine, chlorine, bromine or iodine atom), an acyl group, an acyloxy group, a cyano group, a hydroxy group, a carboxy group, an alkoxycarbonyl group and a nitro group.

The alicyclic hydrocarbon group in $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a amonocyclic, bicyclic, tricyclic or tetracyclic structure. The number of carbon atoms included is preferably from 6 to 30, and more preferably from 7 to 25. The alicyclic hydrocarbon group may have a substituent.

Examples of the structure of alicyclic portion in the alicyclic hydrocarbon group are set forth below.

(1)

(2)

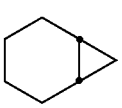

(3)

(4)

-continued

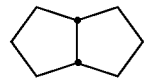

(5)

(6)

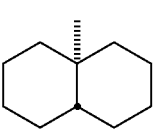

(7)

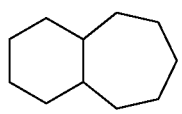

(8)

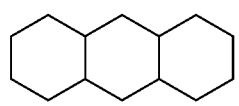

(9)

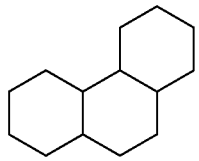

(10)

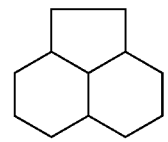

(11)

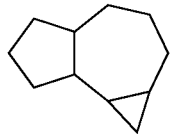

(12)

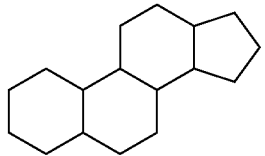

(13)

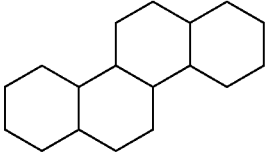

(14)

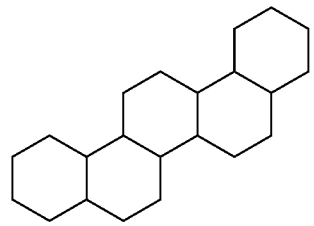

(15)

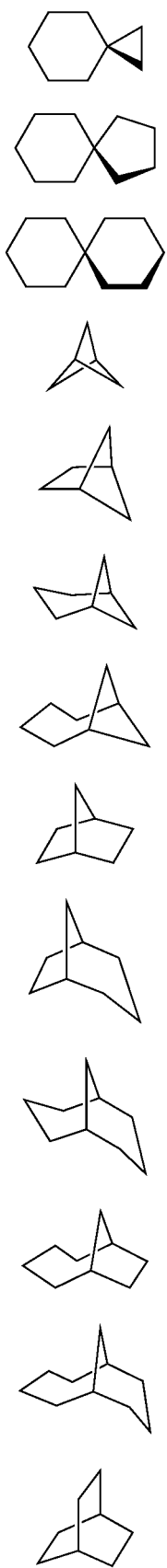
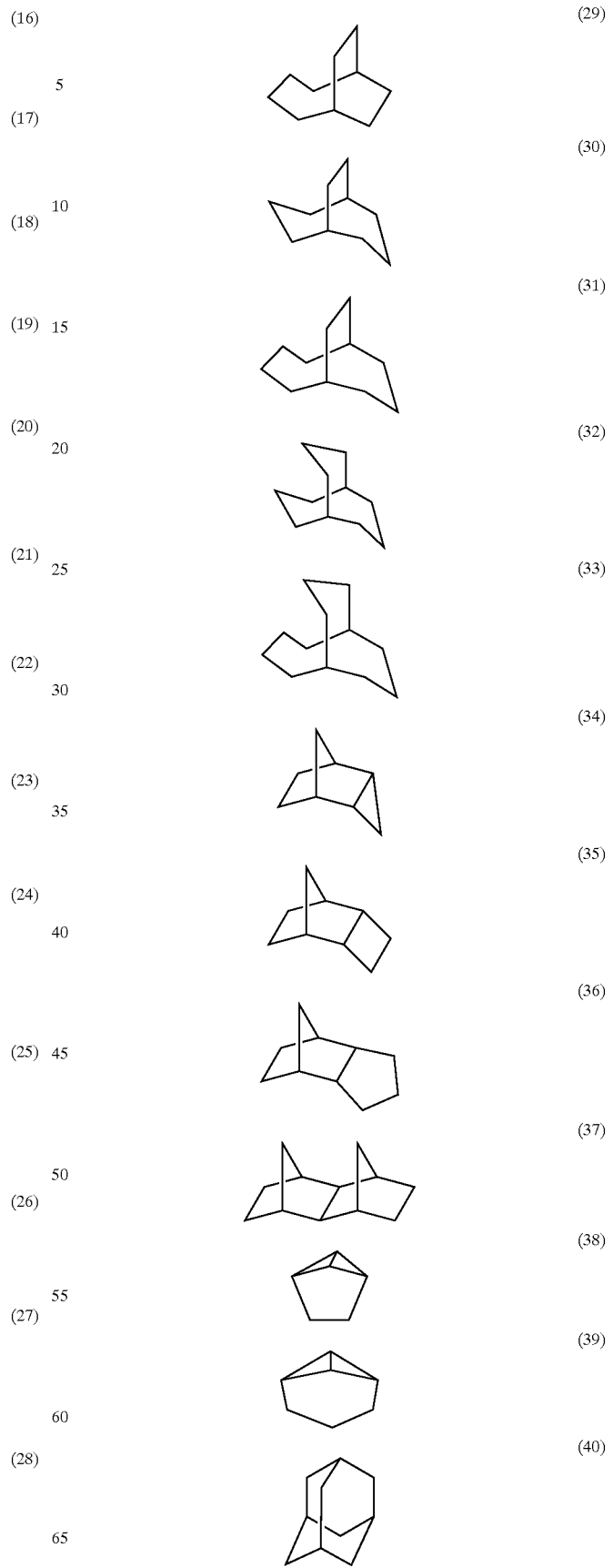

(41) 

(42) 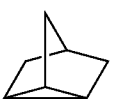

(43) 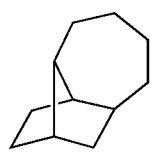

(44) 

(45) 

(46) 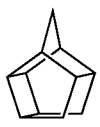

(47) 

(48) 

(49) 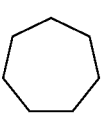

(50) 

Preferred examples of the alicyclic portion for use in the present invention include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group and a cyclododecanyl group are more preferred.

Examples of the substituent for the alicyclic hydrocarbon group include an alkyl group, a substituted alkyl group, a halogen atom, a hydroxy group, an alkoxy group, a carboxy group and an alkoxycarbonyl group. The alkyl group is preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group.

The structure represented by any one of formulae (pI) to (pVI) in the resin can be used for protecting an alkali-soluble group. The alkali-soluble group includes various groups known in the field of art.

Specific examples of the alkali-soluble group include a carboxylic acid group, a sulfonic acid group, a phenol group and a thiophenol group, and a carboxylic acid group and a sulfonic acid group are preferably used.

The alkali-soluble group protected by the structure represented by any one of formulae (pI) to (pVI) in the resin preferably includes groups represented by the following formulae (pVII) to (pXI):

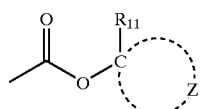 (pVII)

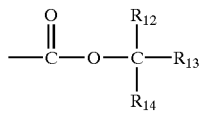 (pVIII)

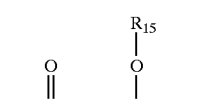 (pIX)

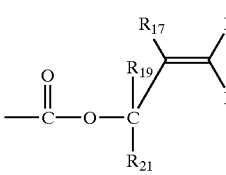 (pX)

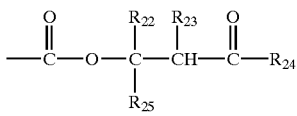 (pXI)

In the above formulae, $R_{11}$ to $R_{25}$ and Z has the same meanings as defined above, respectively.

A repeating unit having the alkali-soluble group protected by the structure represented by any one of formulae (pI) to (pVI) in the resin is preferably represented by the following formula (pA):

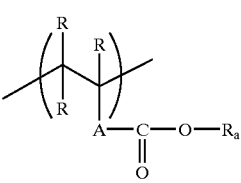 (pA)

In the formula, R's, which may be the same or different, each represent a hydrogen atom, a halogen atom or a straight chain or branched alkyl group having from 1 to 4 carbon atoms, which may be substituted.

A represents a single bond, an alkylene group, a substituted alkylene group, an ether group, a thioether group, a carbonyl group, an ester group, an amido group, a sulfonamido group, a urethane group, a urea group or a combination of two or more thereof.

$R_a$ represents any one of the groups represented by formulae (pI) to (pVI).

Specific examples of the monomer corresponding to the repeating unit represented by formula (pA) are set forth below, but the present invention should not be construed as being limited thereto.

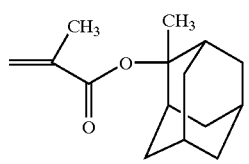
1

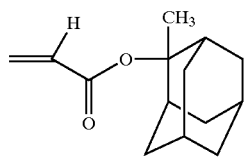
2

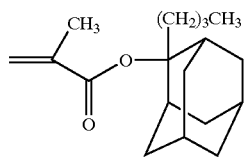
3

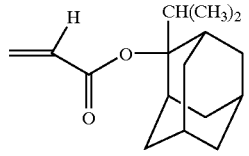
4

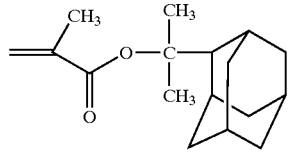
5

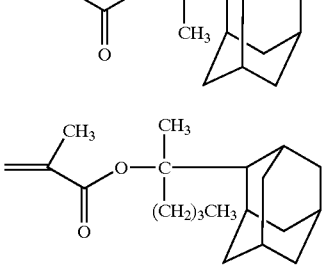
6

7

-continued

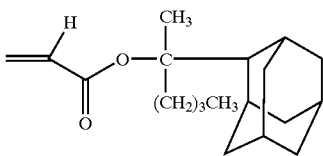
8

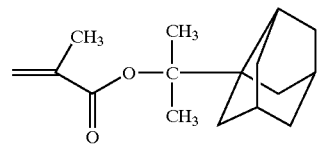
9

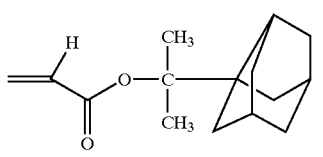
10

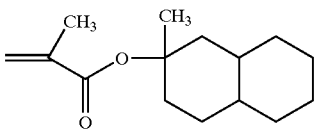
11

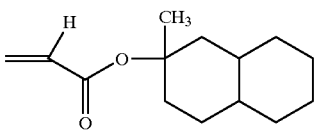
12

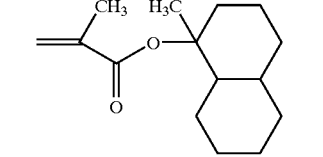
13

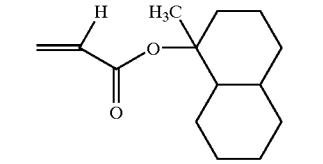
14

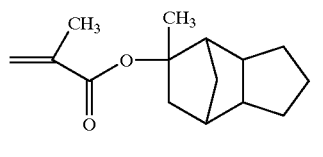
15

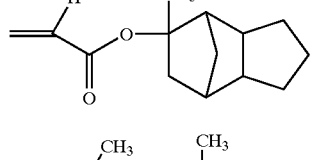
16

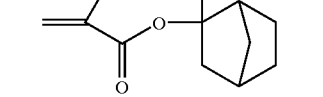
17

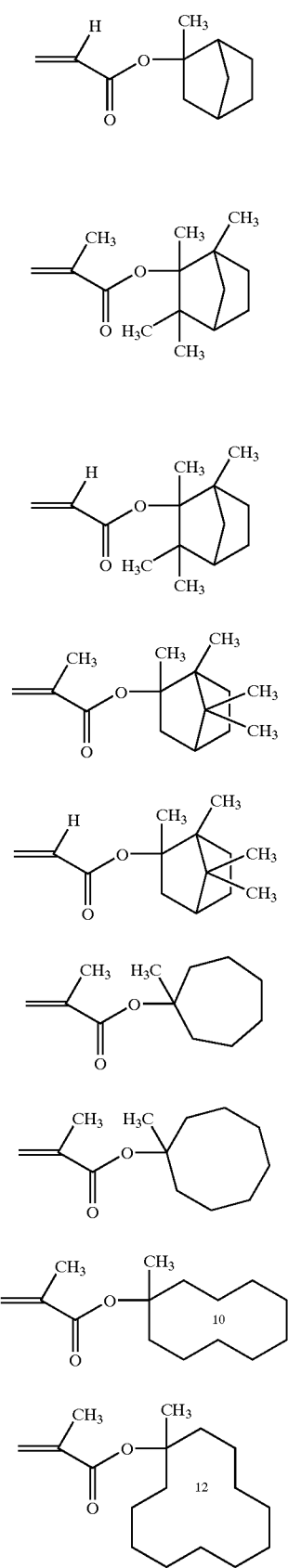
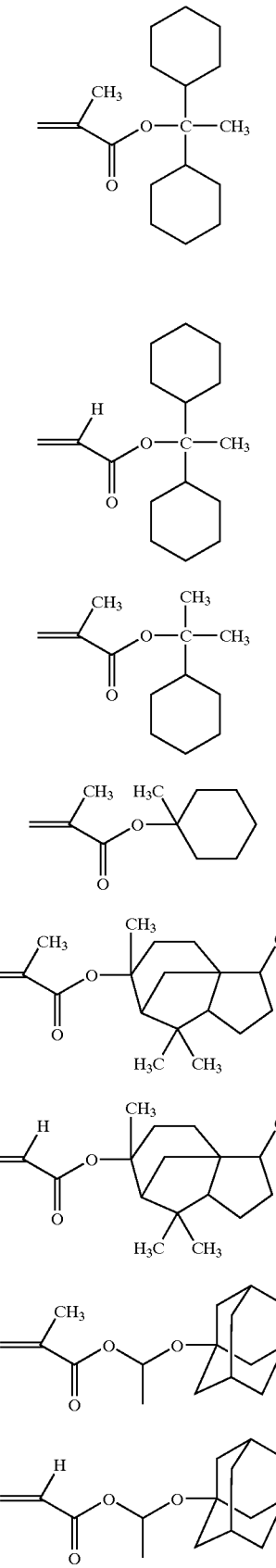

-continued

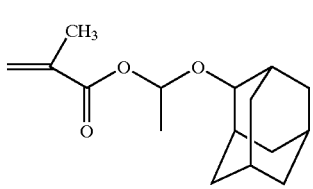
35

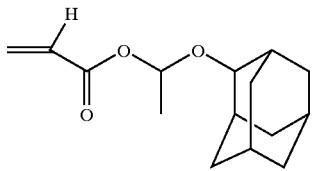
36

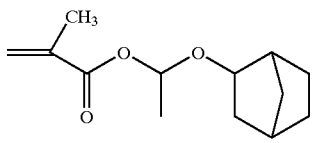
37

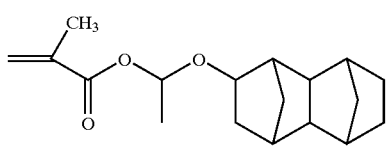
38

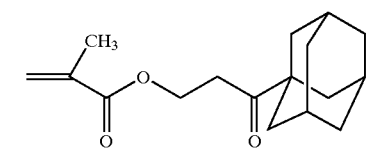
39

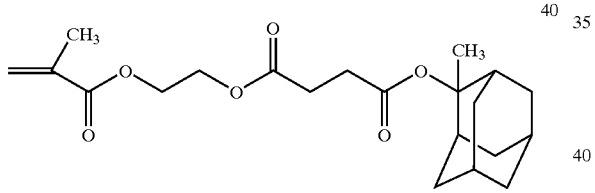
40

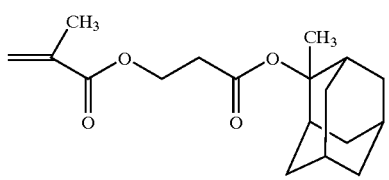
41

In formula (II), $R_{11}'$ and $R_{12}'$, which may be the same or different, each independently represent a hydrogen atom, a cyano group, a halogen atom or an alkyl group which may have a substituent.

Z' represents an atomic group necessary for forming an alicyclic structure, which may be substituted, together with the connected two carbon atoms (C—C).

The halogen atom for $R_{11}'$ or $R_{12}'$ includes, for example, chlorine, bromine, fluorine and iodine atoms.

The alkyl group for each of $R_{11}'$, $R_{12}'$ and $R_{21}'$ to $R_{30}'$ includes preferably a straight chain or branched alkyl group having from 1 to 10 carbon atoms, more preferably a straight chain or branched alkyl group having from 1 to 6 carbon atoms, and still more preferably methyl, ethyl, n-propyl, isopropyl, n-butyl, isobutyl, sec-butyl and tert-butyl groups.

Examples of the substituent for the alkyl group include a hydroxy group, a halogen atom, a carboxy group, an alkoxy group, an acyl group, a cyano group and an acyloxy group.

The halogen atom includes chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl or acetyl group. The acyloxy group includes, for example, an acetoxy group.

The atomic group necessary for forming an alicyclic structure represented by Z' is an atomic group necessary for forming a repeating unit of alicyclic hydrocarbon moiety, which may be substituted. In particular, an atomic group necessary for forming a bridged alicyclic structure, by which a repeating unit of the bridged alicyclic hydrocarbon is completed, is preferred.

The skeleton of the bridged alicyclic hydrocarbon formed includes those described below.

 (1)

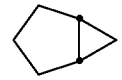 (2)

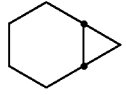 (3)

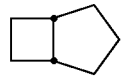 (4)

 (5)

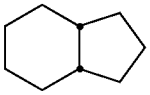 (6)

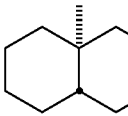 (7)

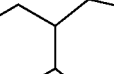 (8)

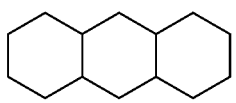 (9)

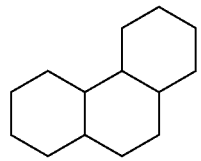 (10)

-continued
(11)
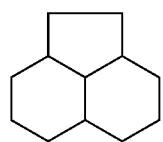
(12)
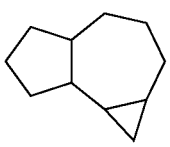
(13)
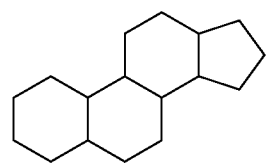
(14)
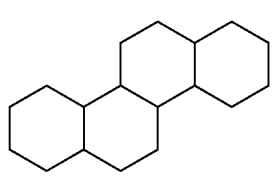
(15)
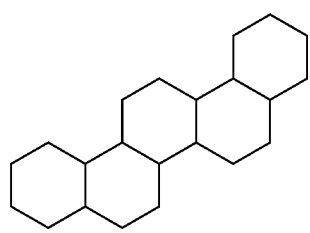
(16)
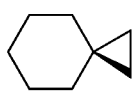
(17)
(18)
(19)
(20)
(21)
(22)
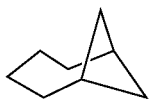
-continued
(23)
(24)
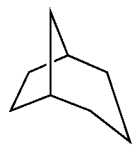
(25)
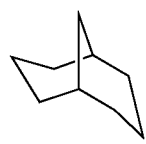
(26)
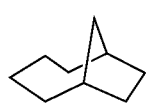
(27)
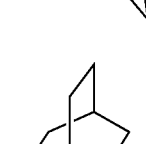
(28)
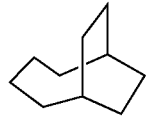
(29)
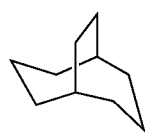
(30)
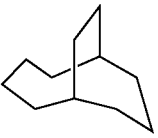
(31)
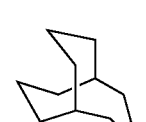
(32)
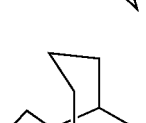
(33)
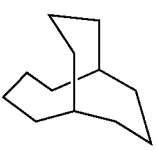

(34) 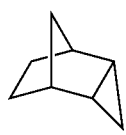

(35) 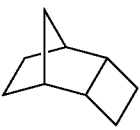

(36) 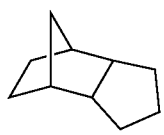

(37) 

(38) 

(39) 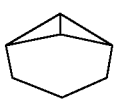

(40) 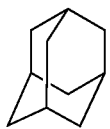

(41) 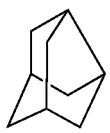

(42) 

(43) 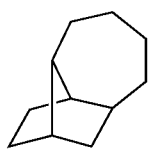

(44) 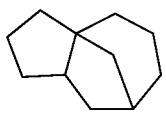

(45) 

(46) 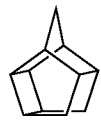

(47) 

Of the skeletons of the bridged alicyclic hydrocarbon described above, (5), (6), (7), (9), (10), (13), (14), (15), (23), (28), (36), (37), (42) and (47) are preferred.

The skeleton of the alicyclic hydrocarbon may have a substituent. Examples of the substituent include the atoms and groups represented by $R_{13}'$ to $R_{16}'$ in formula (II-A) or (II-B).

Of the repeating units containing the bridged alicyclic hydrocarbon, those represented by formulae (II-A) and (II-B) described above are more preferred.

In formulae (II-A) and (II-B), $R_{13}'$ to $R_{16}'$, which may be the same or different, each independently represents a hydrogen atom, a halogen atom, a cyano group, —COOH, —COOR$_5$, a group capable of decomposing by the action of acid, —C(=O)—X—A'—R$_{17}'$, an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$—or —NHSO$_2$NH—.

A' represents a single bond or a divalent linkage group.

Alternatively, at least two of $R_{13}'$ to $R_{16}'$ may be combined with each other to form a ring. n represents 0 or 1.

$R_{17}'$ represents —COOH, —COOR$_5$, —CN, a hydroxy group, an alkoxy group which may have a substituent, —CO—NH—R$_6$, —CO—NH—SO$_2$—R$_6$ or a group represented by Y. $R_6$ represents an alkyl group which may have a substituent or a cyclic hydrocarbon group which may have a substituent.

In the group represented by Y, $R_{21}'$ to $R_{30}'$, which may be the same or different, each independently represents a hydrogen atom or an alkyl group which may have a substituent, and a and b each represent 1 or 2.

In the resin according to the present invention, an acid-decomposable group may be incorporated into the above described —C(=O)—X—A'—R$_{17}'$ or as a substituent for Z' in formula (II).

The acid-decomposable group includes a group represented by the following formula:

$$-C(=O)-X_1-R_0$$

In the formula, $R_0$ represents a tertiary alkyl group, for example, tert-butyl or tert-amyl group, an isobornyl group, an 1-alkoxyethyl group, for example, 1-ethoxyethyl, 1-butoxyethyl, 1-isobutoxyethyl or 1-cyclohexyloxyethyl group, an alkoxymethyl group, for example, 1-metoxymethyl or 1-ethoxymethyl group, a 3-oxoalkyl group, a tetrahydropyranyl group, a tetrahydrofuryl group, a trialkylsilyl ester group, a 3-oxocyclohexyl ester group, a 2-methyl-2-adamantyl group or a mevalonic lactone residue, and $X_1$ has the same meaning as X defined above.

The halogen atom for each of $R_{13}'$ or $R_{16}'$ includes, for example, chlorine, bromine, fluorine and iodine atoms.

The alkyl group for each of $R_5$, $R_6$ and $R_{13}'$ to $R_{16}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

The cyclic hydrocarbon group for each of $R_5$, $R_6$ and $R_{13}'$ to $R_{16}'$ includes a cyclic alkyl group and a bridged hydrocarbon moiety, for example, cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl or tetracyclododecanyl group.

The ring formed by combining at least two of $R_{13}'$ to $R_{16}'$ includes a ring having from 5 to 12 carbon atoms, for example, cyclopentene, cyclohexene, cycloheptane or cyclooctane ring.

The alkoxy group for $R_{17}'$ includes an alkoxy group having from 1 to 4 carbon atoms, for example, methoxy, ethoxy, propoxy or butoxy group.

Examples of the substituent for the alkyl group, cyclic hydrocarbon group or alkoxy group described above include a hydroxy group, a halogen atom, a carboxy group, an alkoxy group, an acyl group, a cyano group, an acyloxy group, an alkyl group and a cyclic hydrocarbon group. The halogen atom includes, for example, chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl and acetyl groups. The acyloxy group includes, for example, an acetoxy group.

The alkyl group and cyclic hydrocarbon group include those described above.

The divalent linkage group for A' includes a single bond, an alkylene group, a substituted alkylene group, an ether group, a thioether group, a carbonyl group, an ester group, an amido group, a sulfonamido group, a urethane group, a urea group and a combination of two or more thereof.

Examples of the alkylene group or substituted alkylene group for A' include a group represented by the following formula:

In the formula, $R_a$ and $R_b$, which may be the same or different, each represent a hydrogen atom, an alkyl group, a substituted alkyl group, a halogen atom, a hydroxy group or an alkoxy group, and r represents an integer of from 1 to 10.

The alkyl group includes preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

In the resin of component (B) according to the present invention, the acid-decomposable group may be incorporated into at least one repeating unit selected from the repeating unit having a partial structure including an alicyclic hydrocarbon represented by formula (pI), (pII), (pIII), (pIV), (pV) or (pVI), the repeating unit represented by formula (II), and a repeating unit of a copolymerization component described hereinafter.

Various atoms and groups represented by $R_{13}'$ to $R_{16}'$ in formula (II-A) or (II-B) constitute substituents for the atomic group necessary for forming an alicyclic structure or a bridged alicyclic structure represented by Z' in formula (II).

Specific examples of the repeating unit represented by formula (II-A) or (II-B) are set forth below as [II-1] to [II-175], but the present invention should not be construed as being limited thereto.

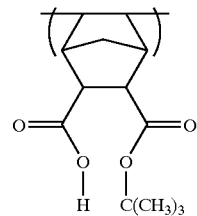

[II-1]

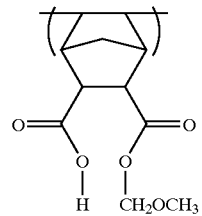

[II-2]

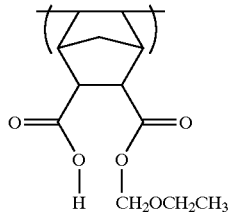

[II-3]

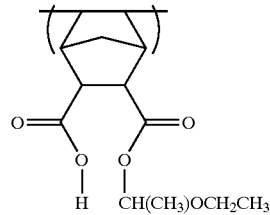

[II-4]

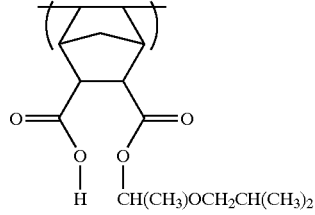

[II-5]

[II-6]
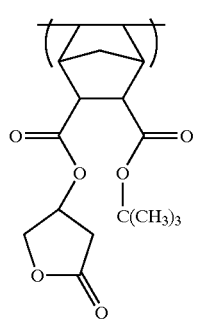
[II-7]
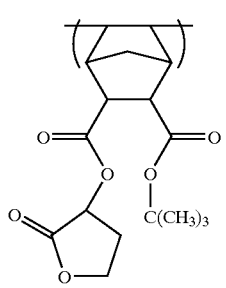
[II-8]
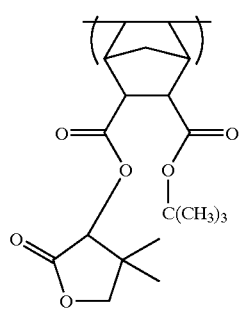
[II-9]
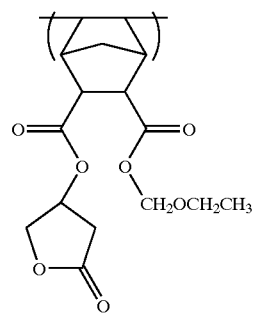
[II-10]
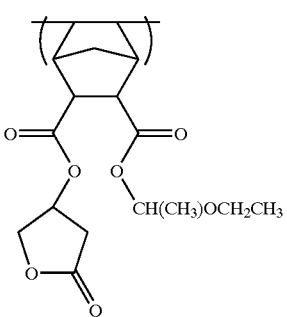
[II-11]
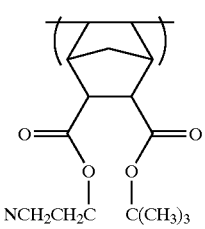
[II-12]
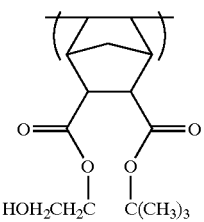
[II-13]
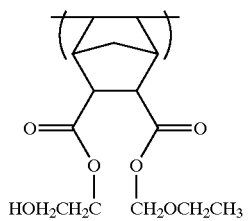
[II-14]
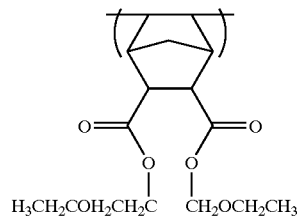
[II-15]
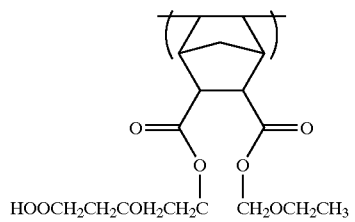
[II-16]
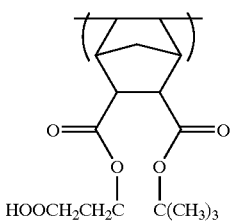
[II-17]
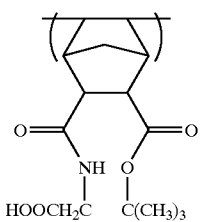

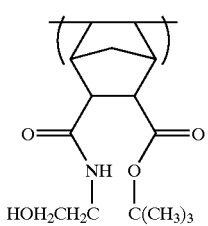 [II-18]
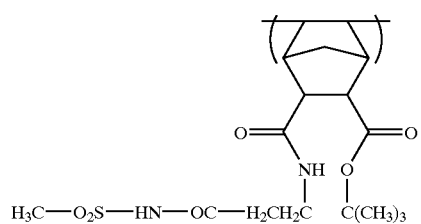 [II-19]
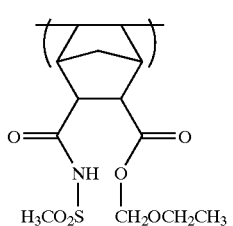 [II-20]
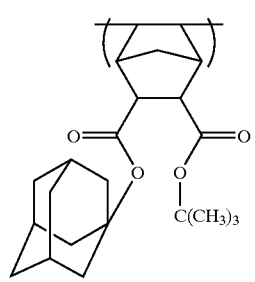 [II-21]
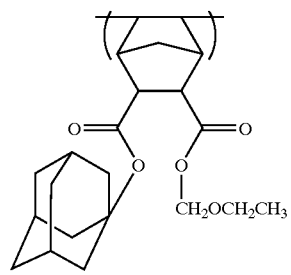 [II-22]
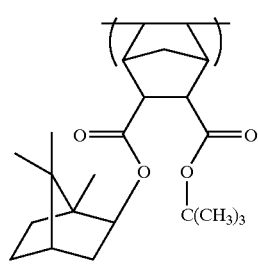 [II-23]
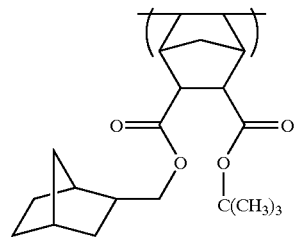 [II-24]
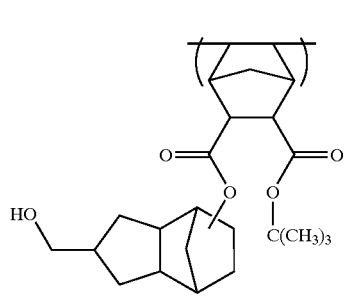 [II-25]
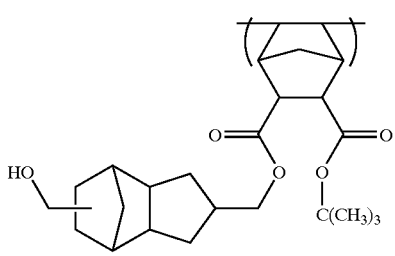 [II-26]
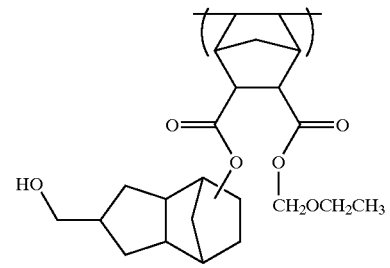 [II-27]
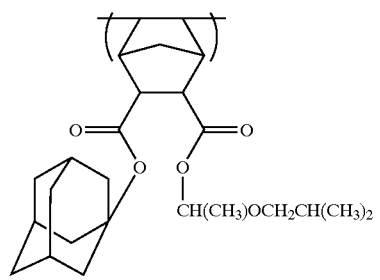 [II-28]
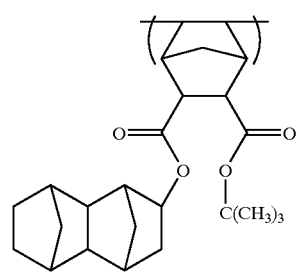 [II-29]

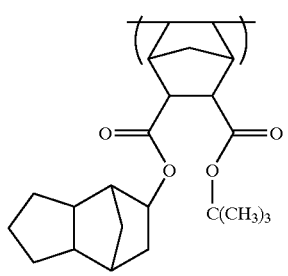
[II-30]
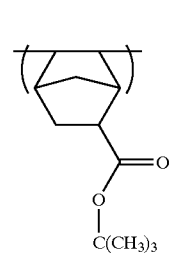
[II-81]
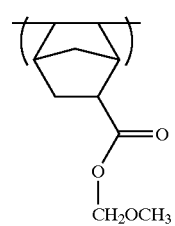
[II-82]
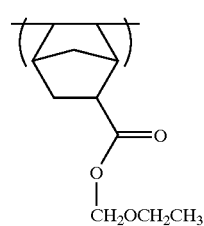
[II-83]
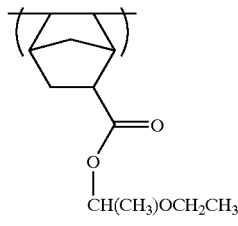
[II-84]
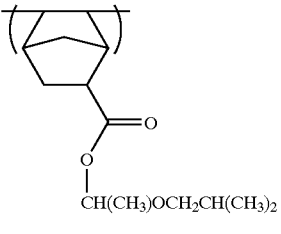
[II-85]
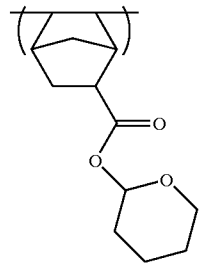
[II-86]
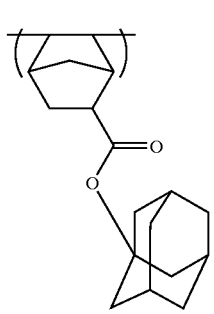
[II-87]
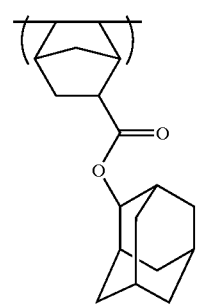
[II-88]
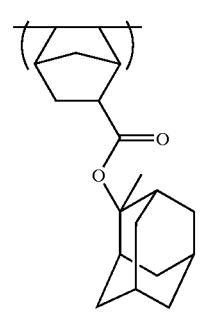
[II-89]
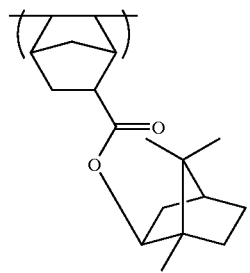
[II-90]

[II-91]
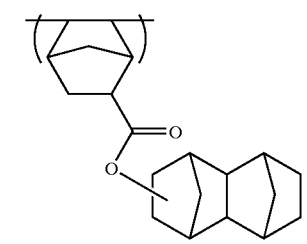
[II-92]
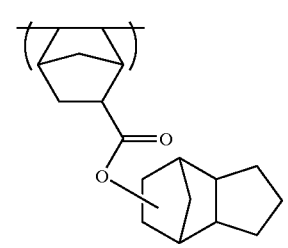
[II-93]
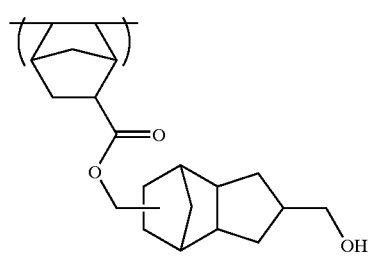
[II-94]
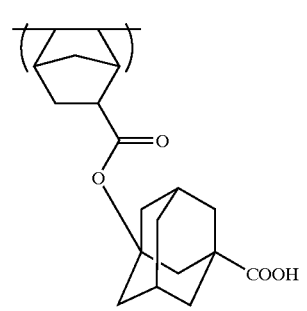
[II-95]
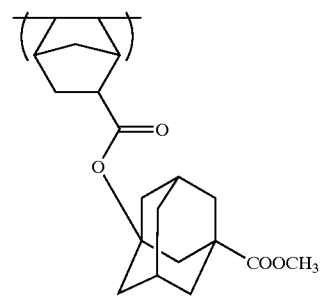
[II-96]
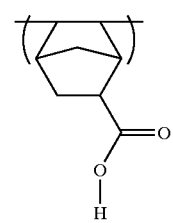
[II-97]
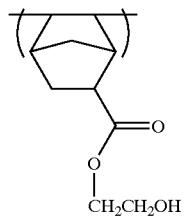
[II-98]
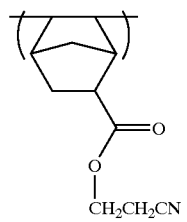
[II-99]
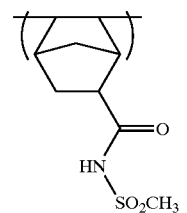
[II-100]
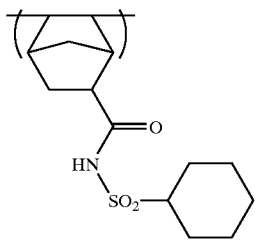
[II-101]
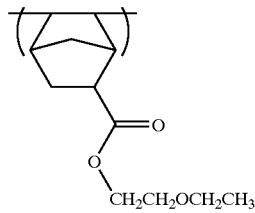
[II-102]
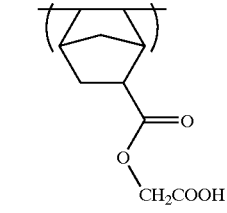
[II-103]
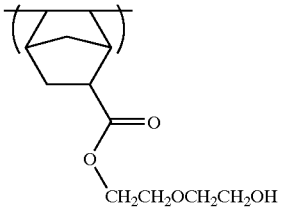

[II-104] 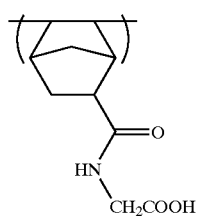
[II-105] 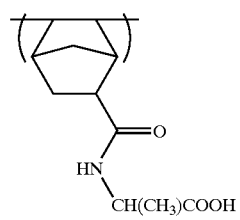
[II-106] 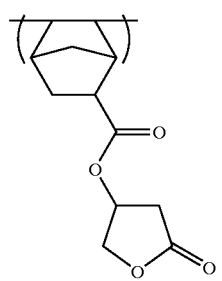
[II-107] 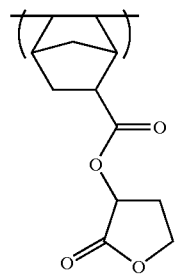
[II-108] 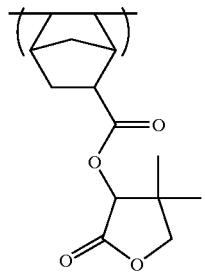
[II-109] 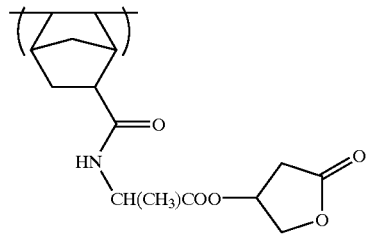
[II-110] 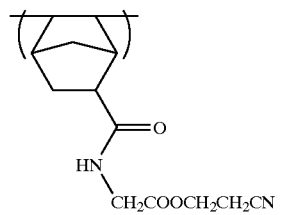
[II-111] 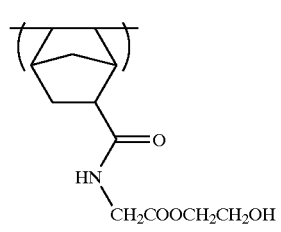
[II-112] 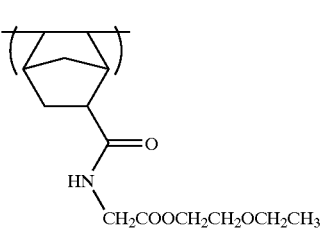
[II-113] 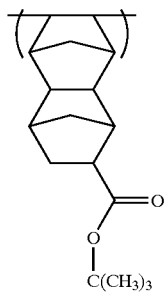
[II-114] 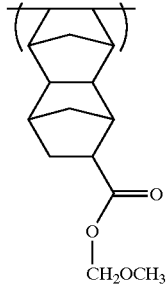
[II-115] 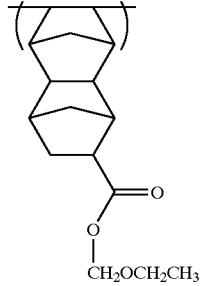

[II-116]
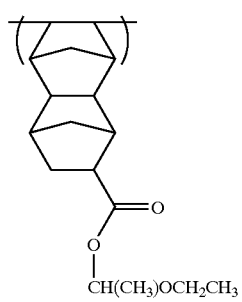
[II-117]
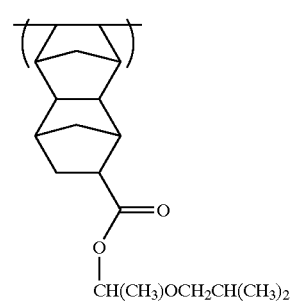
[II-118]
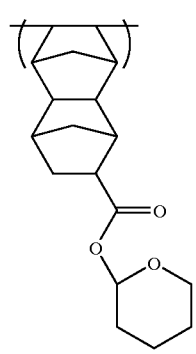
[II-119]
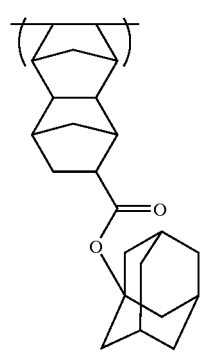
[II-120]
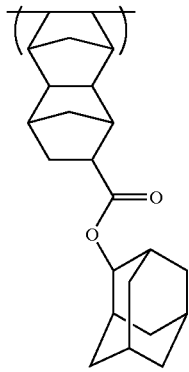
[II-121]
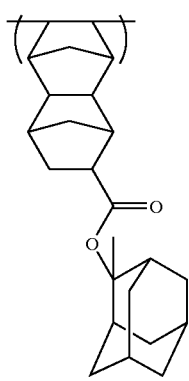
[II-122]
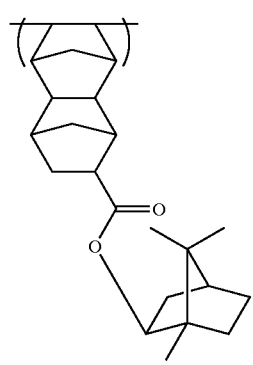
[II-123]
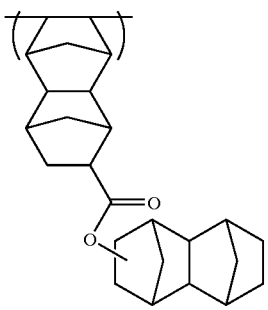

[II-124]
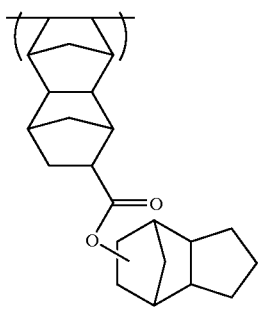
[II-125]
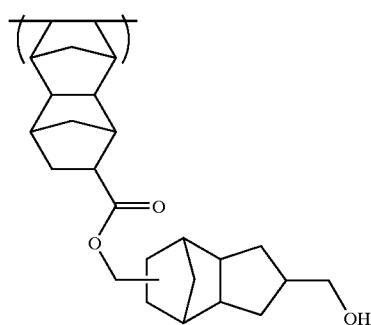
[II-126]
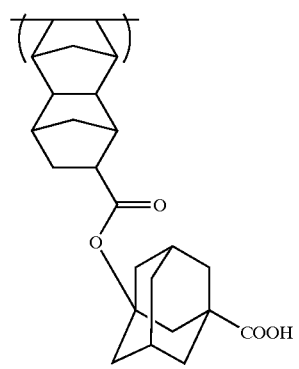
[II-127]
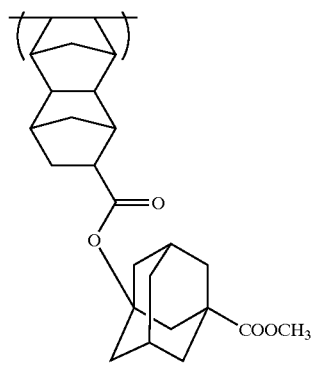
[II-128]
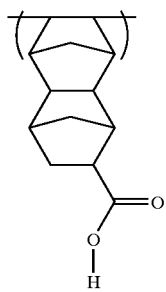
[II-129]
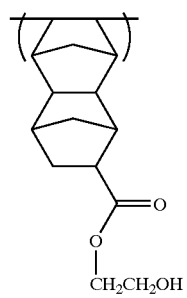
[II-130]
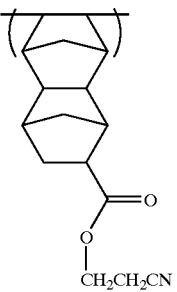
[II-131]
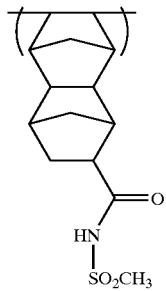
[II-132]

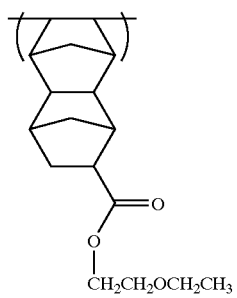 [II-133]
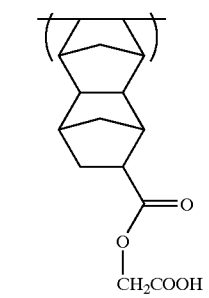 [II-134]
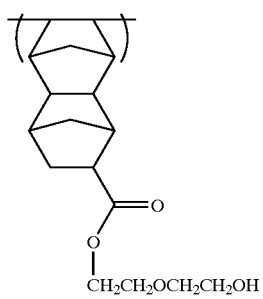 [II-135]
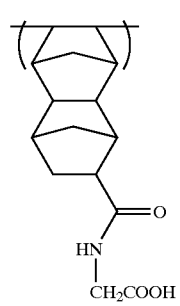 [II-136]
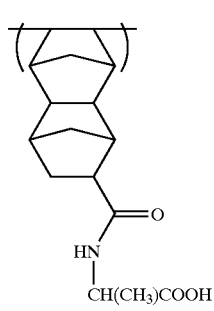 [II-137]
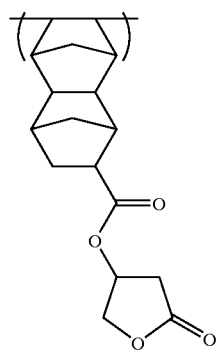 [II-138]
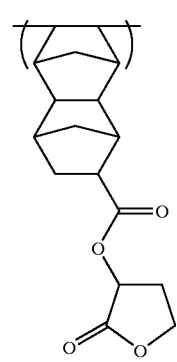 [II-139]
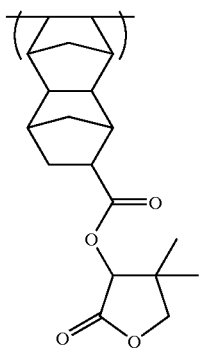 [II-140]
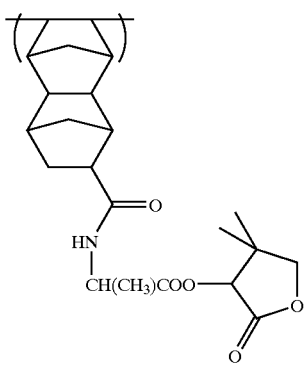 [II-141]

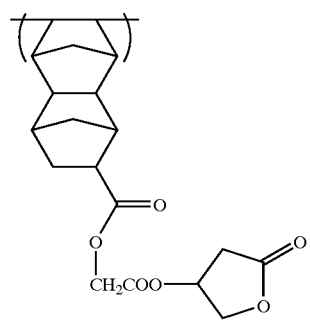
[II-142]
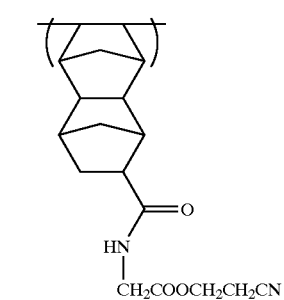
[II-143]
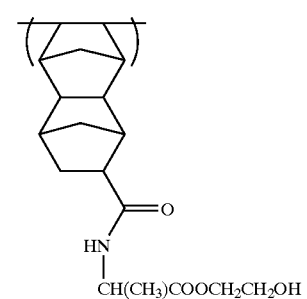
[II-144]
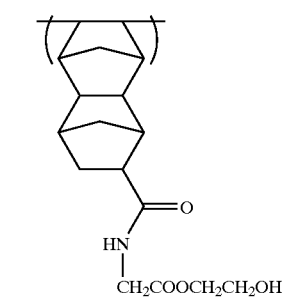
[II-145]
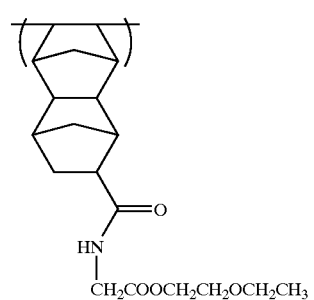
[II-146]
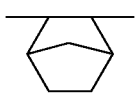
[II-147]
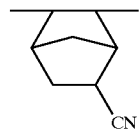
[II-148]
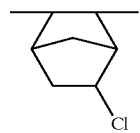
[II-149]
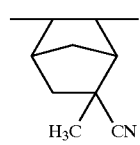
[II-149]
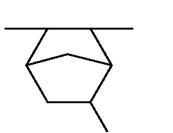
[II-150]
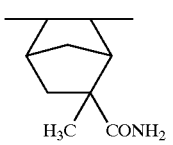
[II-151]
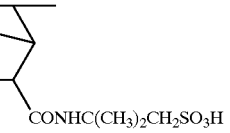
[II-152]
[II-153]
[II-154]
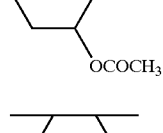
[II-155]
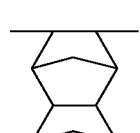
[II-156]

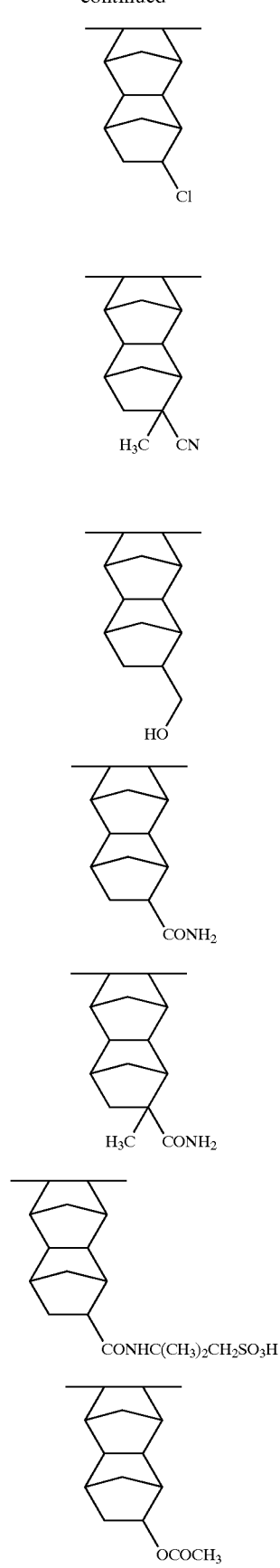
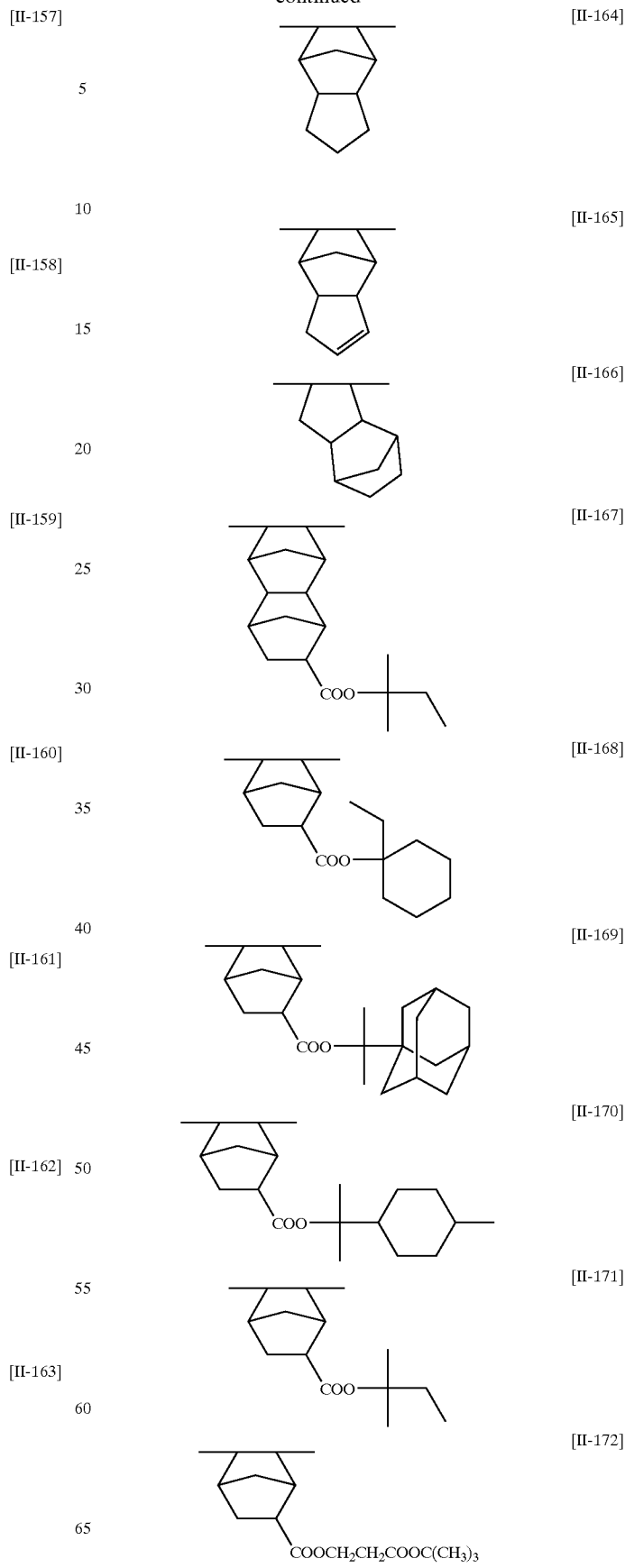

-continued

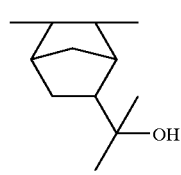
[II-173]

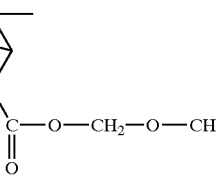
[II-174]

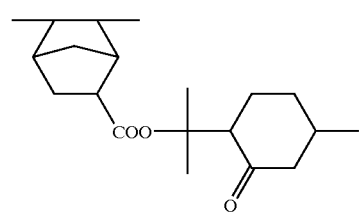
[II-175]

It is preferred that the acid-decomposable resin of component (B) according to the present invention contains a repeating unit having a lactone structure.

For instance, the acid-decomposable resin preferably contains a repeating unit represented by the following formula (IV):

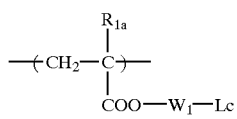
(IV)

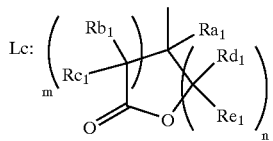

In formula (IV), $R_{1a}$ represents a hydrogen atom or a methyl group.

$W_1$ represents a single bond, an alkylene group, an ether group, a thioether group, a carbonyl group, an ester group or a combination of two or more thereof.

$R_{a1}$, $R_{b1}$, $R_{c1}$, $R_{d1}$ and $R_{e1}$, which may be the same or different, each independently represent a hydrogen atom or an alkyl group having from 1 to 4 carbon atoms. m and n, which may be the same or different, each independently represent an integer of from 0 to 3, provided that the sum total of m and n is from 2 to 6.

The alkyl group having from 1 to 4 carbon atoms represented by $R_{a1}$, $R_{b1}$, $R_{c1}$, $R_{d1}$ or $R_{e1}$ includes, for example, methyl, ethyl, propyl, isopropyl, n-butyl, isobutyl, sec-butyl and tert-butyl groups.

The alkylene group represented by $W_1$ in formula (IV) includes a group represented by the following formula:

—{C(Rf)(Rg)}$_{r_1}$—

In the above formula, Rf and Rg, which may be the same or different, each represent a hydrogen atom, an alkyl group, a substituted alkyl group, a halogen atom, a hydroxy group or an alkoxy group, and $r_1$ represents an integer of from 1 to 10.

The alkyl group is preferably a lower alkyl group, for example, methyl, ethyl, propyl, isopropyl or butyl group, more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

Examples of further substituent for the alkyl group include a carboxy group, an acyloxy group, a cyano group, an alkyl group, a substituted alkyl group, a halogen atom, a hydroxy group, an alkoxy group, a substituted alkoxy group, an acetylamido group, an alkoxycarbonyl group and an acyl group.

The alkyl group includes a lower alkyl group, for example, methyl, ethyl, propyl, isopropyl, butyl, cyclopropyl, cyclobutyl or cyclopentyl group. A substituent for the substituted alkyl group includes, for example, a hydroxy group, a halogen atom and an alkoxy group. A substituent for the substituted alkoxy group includes, for example, an alkoxy group. The alkoxy group includes an alkoxy group having from 1 to 4 carbon atoms, for example, methoxy, ethoxy, propoxy or butoxy group. The acyloxy group includes, for example, an acetoxy group. The halogen atom includes, for example, chlorine, bromine, fluorine and iodine atoms.

Specific examples of the repeating unit represented by formula (IV) are set forth below, but the present invention should not be construed as being limited thereto.

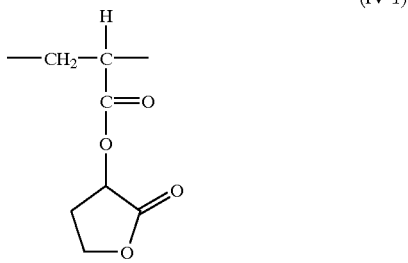
(IV-1)

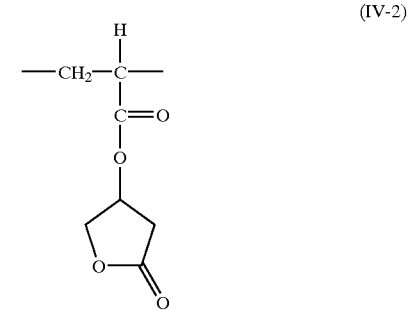
(IV-2)

-continued
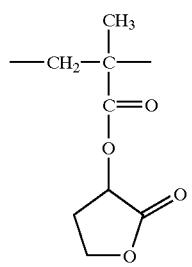 (IV-3)
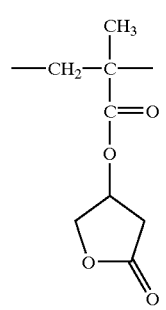 (IV-4)
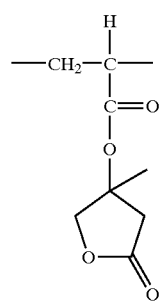 (IV-5)
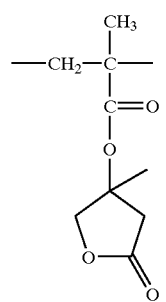 (IV-6)
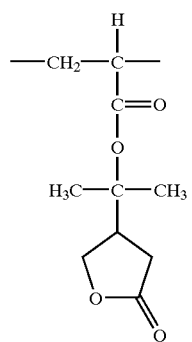 (IV-7)
-continued
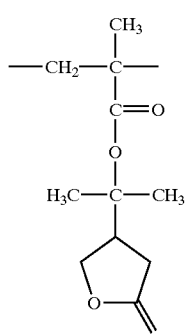 (IV-8)
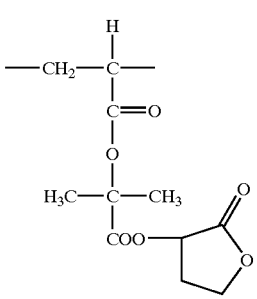 (IV-9)
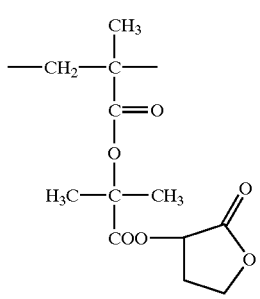 (IV-10)
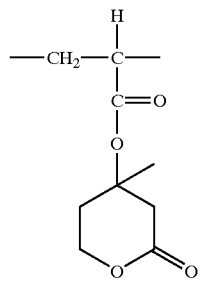 (IV-11)
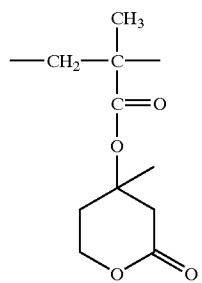 (IV-12)

-continued
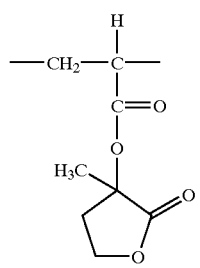 (IV-13)
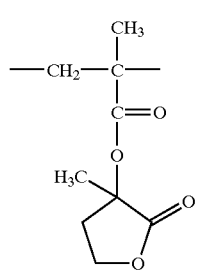 (IV-14)
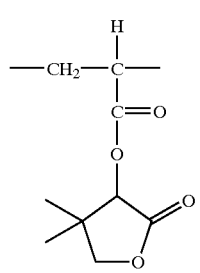 (IV-15)
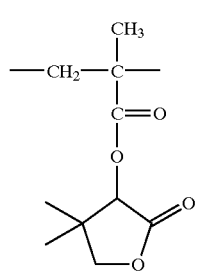 (IV-16)
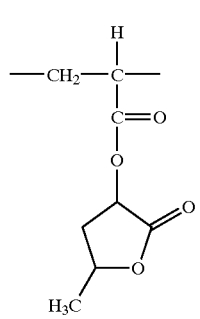 (IV-17)
-continued
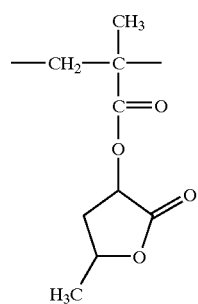 (IV-18)
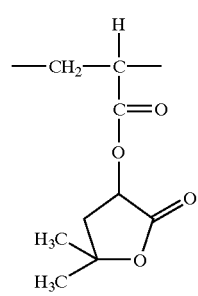 (IV-19)
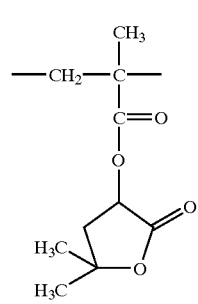 (IV-20)
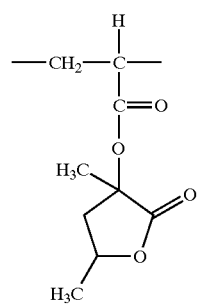 (IV-21)
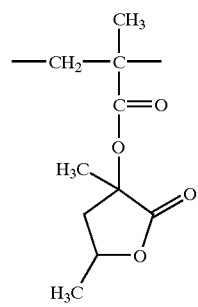 (IV-22)

-continued
(IV-23) 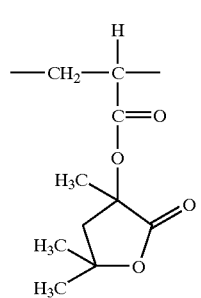
(IV-24) 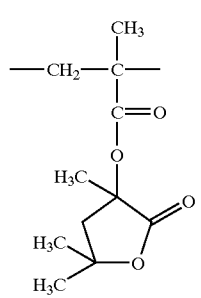
(IV-25) 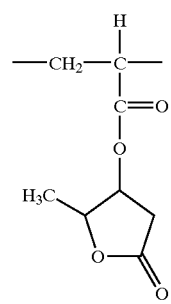
(IV-26) 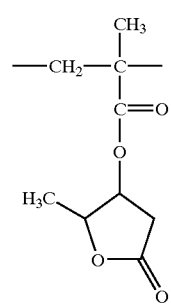
(IV-27) 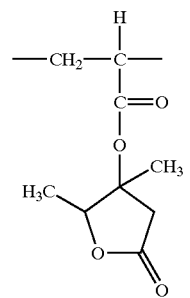
-continued
(IV-28) 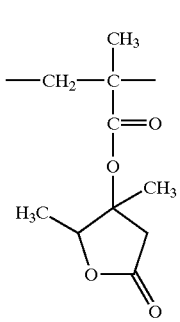
(IV-29) 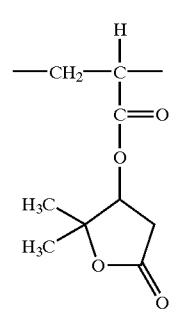
(IV-30) 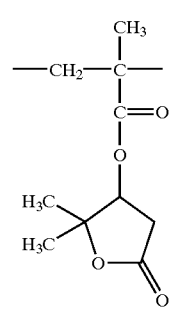
(IV-31) 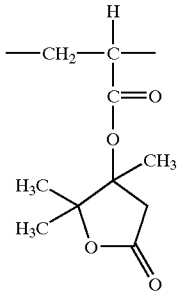
(IV-32) 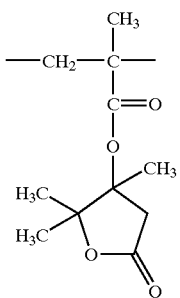

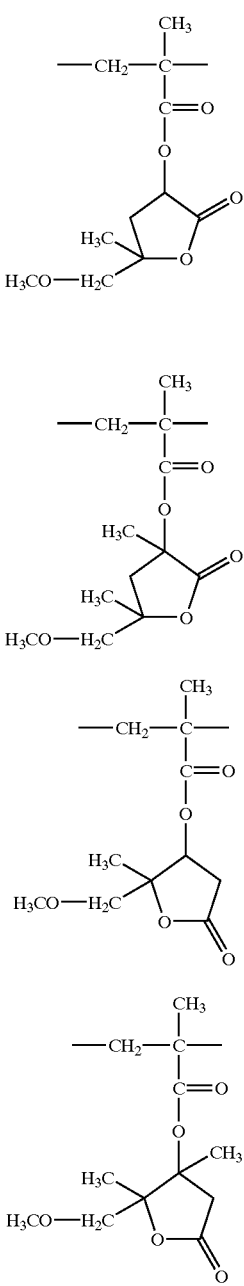

(IV-33)

(IV-34)

(IV-35)

(IV-36)

Of the specific examples of the repeating unit represented by formula (VI), (IV-17) to (IV-36) are preferred in view of more improved exposure margin.

Further, the repeating units represented by formula (IV) wherein an acrylate structure is included are preferred from a standpoint of good edge roughness.

It is also preferred that the resin according to the present invention contains a repeating unit including an alicyclic lactone structure represented by any one of the following formulae (V-1) to (V-4):

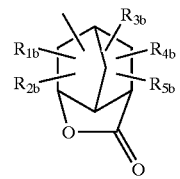

(V-1)

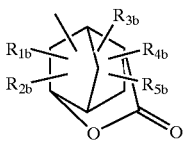

(V-2)

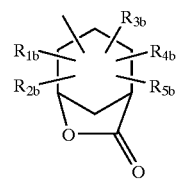

(V-3)

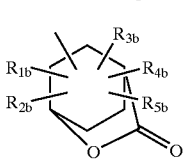

(V-4)

In formulae (V-1) to (V-4), $R_{1b}$, $R_{2b}$, $R_{3b}$, $R_{4b}$ and $R_{5b}$, which may be the same or different, each independently represent a hydrogen atom, an alkyl group which may have a substitutent, a cycloalkyl group which may have a substituent or an alkenyl group which may have a substituent, or two of $R_{1b}$, $R_{2b}$, $R_{3b}$, $R_{4b}$ and $R_{5b}$ may be combined with each other to form a ring.

The alkyl group represented by any one of $R_{1b}$, $R_{2b}$, $R_{3b}$, $R_{4b}$ and $R_{5b}$ in formulae (V-1) to (V-4) includes a straight chain or branched alkyl group which may have a substituent. The straight chain or branched alkyl group includes preferably a straight chain or branched alkyl group having from 1 to 12 carbon atoms, more preferably a straight chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl groups.

The cycloalkyl group represented by any one of $R_{1b}$, $R_{2b}$, $R_{3b}$, $R_{4b}$ and $R_{5b}$ in formulae (V-1) to (V-4) includes preferably a cycloalkyl group having from 3 to 8 carbon atoms, for example, cyclopropyl, cyclopentyl, cyclohexyl, cycloheptyl or cyclooctyl group.

The alkenyl group represented by any one of $R_{1b}$, $R_{2b}$, $R_{3b}$, $R_{4b}$ and $R_{5b}$ in formulae (V-1) to (V-4) includes preferably an alkenyl group having from 2 to 6 carbon atoms, for example, vinyl, propenyl, butenyl or hexenyl group.

The ring formed by combining two of $R_{1b}$, $R_{2b}$, $R_{3b}$, $R_{4b}$ and $R_{5b}$ in any one of formulae (V-1) to (V-4) includes preferably a 3-membered to 8-membered ring, for example, cyclopropane, cyclobutane, cyclopentane, cyclohexane or cyclooctane ring.

The group represented by $R_{1b}$, $R_{2b}$, $R_{3b}$, $R_{4b}$ and $R_{5b}$ in formulae (V-1) to (V-4) can be bonded to any one of the carbon atoms constituting the cyclic structure.

Preferred examples of the substituent for the alkyl group, cycloalkyl group and alkenyl group described above include an alkoxy group having from 1 to 4 carbon atoms, a halogen atom (e.g., fluorine, chlorine, bromine or iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of repeating unit having the group represented by any one of formulae (V-1) to (V-4) include a repeating unit represented by formula (II-A) or (II-B) described above wherein one of $R_{13}'$ to $R_{16}'$ has the group represented by any one of formulae (V-1) to (V-4), for example, $R_5$ of —$COOR_5$ is the group represented by any one of formulae (V-1) to (V-4), and a repeating unit represented by the following formula (AI):

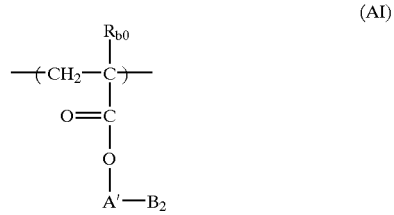

In formula (AI), $R_{b0}$ represents a hydrogen atom, a halogen atom, a substituted or unsubstituted alkyl group having from 1 to 4 carbon atoms. Preferred examples of the substituent for the alkyl group represented by $R_{b0}$ include the preferred examples of substituent for the alkyl group represented by $R_{1b}$ in any one of formulae (V-1) to (V-4) described above.

The halogen atom represented by $R_{b0}$ includes fluorine, chlorine, bromine and iodine atoms. $R_{b0}$ is preferably a hydrogen atom, A' in formula (AI) represents a single bond, an ether group, an ester group, a carbonyl group, an alkylene group or a divalent group formed by combining these groups.

$B_2$ in formula (AI) represents the group represented by any one of formulae (V-1) to (V-4).

Examples of the divalent group formed by combination of the groups represented by A' includes groups represented by the following formulae;

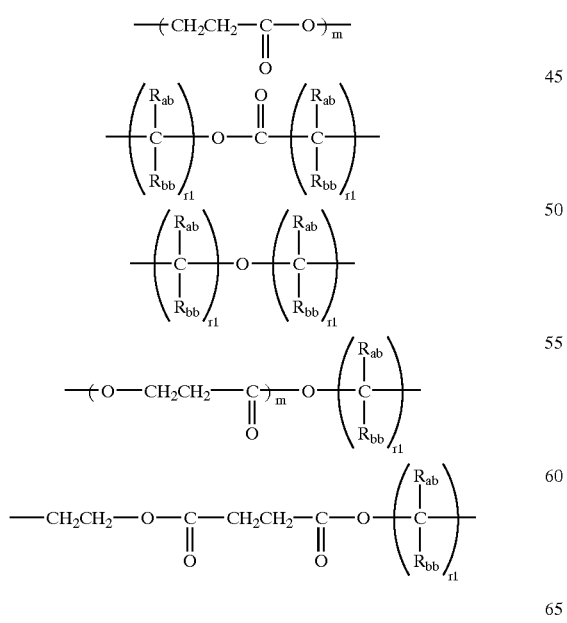

In the above-described formulae, $R_{ab}$ and $R_{bb}$, which may be the same or different, each represent a hydrogen atom, an alkyl group, a substituted alkyl group, a halogen atom, a hydroxy group or an alkoxy group.

The alkyl group represented by any one of $R_{ab}$ and $R_{bb}$ is preferably a lower alkyl group, for example, methyl, ethyl, propyl, isopropyl or butyl group, and more preferably methyl, ethyl, propyl or isopropyl group. A substituent for the substituted alkyl group includes a hydroxy group, a halogen atom and an alkoxy group having from 1 to 4 carbon atoms.

The alkoxy group includes an alkoxy group having from 1 to 4 carbon atoms, for example, methoxy, ethoxy, propoxy or butoxy group. The halogen atom includes, for example, chlorine, bromine, fluorine and iodine atoms, r1 represents an integer of from 1 to 10, and preferably from 1 to 4. m represents an integer of from 1 to 3, and preferably 1 or 2.

Specific examples of the repeating unit represented by formula (AI) are set forth below, but the present invention should not be construed as being limited thereto.

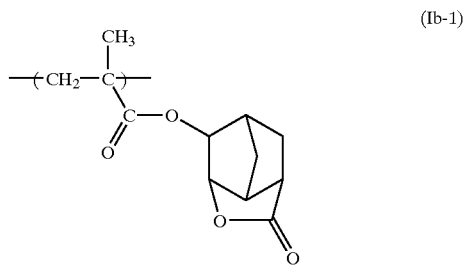
(Ib-1)

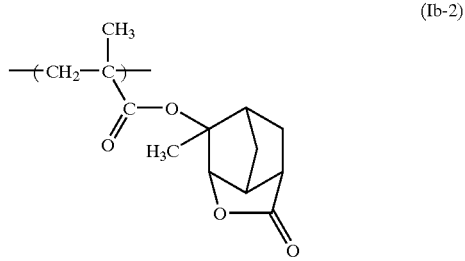
(Ib-2)

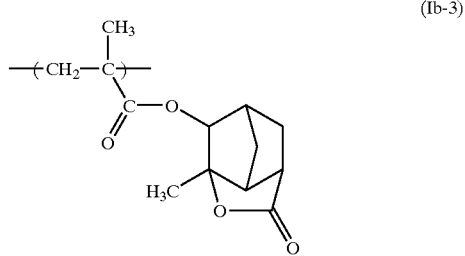
(Ib-3)

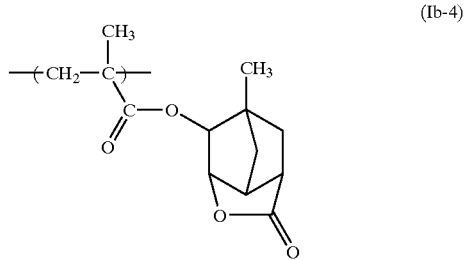
(Ib-4)

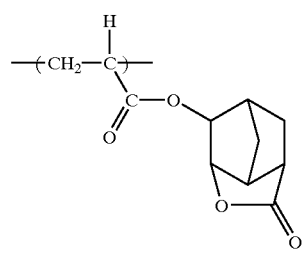
(Ib-5)
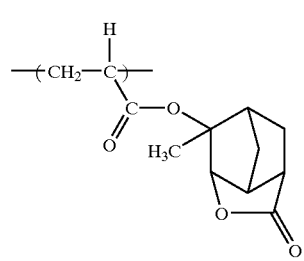
(Ib-6)
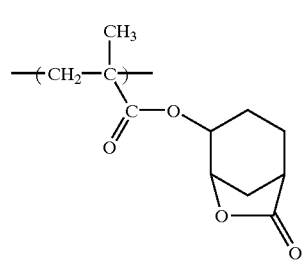
(Ib-7)
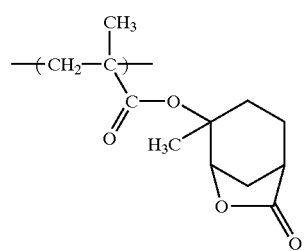
(Ib-8)
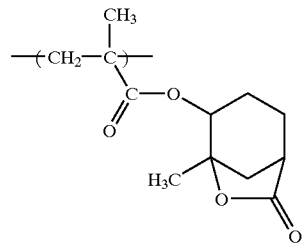
(Ib-9)
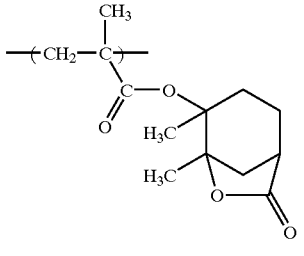
(Ib-10)
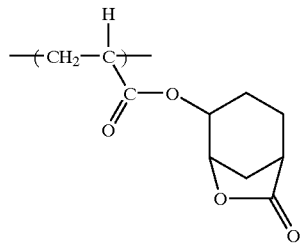
(Ib-11)
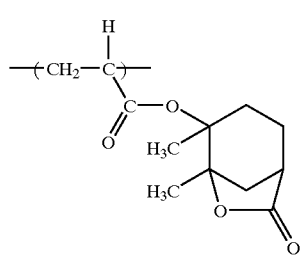
(Ib-12)
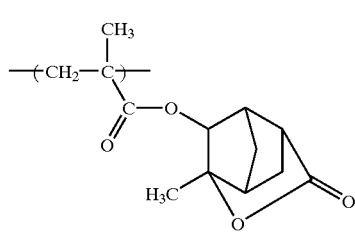
(Ib-13)
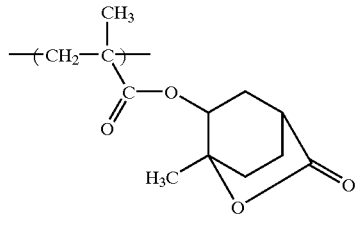
(Ib-14)
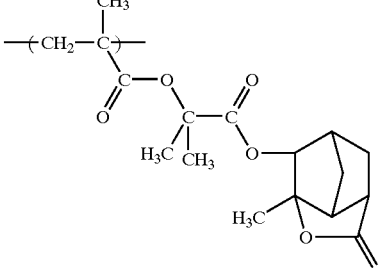
(Ib-15)
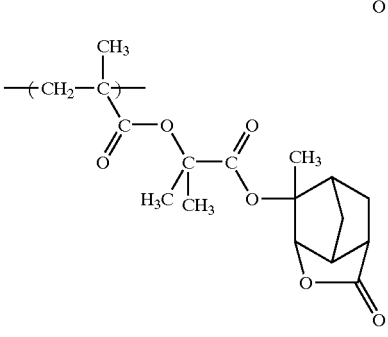
(Ib-16)

(Ib-17)
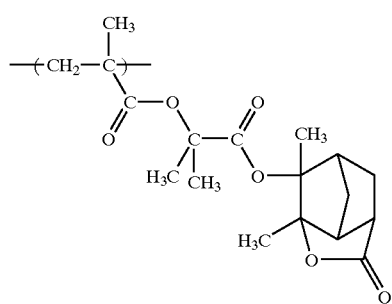
(Ib-18)
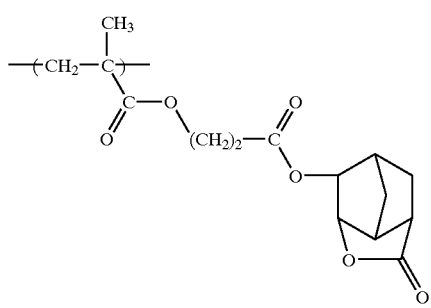
(Ib-19)
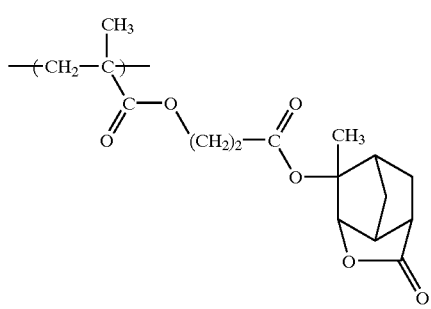
(Ib-20)
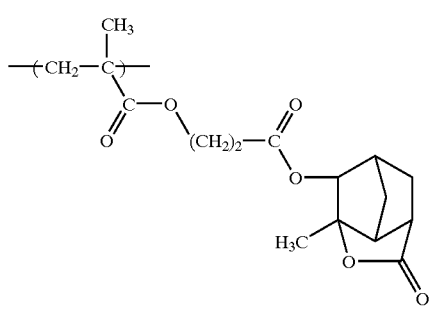
(Ib-21)
(Ib-22)
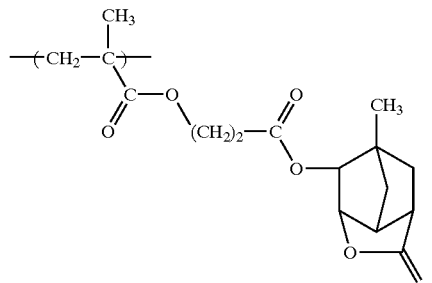
(Ib-23)
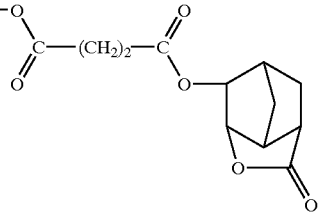
(Ib-24)
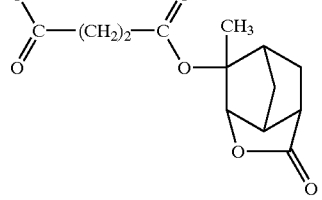
(Ib-25)
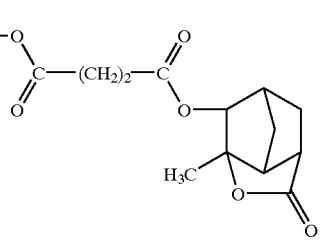

(Ib-26)
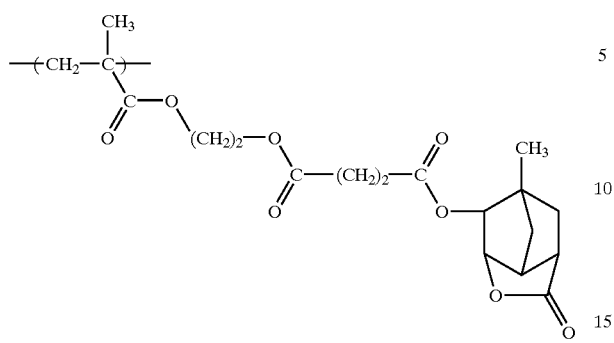
(Ib-27)
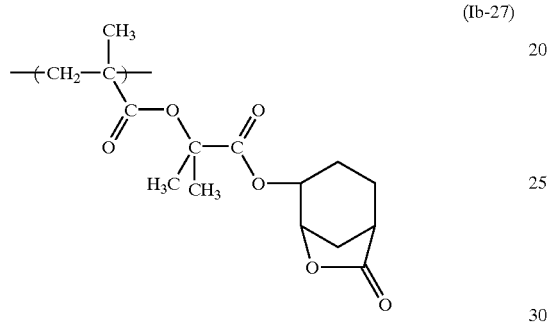
(Ib-28)
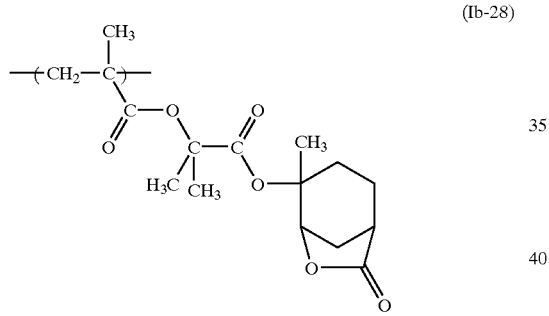
(Ib-29)
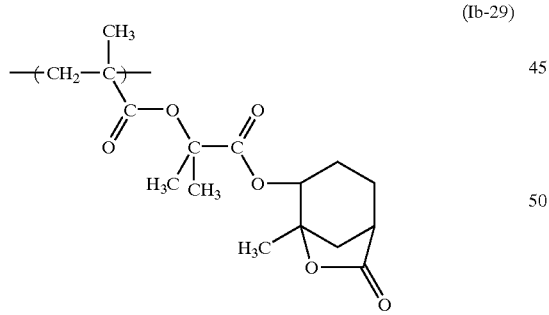
(Ib-30)
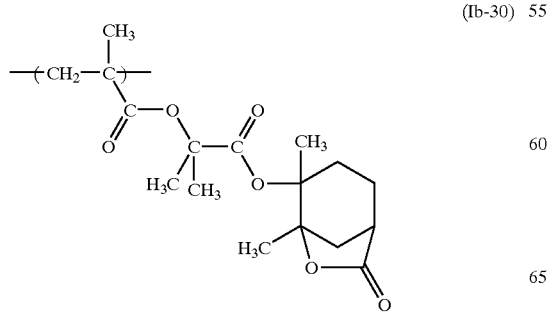
(Ib-31)
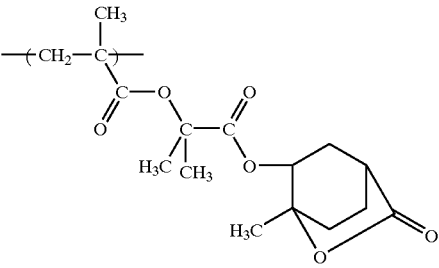
(Ib-32)
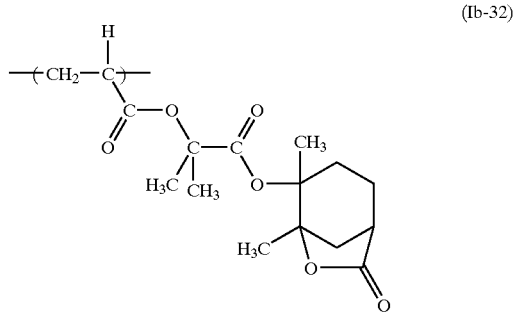
(Ib-33)
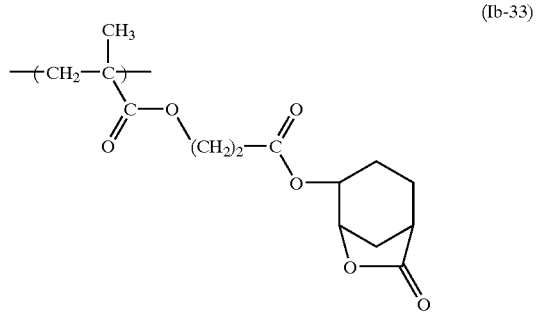
(Ib-34)
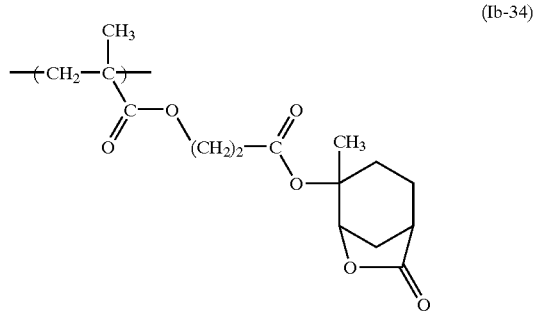
(Ib-35)
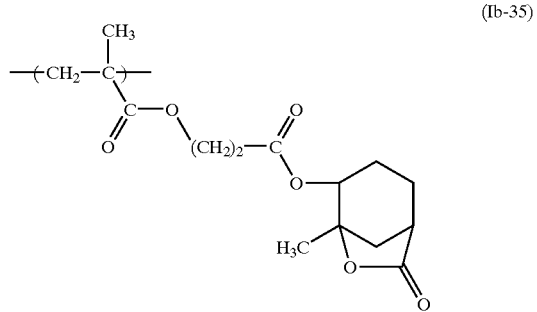

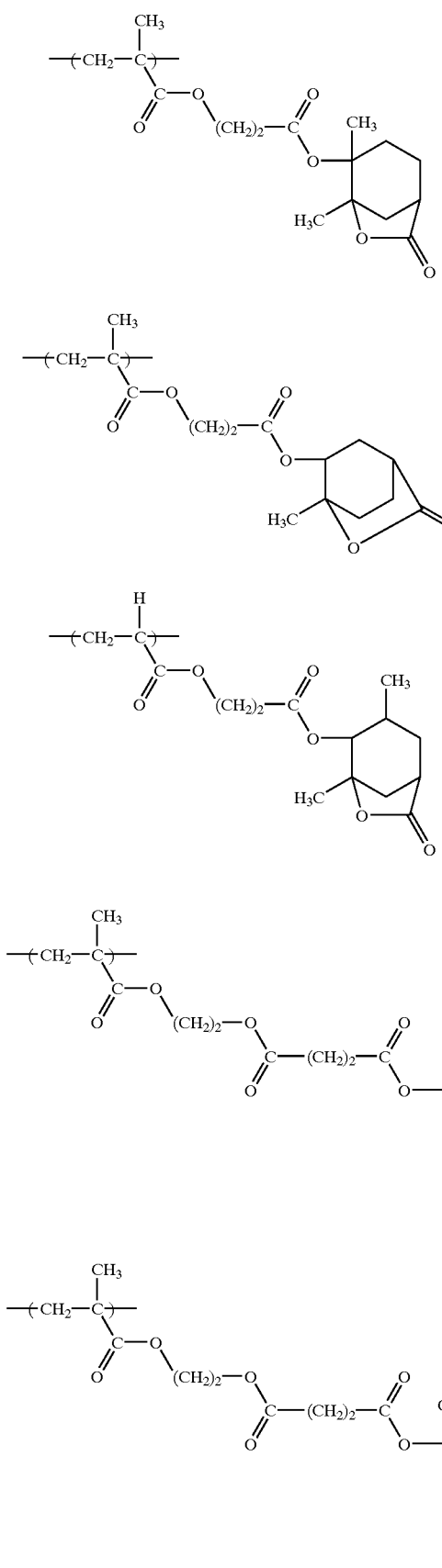
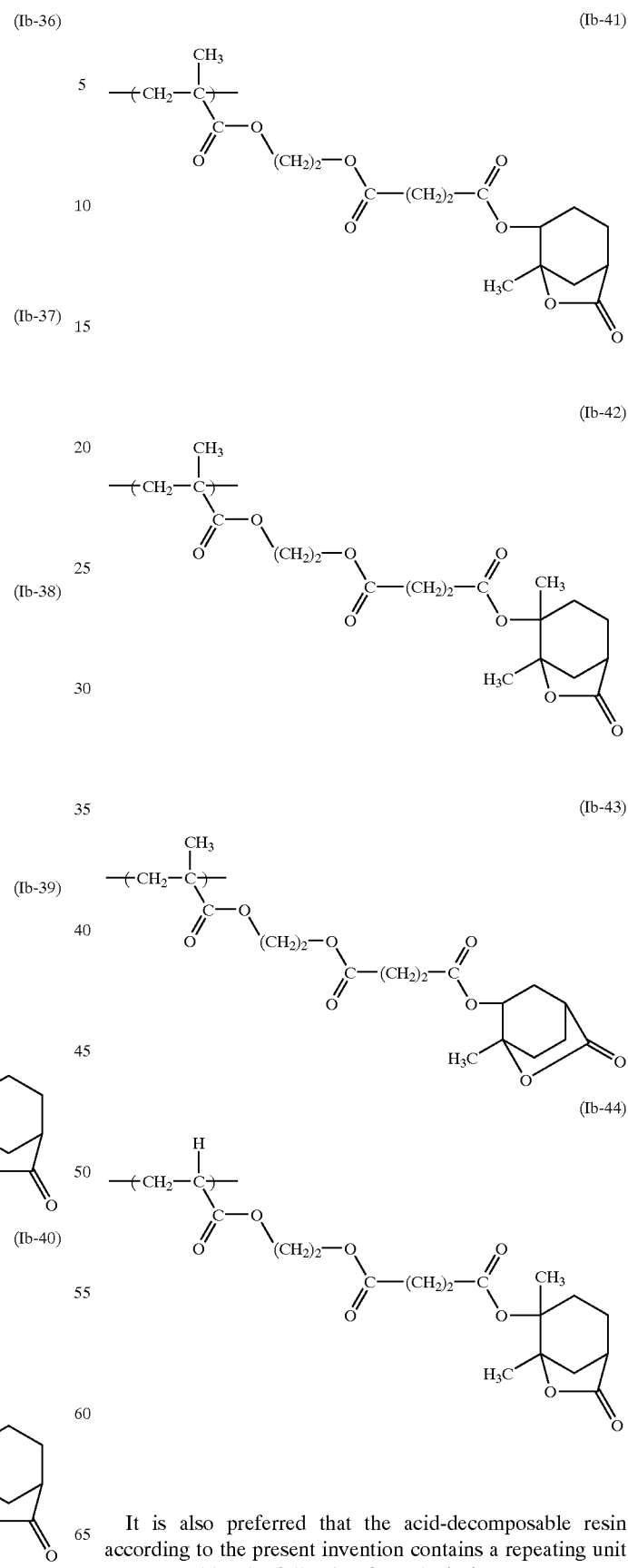
It is also preferred that the acid-decomposable resin according to the present invention contains a repeating unit represented by the following formula (VI):

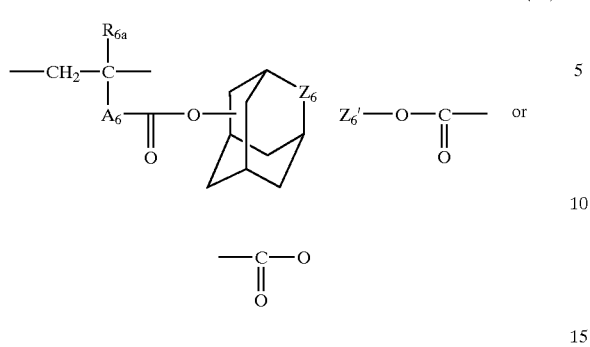

(VI)

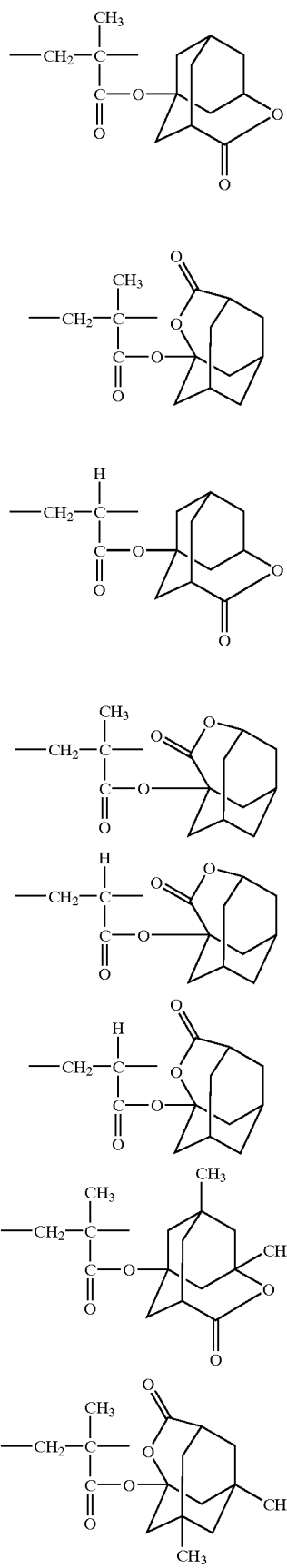

In formula (VI), $A_6$ represents a single bond, an alkylene group, a cycloalkylene group, an ether group, a thioether group, a carbonyl group, an ester group or a combination of two or more thereof.

$R_{6a}$ represents a hydrogen atom, an alkyl group having from 1 to 4 carbon atoms, a cyano group or a halogen atom.

The alkylene group for $A_6$ in formula (VI) includes a group represented by the following formula:

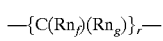

In formula, $Rn_f$ and $Rn_g$, which may be the same or different, each represent a hydrogen atom, an alkyl group, a substituted alkyl group, a halogen atom, a hydroxy group or an alkoxy group, and r represents an integer of from 1 to 10.

The alkyl group is preferably a lower alkyl group, for example, methyl, ethyl, propyl, isopropyl or butyl group, and more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

The cycloalkylene group represented by $A_6$ in formula (VI) includes a cycloalkylene group having from 3 to 10 carbon atoms, for example, cyclopentylene, cyclohexylene or cyclooctylene group.

In formula (VI), the bridged alicyclic group including $Z_6$ may have one or more substituents. Examples of the substituent include a halogen atom, an alkoxy group (preferably an alkoxy group having from 1 to 4 carbon atoms), an alkoxycarbonyl group (preferably an alkoxycarbonyl group having from 1 to 5 carbon atoms), an acyl group (for example, formyl or benzyl group), an acyloxy group (for example, propylcarbonyloxy or benzoyloxy group), an alkyl group (preferably an alkyl group having from 1 to 4 carbon atoms), a carboxy group, a hydroxy group and an alkylsulfonylsulfamoyl group (for example, —$CONHSO_2CH_3$). The alkyl group as the substituent may further be substituted with a hydroxy group, a halogen atom or an alkoxy group (preferably an alkoxy group having from 1 to 4 carbon atoms).

The oxygen atom of the ester group connected to $A_6$ in formula (VI) can be bonded to any one of the carbon atoms constituting the bridged alicyclic structure containing $Z_6$.

Specific examples of the repeating unit represented by formula (VI) are set forth below, but the present invention should not be construed as being limited thereto.

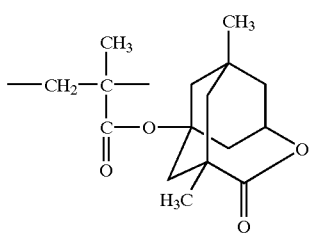
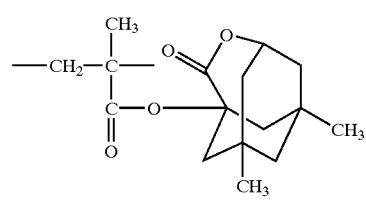
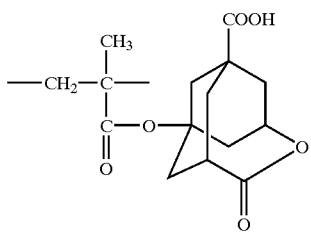
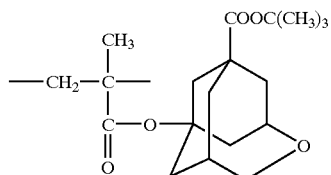
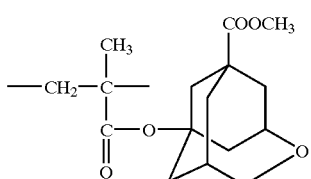
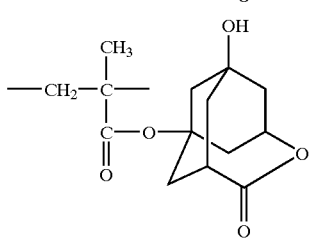
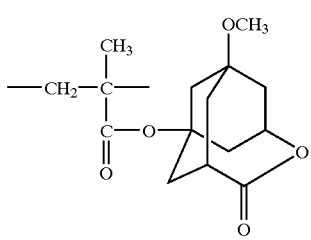

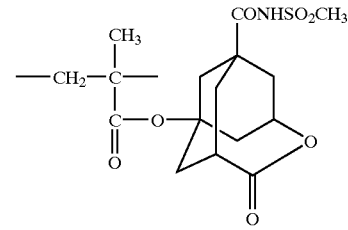

The resin according to the present invention may further contain a repeating unit having a group represented by the following formulae (VII):

(VII)

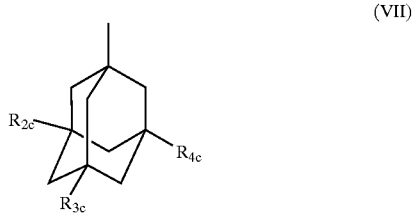

In formula (VII), $R_{2c}$, $R_{3c}$ and $R_{4c}$, which may be the same or different, each represent a hydrogen atom or a hydroxy group, provided that at least one of $R_{2c}$, $R_{3c}$ and $R_{4c}$ represents a hydroxy group.

The group represented by formula (VII) is preferably a dihydroxy body or a monohydroxy body, and more preferably a dihydroxy body.

Examples of the repeating unit having the group represented by formulae (VII) include a repeating unit represented by formula (II-A) or (II-B) described above wherein one of $R_{13}'$ to $R_{16}'$ has the group represented by formula (VII), for example, $R_5$ of —COOR$_5$ is the group represented by formula (VII), and a repeating unit represented by the following formula (AII):

(AII)

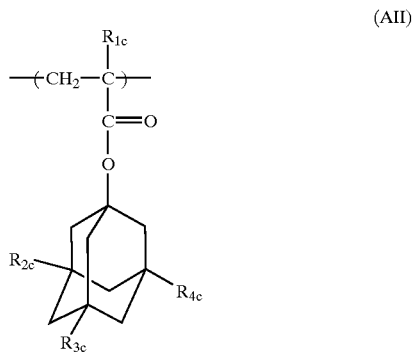

In formula (AII), $R_{1c}$ represents a hydrogen atom or a methyl group, and $R_{2c}$, $R_{3c}$ and $R_{4c}$, which may be the same or different, each independently represents a hydrogen atom or a hydroxy group, provided that at least one of $R_{2c}$, $R_{3c}$ and $R_{4c}$ represents a hydroxy group.

Specific examples of the repeating unit represented by formula (AII) are set forth below, but the present invention should not be construed as being limited thereto.

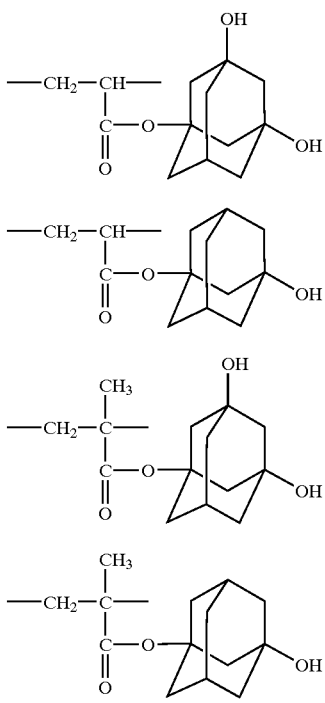

(1)

(2)

(3)

(4)

The resin according to the present invention may further contain a repeating unit having a group represented by the following formulae (VIII):

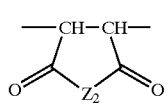

(VIII)

In formula (VIII), $Z_2$ represents —O— or —N($R_{41}$)—, $R_{41}$ represents a hydrogen atom, a hydroxy group, an alkyl group, a haloalkyl group or —O—SO$_2$—$R_{42}$, and $R_{42}$ represents an alkyl group, a haloakyl group, a cycloalkyl group or a camphol residue.

Examples of the alkyl group represented by $R_{41}$ or $R_{42}$ include preferably a straight chain or branched alkyl group having form 1 to 10 carbon atoms, more preferably a straight chain or branched alkyl group having form 1 to 6 carbon atoms, and still more preferably methyl, ethyl, propyl, isopropyl, n-butyl, isobutyl, sec-butyl and tert-butyl groups.

Examples of the haloalkyl group represented by $R_{41}$ or $R_{42}$ include trifluoromethyl, nonafluorobutyl, pentadecafluorooctyl and trichloroinethyl groups.

Examples of the cycloalkyl group represented by $R_{42}$ include cyclopentyl, cyclohexyl and cyclooctyl groups.

The alkyl group and haloalkyl group represented by $R_{41}$ or $R_{42}$ and the cycloalkyl group and camphol residue represented by $R_{42}$ may have one or more substituents.

Examples of the substituent for the alkyl group, haloalkyl group, cycloalkyl group and camphol residue include a hydroxy group, a carboxy group, a cyano group, a halogen atom (e.g., chlorine, bromine, fluorine or iodine atom), an alkoxy group (preferably an alkoxy group having from 1 to 4 carbon atoms, e.g., methoxy, ethoxy, propoxy or butoxy group), an acyl group (preferably an acyl group having from 2 to 5 carbon atoms, e.g., formyl or acetyl group), an acyloxy group (preferably an acyloxy group having from 2 to 5 carbon atoms, e.g., acetoxy group) and an aryl group (preferably an aryl group having from 6 to 14 carbon atoms, e.g., phenyl group).

Specific examples of the repeating unit represented by formula (VIII) are set forth below as formulae [I'-1] to [I'-7], but the present invention should not be construed as being limited thereto.

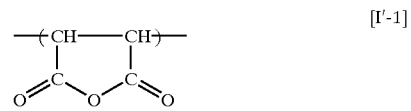

[I'-1]

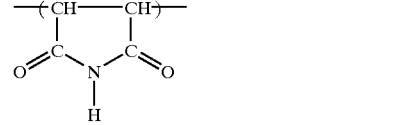

[I'-2]

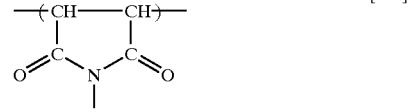

[I'-3]

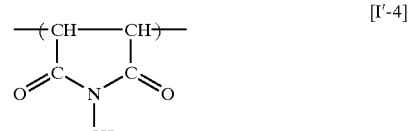

[I'-4]

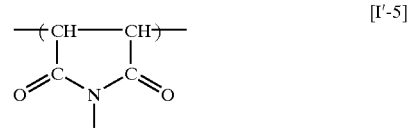

[I'-5]

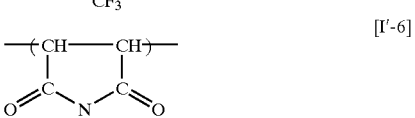

[I'-6]

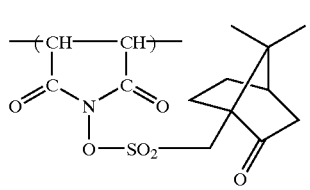

[I'-7]

The acid-decomposable resin of component (B) according to the present invention may contain various repeating structural units in addition to the repeating structural units described above for the purposes of adjusting dry etching resistance, standard developing solution aptitude, adhesion to substrate, resist profile, and other characteristics ordinarily required for resist, for example, resolution, heat resistance and sensitivity.

Examples of such repeating structural units include repeating structural units corresponding to monomers described below, but the present invention should not be construed as being limited thereto.

The introduction of additional repeating structural unit makes possible the minute control of characteristics required for the acid-decomposable resin, particularly (1) solubility in a coating solvent, (2) film forming property (glass transition temperature), (3) developing property with alkali, (4) reduction in a film thickness (hydrophobicity, selection of alkali-soluble group), (5) adhesion of the unexposed area to a substrate, and (6) dry etching resistance.

Examples of such monomers include compounds having one addition-polymerizable unsaturated bond, for example, acrylates, methacrylate, acrylamides, methacrylamides, allyl compound, vinyl ethers and vinyl esters.

Specific examples of the monomer include an acrylate, for example, an alkyl acrylate (preferably an alkyl acrylate containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate or tetrahydrofurfuryl acrylate; a methacrylate, for example, an alkyl methacrylate (preferably an alkyl methacrylate containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate or tetrahydrofurfuryl methacrylate; an acrylamide, for example, acrylamide, an N-alkylacrylamide (the alkyl group of which is an alkyl group having from 1 to 10 carbon atoms, e.g., methyl, ethyl, propyl, butyl, tert-butyl, heptyl, octyl, cyclohexyl or hydroxyethyl group), an N,N-dialkylacrylamide (the alkyl group of which is an alkyl group having form 1 to 10 carbon atoms, e.g., methyl, ethyl, butyl, isobutyl, ethylhexyl or cyclohexyl group), N-hydroxyethyl-N-methylacrylamide and N-2-acetamidoethyl-N-acetylacrylamide; a methacrylamide, for example, methacrylamide, an N-alkylmethacrylamide (the alkyl group of which is an alkyl group having from 1 to 10 carbon atoms, e.g., methyl, ethyl, tert-butyl, ethylhexyl, hydroxyethyl or cyclohexyl group), an N,N-dialkylmethacrylamide (the alkyl group of which includes, e.g., ethyl, propyl and butyl groups) and N-hydroxyethyl-N-methylmethacrylamide; an allyl compound, for example, an allyl ester (e.g., allyl acetate, allyl caproate, ally caprate, allyl laurate, allyl palmitate, allyl stearate, allyl benzoate, allyl acetoacetate or ally lactate) and allyl oxyethanol; a vinyl ether, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylarninoethyl vinyl ether, benzyl vinyl ether or tetrahydrofurfuryl vinyl ether); a vinyl ester, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate or vinyl cyclohexylcarboxylate; a dialkyl itaconate, for example, dimethyl itaconate, diethyl itaconate or dibutyl itaconate; a monoalkyl or dialkyl fumarate, for example, dibutyl fumalate; and others, for example, crotonic acid, itaconic acid, maleic anhydride, maleimide, acrylonitrile, methacrylonitrile or maleonitrile.

In addition, any addition-polymerizable unsaturated compounds copolymerizable with monomers corresponding to the repeating structural units described above may be employed.

A molar ratio of each repeating structural unit in the acid-decomposable resin of component (B) can be appropriately determined taking the adjustment of many factors including dry etching resistance of resist, standard developing solution aptitude, adhesion to substrate, resist profile, and other characteristics ordinarily required for resist, for example, resolution, heat resistance and sensitivity into consideration.

Preferred embodiments of the acid-decomposable resin of component (B) according to the present invention include (1) resin (side chain type) containing a repeating unit having a partial structure including an alicyclic hydrocarbon represented by formula (pI), (pII), (pIII), (pIV), (pV) or (pVI), and (2) resin (main chain type) containing a repeating unit represented by formula (II).

The resin of (2) includes (3) resin (hybrid type) containing a repeating unit represented by formula (II), a maleic anhydride derivative and a (meth)acrylate structure.

A content of the repeating structural unit having a partial structure including an alicyclic hydrocarbon represented by formula (pI), (pII), (pIII), (pIV), (pV) or (pVI) is preferably from 30 to 70% by mole, more preferably from 35 to 65% by mole, and still more preferably from 40 to 60% by mole, based on the total repeating structural units in the acid-decomposable resin.

A content of the repeating structural unit represented by formula (II) is preferably from 10 to 60% by mole, more preferably from 15 to 55% by mole, and still more preferably from 20 to 50% by mole, based on the total repeating structural units in the acid-decomposable resin.

A content of the repeating structural unit corresponding to the additional copolymer component described above can be appropriately determined depending on the desired performance of resist. In general, the content is preferably 99% by mole or less, more preferably 90% by mole or less, still more preferably 80% by mole or less, and most preferably 50% by mole or less, to the sum total of the repeating structural unit having a partial structure including an alicyclic hydrocarbon represented by formula (pI), (pII), (pIII), (pIV), (pV) or (pVI) and the repeating structural unit represented by formula (II).

When the photosensitive composition of the present invention is used for ArF exposure, it is preferred that the acid-decomposable resin does not contain an aromatic group in order to ensure transparency of the ArF beam.

The acid-decomposable resin for use in the present invention can be synthesized according to conventional methods, for example, radical polymerization. For instance, in ordinary synthesis methods, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the composition of the present invention, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to correct the resulting powder or solid, thereby obtaining the polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

A weight average molecular weight of the resin of component (5) for use in the present invention is preferably form 1,000 to 200,000 measured by a GPC method and calculated in terms of polystyrene. It is not preferred that the weight average molecular weight of the resin is less than 1,000, since the degradation of heat resistance and dry etching resistance may occur. On the other hand, when the weight average molecular weight of the resin is more than 200,000, undesirable results, for example, the degradation of developing property and film-forming property due to severe increase in viscosity may occur.

A content of the resin of component (B) according to the present invention in the positive photoresist composition of the present invention is preferably from 40 to 99.99% by weight, and more preferably from 50 to 99.97% by weight, based on the total solid content of the photosensitive composition.

<(C) Basic compound>

It is preferred that the positive photosensitive composition of the present invention contains a basic compound of component (C) for restraining fluctuations in performances occurred with the passage of time from exposure to heating.

The basic compound preferably has a structure represented by any one of formulae (A) to (E) shown below.

(A)

In the above formula, $R^{250}$, $R^{251}$ and $R^{252}$, which may be the same or different, each independently represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{250}$ and $R^{251}$ may be combined with each other to form a ring,

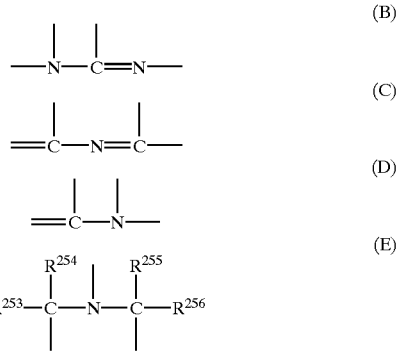

In the above formulae, $R^{253}$, $R^{254}$, $R^{255}$ and $R^{256}$, which may be the same or different, each independently represent an alkyl group having from 1 to 6 carbon atoms.

Preferred examples of the basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, substituted or unsubstituted aminoalkylmorpholines, mono-, di- or trialkylamines, substituted or unsubstituted anilines, substituted or unsubstituted piperidines and mono- or diethanolamine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Preferred specific examples of the basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 2,4,5-triphenylimidazole, tri(n-butyl)amine, tri (n-octyl)amine, N-phenyldiethanolamine, N-hydroxvethylpiperidine, 2,6-diisopropylaniline and N-cyclohexyl-N'-morpholinoethylthiourea. However, the basic compounds for use in the present invention are not limited thereto.

More preferred compounds include substituted or unsubstituted guanidines, substituted or unsubstituted aminopyrrolidines, substituted or unsubstituted pyrazoles, substituted or unsubstituted pyrazolines, substituted or unsubstituted piperazines, substituted or unsubstituted aminomorpholines, substituted or unsubstituted aminoalkylmorpholines and substituted or unsubstituted piperidines. Compounds having an imidazole structure, a diazabicyclo structure, an onium hydroxide structure, an onium carboxylate structure or a trialkylamine structure are also preferred.

The compound having an imidazole structure includes imidazole, 2,4,5-triphenylimidazole and benzimidazole. The compound having a diazabicyclo structure includes 1,4-diazabicyclo[2.2.2]octane, 1,5-diazabicyclo [4.3.0]non-5-ene and 1,8-diazabicyclo [5.4.0]undec-7-ene. The compound having an onium hydroxide structure includes a triarylsulfonium hydroxide, phenacyl sulfonium hydroxide and a 2-oxoalkyl group-containing sulfoniura hydroxide, e.g., triphenylsulfonium hydroxide, tris (t-butylphenyl) sulfonium hydroxide, bis(tert-butylphenyl) iodonium hydroxide, phenacyl thiopheniurn hydroxide or 2-oxopropylthiophenium hydroxide. The compound having an onium carboxylate structure includes a compound wherein an anion portion of the compound having an onium hydroxide structure is replaced by a carboxylate, e.g., acetate, adamantane-1-carboxylate or a perfluoroalkyl carboxylate. The compound having a trialkylamine structure includes an unsubstituted alkylamine, e.g., triethylamine, tributylamine, trioctylamine or dicyclohexylamine, and an alkylamine substituted with a hydroxy group, e.g., triethanolamine or N-hydroxyethylpiperidine.

The basic compound of component (C) may be used individually or as a mixture of two or more thereof. The amount of basic compound of component (C) used is ordinarily from 0.001 to 10% by weight, and preferably from 0.01 to 5% by weight, based on the solid content of the positive photosensitive composition. When the amount is less than 0.001% by weight, an effect of the addition of basic compound is not obtained. When the amount exceeds 10% by weight, on the other hand, the sensitivity tends to decrease or the developability tends to degrade in the unexposed area.

<(D) Fluorine-Base and/or Silicon-base Surface Active Agent>

It is preferred that the positive photosensitive composition of the present invention contains one or more of fluorine-base and/or silicon-base surface active agent (a fluorine atom-containing surface active agent, a silicon atom-containing surface active agent and a surface active agent containing both a fluorine atom and a silicon atom).

By the addition of the surface active agent of component (D), the positive photosensitive composition of the present invention can provide, at high sensitivity and good resolution, resist patterns having good adhesion and less defect in development, when an exposure light source of 250 nm or less, especially 220 nm or less is used.

Specific examples of the surface active agent of component (D) include those as described in JP-A-62-36663, JP-A-61-226746, JP-A-61-226745, JP-A-62-170950, JP-A-63-34540, JP-A-7-230165, JP-A-8-62834, JF-A-9-54432, JP-A-9-5988 and U.S. Pat. Nos. 5,405,720, 5,360,692, 5,529,881, 5,296,330, 5,436,098, 5,576,143, 5,294,511 and 5,824,451. Commercially available surface active agents described below may also be used as they are.

Examples of the commercially available surface active agent used include fluorine-base or silicon-base surface active agents, e.g., Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-base surface active agent.

The amount of surface active agent used is preferably from 0.0001 to 2% by weight, and more preferably from 0.001 to 1% by weight, based on the total amount of the positive photosensitive composition (excluding a solvent).

<(E) Organic Solvent>

The positive photosensitive composition of the present invention is used by dissolving the above-described components in the desired organic solvent.

Examples of the organic solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, it is preferred to use, as an organic solvent, a mixture of a solvent containing a hydroxy group and a solvent free from a hydroxy group. This makes it possible to restrain the generation of particles during storage of the resist solution.

Examples of the hydroxy group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are particularly preferred.

Examples of the solvent free from a hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Of these solvents, propylene glycol monomethyl ether acetate, ethyl ethoxypropionate, 2-heptanone, γ-butyrolactone, cyclohexanone and butyl acetate are particularly preferred, and propylene glycol monomethyl ether acetate, ethyl ethoxypropionate and 2-heptanone are most preferred.

A mixing ratio (by weight) of the hydroxy group-containing solvent to the solvent free from a hydroxy group ranges from 1/99 to 99/1, preferably from 10/90 to 90/10, and more preferably from 20/80 to 60/40. A mixed solvent containing not less than 50% by weight of the solvent free from a hydroxy group is also particularly preferred in view of uniform coating.

<(F) Acid Decomposable Dissolution Inhibiting Compound>

It is preferred that the positive photosensitive composition of the present invention contains a dissolution inhibiting low molecular weight compound of component (F) (hereinafter also referred to as an "acid decomposable dissolution inhibiting compound") having a group capable of being decomposed by the action of an acid to increase solubility in an alkali developing solution and having a molecular weight of not more than 3,000.

In order to prevent deterioration in transmittance at 220 nm or less, an alicyclic or aliphatic compound having an acid decomposable group, for example, a cholic acid derivative having an acid decomposable group as described in *Proceeding of SPIE*, 2724, 355(1966) is preferred as the acid decomposable dissolution inhibiting compound of component (F). Examples of the acid decomposable group and alicyclic structure are similar to those described regarding the acid decomposable resin of component (B) above.

The amount of acid decomposable dissolution inhibiting compound of component (F) used is preferably from 3 to 50% by weight, and more preferably 5 to 40% by weight, based on the solid content of the total positive photosensitive composition.

Specific examples of the acid decomposable dissolution inhibiting compound of component (F) are set forth below, but the present invention should not be construed as being limited thereto.

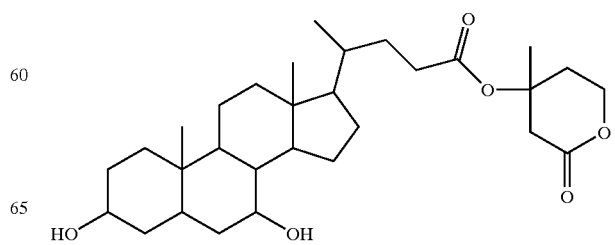

-continued

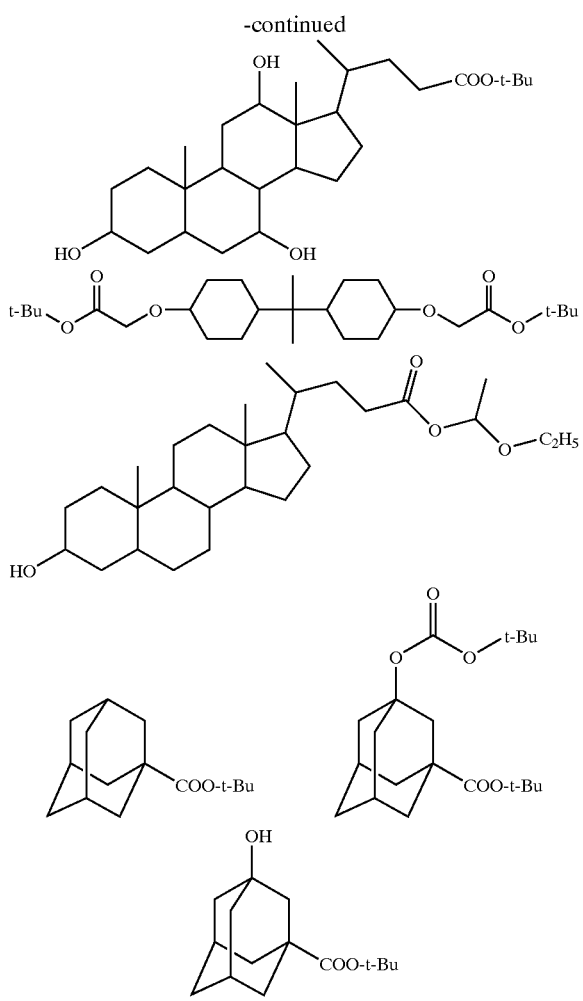

<(G) Alkali-soluble Resin>

The positive photosensitive composition of the present invention may contain a resin of component (G), which does not contain an acid-decomposable group, insoluble in water but soluble in an alkali developing solution. By the addition of such a resin, the sensitivity of the photosensitive composition can be improved.

In the present invention, a novolac resin having a molecular weight of from about 1,000 to about 20,000 and a polyhydroxystyrene derivative having a molecular weight of from about 3,000 to about 50,000 are used as such a resin. Since these resins have a large absorption of light of 250 nm or less, they are preferably used after being subjected to partial hydrogenation or in an amount not larger than 30% by weight based on the total amount of resin.

Resins having a carboxy group as an alkali-solubilizing group are also used. The carboxy group-containing resin preferably has a monocyclic or polycyclic alicyclic hydrocarbon group for improving dry etching resistance. Specific examples of such a resin include a methacrylic ester/(meth)acrylic acid copolymer having an alicyclic hydrocarbon structure which does not exhibit acid decomposability and a (meth)acrylic ester resin containing an alicyclic hydrocarbon group having a carboxy group at the terminal thereof.

<Other Additives>

Into the positive photosensitive composition of the present invention, a dye, a plasticizer, a surface active agent other than the surface active agent of component (D), a photosensitizer and a compound for promoting dissolution in a developing solution may be incorporated.

The dissolution promoting compound in a developing solution for use in the present invention is a low molecular weight compound having a molecular weight of not more than 1,000 and having at least two phenolic hydroxy groups or at least one carboxy group. In case of containing a carboxy group, an alicyclic or aliphatic compound is preferred because of the same reason as described above.

The amount of dissolution promoting compound used is preferably from 2 to 50% by weight, and more preferably from 5 to 30% by weight, based on the resin capable of being decomposed by the action of an acid to increase a solubility rate in an alkali developing solution of component (B). The amount exceeding 50% by weight is not preferred, because another problem of the increase in development residue or the deformation of patterns at development may occur.

Such a phenolic compound having a molecular weight of not more than 1,000 can be easily synthesized by one skilled in the art with reference to methods as described, for example, in JP-A-4-122938, JP-A-2-28531, U.S. Pat. No. 4,916,210 and European Patent 219,294.

Specific examples of the carboxy group-containing alicyclic or aliphatic compound include a carboxylic acid derivative having a steroid structure, e.g., cholic acid, deoxycholic acid or lithocholic acid, an adamantanecarboxylic acid derivative, adamantanedicarboxylic acid, cyclohexanecarboxylic acid and cyclohexanedicarboxylic acid, but the present invention should not be construed as being limited thereto.

To the photosensitive composition of the present invention, a surface active agent other than the fluorine-base and/or silicon-base surface active agent of component (D) may be added. Specific examples of such surface active agent include a nonionic surface active agent, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surface active agents may be used individually or in combination of two or more thereof.

<Method for Use>

The positive photosensitive composition of the present invention is applied onto a desired substrate after dissolving the above components in a desired organic solvent, preferably in the mixed solvent as described above.

Specifically, the photosensitive composition is applied to a substrate (e.g., silicon/silicon dioxide coating) as used for the production of a precision integrated circuit element by appropriate coating means, for example, a spinner or a coater.

After the application, the resulting photosensitive layer is exposed to light through a desired mask, followed by baking and development. Thus, good resist patterns are obtained. As light for the exposure, a far ultraviolet ray having preferably a wavelength of 250 nm or shorter, more preferably 220 nm or shorter is used. Specific examples thereof include a KrF excimer laser beam (248 nm)i an ArF excimer laser beam (193 nm), an $F_2$ excimer laser beam (157 nm), an X-ray and an electron beam. The ArF excimer laser beam (193 nm) is particularly preferred.

In the development step, a developing solution as described below is used. The developing solution for the positive photosensitive composition of the present invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine., a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A developing solution prepared by adding an appropriate amount of an alcohol or a surface active agent to the aqueous alkaline solution is also used, The present invention is described in more detail with reference to the following examples, but the present invention should not be construed as being limited thereto.

Synthesis Example of Acid Generator

Synthesis Example 1

Synthesis of Acid Generator (I-3)

In 800 ml of benzene was dissolved 50 g of diphenylsulfoxide, and to the solution was added 200 g of aluminum chloride, followed by refluxing for 24 hours. The reaction solution was gradually added to 2 liters of water, and to the mixture was added 400 ml of concentrated sulfuric acid, followed by heating at 70° C. for 10 minutes. The reaction solution was washed with 500 ml of ethyl acetate., filtered and then a solution containing 200 g of ammonium iodide dissolved in 400 ml of water was added thereto. The powder thus deposited was collected by filtration, washed with water and then with ethyl acetate, and dried to obtain 70 g of triphenylsulfonium iodide.

In 1,000 ml of methanol was dissolved 17.6 g of triphenylsulfonium iodide, and to the solution was added 12.5 g of silver oxide, follower by reacting at room temperature for 4 hours. The solution was filtered and 300 ml of a methanol solution containing 25 g of perfluoro-n-octanesulfonic acid was added to the filtrate. The reaction solution was concentrated, the oily product thus deposited was dissolved in ethyl acetate, and the solution was washed with water, dried and concentrated to obtain 20.5 g of the desired compound.

Synthesis Example 2

Synthesis of Acid Generator (I-5)

A mixture of 80 mmoles of di(tert-butylphenyl) sulfide, 20 mmoles of di(tert-butylphenyl) iodonium perfluoro-n-butanesulfonate and 4 mmoles of copper benzoate was stirred at 130° C. under a nitrogen gas stream for 4 hours. The reaction solution was allowed to cool, 100 ml of ethanol was added thereto, and the deposit was removed by filtration. The filtrate was concentrated and 200 ml of ether was added thereto. The powder thus deposited was collected by filtration, washed with ether and dried to obtain the desired compound.

Triphenylsulfonium perfluorobutanesulfonate and triphenylsulfonium triflate were commercially available products manufactured by Midori Kagaku Co., Ltd.

Other acid generators of (A1-1) were synthesized in a similar manner to the methods described above.

Synthesis Example 3

Synthesis of Acid Generator (II-11)

In 100 ml of acetonitrile was dissolved 11.8 g of tetrahydrothiophene, to the solution was gradually added 20 g of 1-bromo-3,3-dimethyl-2-butanone. The mixture was stirred at room temperature for 2 days to deposit powder. After adding 100 ml of ethyl acetate to the reaction solution, the powder was collected by filtration, washed with ethyl acetate and dried to obtain 24 g of 2-oxo-3,3-dimethylbutyltetrahydrothiophenium bromide.

In a mixed solvent of 500 ml of water and 100 ml of methanol was dissolved 10 g of potassium perfluorobutanesulfonate, and to the solution was added a solution containing 7.75 g of 2-oxo-3,3-dimethylbutyltetrahydrothiophenium bromide dissolved in 50 ml of methanol. The aqueous solution was extracted twice with each 100 ml of chloroform, and the organic phase was washed with water and concentrated to obtain an oily product. To the oily product was added ethyl acetate, and the solution was again concentrated to obtain a solid product. The solid product was collected by filtration and subjected to reslurry with diisopropyl ether to obtain 9 g of 2-oxo-3,3-dimethylbutyltetrahydrothiophenium perfluorobutanesulfonate.

2-Oxocyclohexylmethyl(2-norbornyl)sulfonium trifluoromethanesulfonate (II-4) was synthesized using the method as described in Synthesis Example 1 of JP-A-8-27102.

Other acid generators of (A1-2) were synthesized by reacting a corresponding sulfide compound with a halogenated alkyl to synthesize a sulfonium halogenide, and subjecting the latter to salt exchange with a sulfonic acid or sulfate.

Synthesis Example 4

Synthesis of Phenacylthiophenium Perfluorobutanesulfonate (III-1)

In 400 ml of acetonitrile was dissolved 53.2 g of tetrahydrothiophene, and to the solution was gradually added a solution containing 100 g of phenacyl bromide dissolved in 300 ml of acetonitrile. The solution was stirred at room temperature for 3 hours to deposit powder. The reaction solution was poured into 1,500 ml of ethyl acetate, and the powder deposited was collected by filtration and dried to obtain 137 g of phenacylthiophenium bromide.

In a mixed solvent of 200 ml of water and 200 ml of methanol was dissolved 60 g of potassium perfluorobutanesulfonate, and to the solution was added a solution containing 49,5 g of phenacylthiophenium bromide dissolved in 300 ml of water. The aqueous solution was extracted twice with each 200 ml of chloroform, and the organic phase was washed with water and concentrated to obtain a crude product. To the crude product was added 300 ml of distilled water, the mixture was heated at 100° C. for 30 minutes and cooled to deposit a solid product. The solid product was collected by filtration and subjected to reslurry with diisopropyl ether to obtain 77 g of phenacylthiophenium perfluorobutanesulfonate.

Synthesis Example 5

Synthesis of Phenacylthiophenium Perfluorooctanesulfonate (III-3)

Phenacylthiophenium perfluorooctanesulfonate was synthesized by subjecting phenacylthiophenium bromide to salt exchange with perfluorooctanesulfonic acid in the same manner as described above.

Synthesis Example 6

Synthesis of Phenacylthiophenium Trifluoromethanesulfonate (III-2)

Phenacylthiophenium trifluoromethanesulfonate was synthesized by subjecting phenacylthiophenium bromide to salt exchange with trifluoromethanesulfonic acid in the same manner as described above.

Other acid generators of (A1-3) were synthesized by reacting a corresponding phenacyl halogenide with a sulfide compound to synthesize a phenacylsulfonium halogenide, and subjecting the latter to salt exchange with a sulfonic acid or sulfate.

Synthesis Example of Resin

Synthesis Example 1

Synthesis of Resin (1) (Side Chain Type)

2-Ethyl-2-adamantyl methacrylate and butyrolactone methacrylate in a molar ratio of 55/45 were dissolved in a mixed solvent of methyl ethyl ketone and tetrahydrofuran (5/5 by weight) to prepare 100 ml of a solution having a solid concentration of 20% by weight. To the solution was added 2% by mole of V-65 manufactured by Wako Pure Chemical Industries, Ltd., and the solution was added dropwise to 10 ml of methyl ethyl ketone heated at 60° C. under a nitrogen gas stream over a period of 4 hours. After the completion of the addition, the reaction solution was heated for 4 hours and 1% by mole of V-65 was again added thereto, followed by stirring for 4 hours. Then, the reaction solution was cooled to room temperature and poured into 3 liters of a mixed solvent of distilled water and isopropyl alcohol (1/1 by weight) to crystallize, and the white powder deposited was recovered to obtain Resin (1).

A monomer unit composition ratio of the resin determined by $C^{13}$NMR was 46/54. A weight average molecular weight thereof measured by GPC method and indicated in terms of standard polystyrene was 10,700.

Resins (2) to (15) were synthesized in a similar manner to Synthesis Example (1) respectively. The monomer unit composition ratio and weight average molecular weight of each of Resins (2) to (15) are shown in Table 1 below. In Table 1, Repeating Units 1, 2, 3 and 4 denote the repeating units of Resins (2) to (15) shown below in order from left to right, respectively.

TABLE 1

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 53 | 40 | 7 | — | 13,400 |
| 3 | 46 | 34 | 20 | — | 9,400 |
| 4 | 42 | 31 | 27 | — | 8,300 |

TABLE 1-continued

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 5 | 49 | 42 | 9 | — | 9,900 |
| 6 | 42 | 30 | 28 | — | 10,300 |
| 7 | 39 | 35 | 26 | — | 8,900 |
| 8 | 46 | 22 | 30 | 2 | 12,900 |
| 9 | 42 | 20 | 32 | 6 | 11,600 |
| 10 | 46 | 42 | 12 | — | 9,200 |
| 11 | 38 | 32 | 30 | — | 11,300 |
| 12 | 42 | 18 | 38 | 2 | 13,800 |
| 13 | 38 | 31 | 29 | 2 | 11,100 |
| 14 | 50 | 31 | 19 | — | 11,700 |
| 15 | 35 | 6 | 16 | 43 | 13,200 |

Structures of Resins (1) to (15) are shown below.

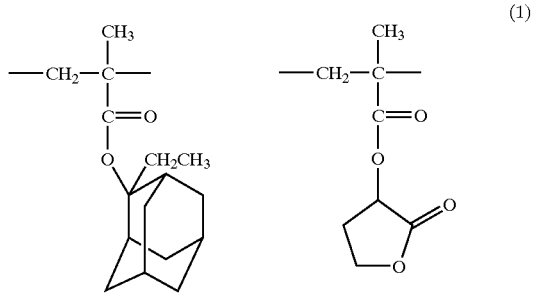

(1)

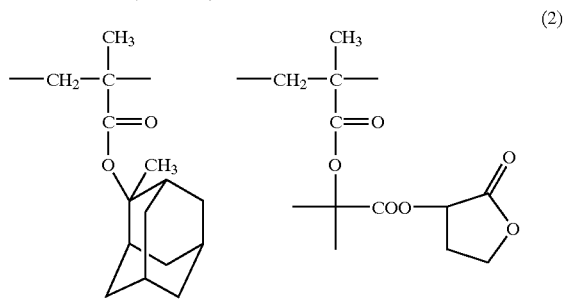

(2)

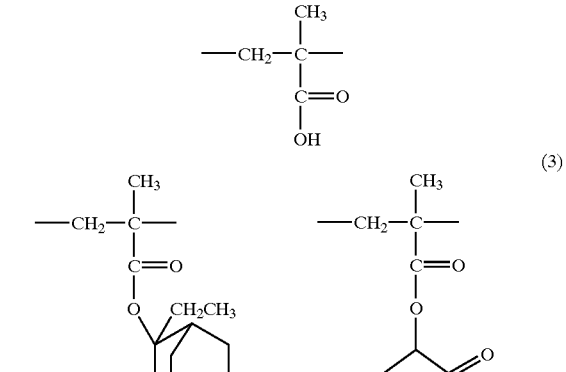

(3)

-continued
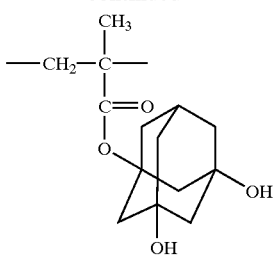
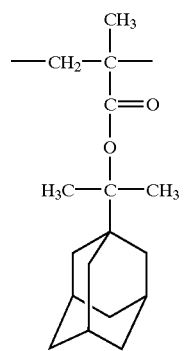
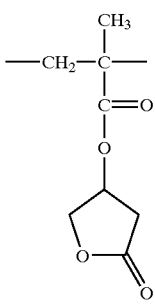
(4)
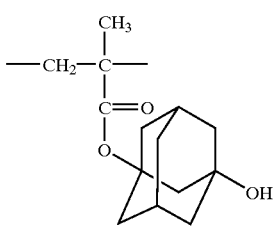
(5)
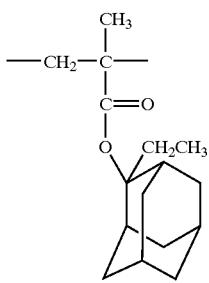
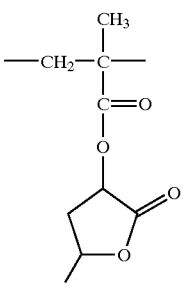
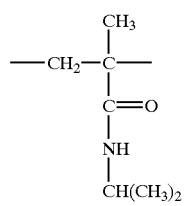
(6)
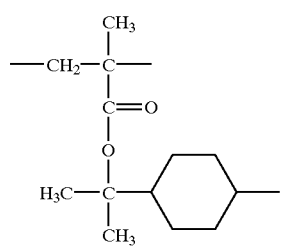
-continued
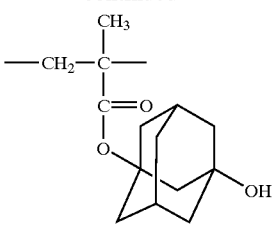
(7)
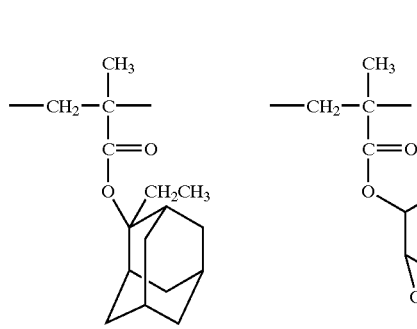
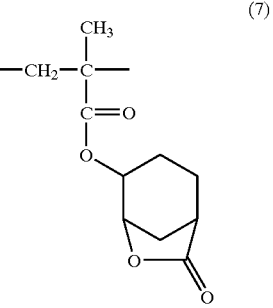
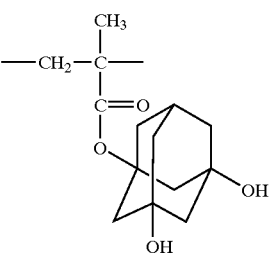
(8)
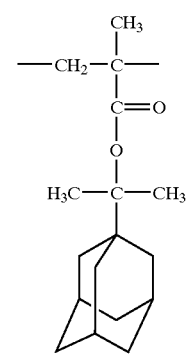
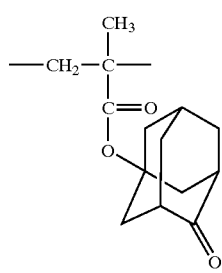
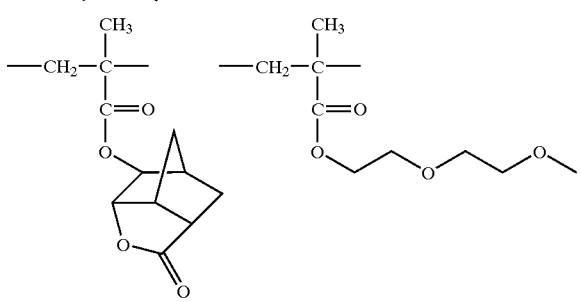

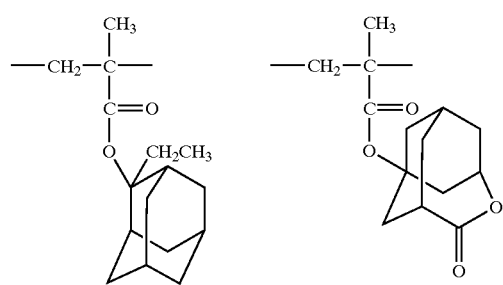
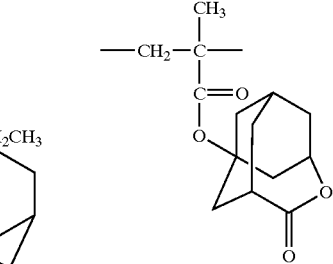
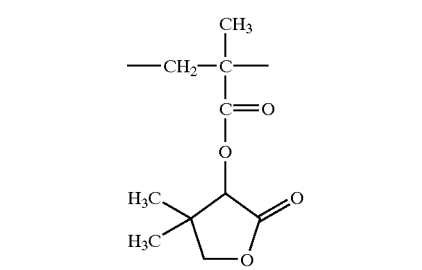
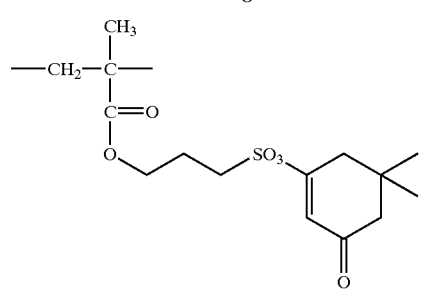
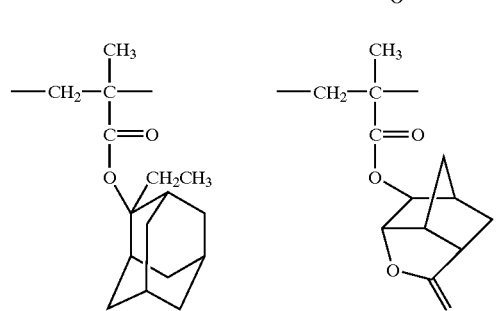
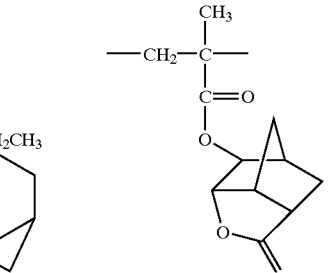
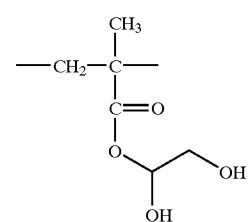
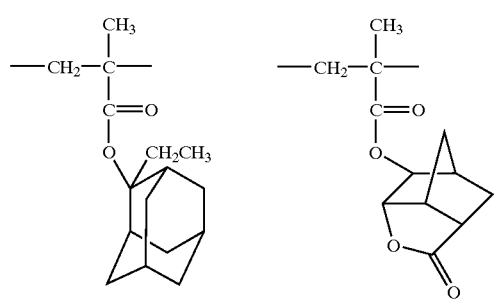
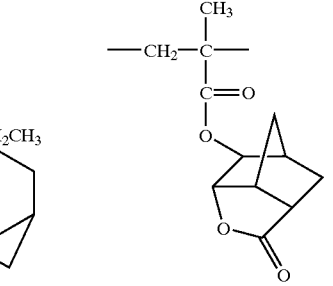
(9)
(10)
(11)
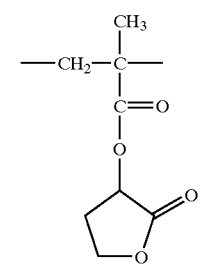
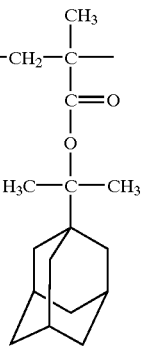
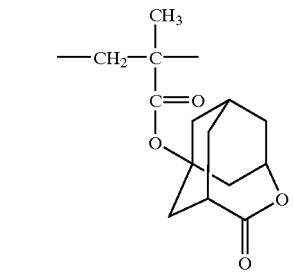
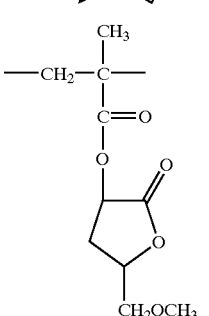
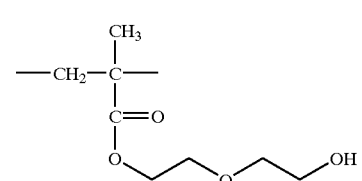
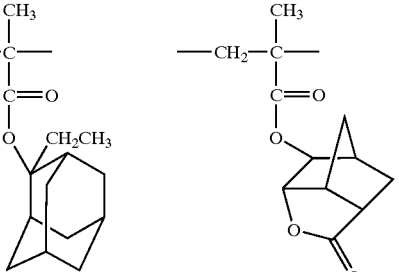
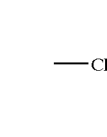
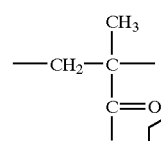
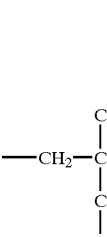
(12)
(13)

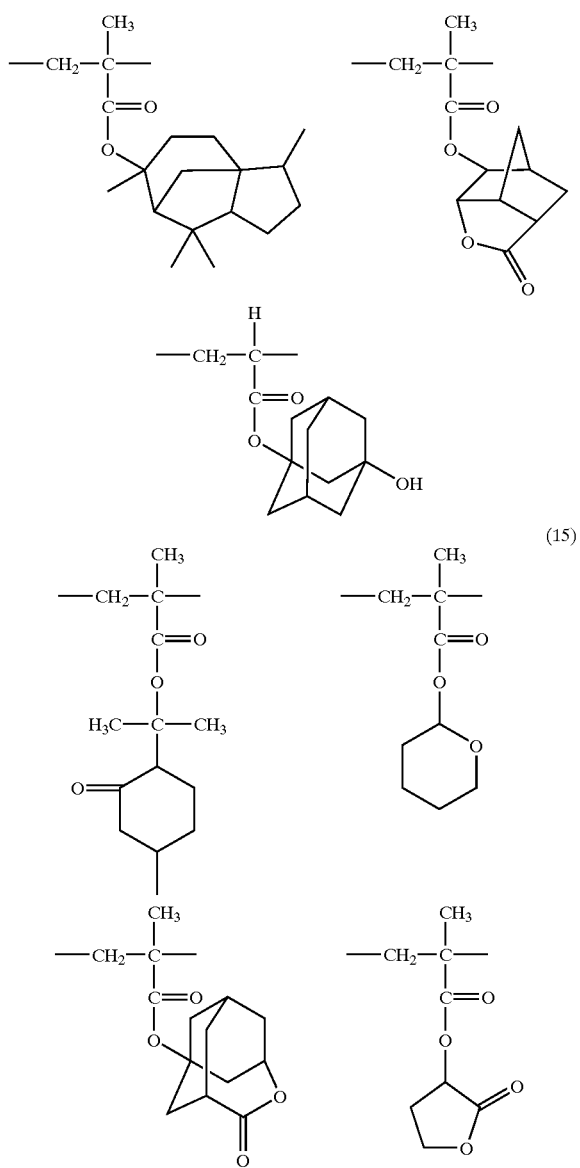

(14)

(15)

Synthesis Example 2

Synthesis of Resin (16) (Main Chain Type)

Into a separable flask were put tert-butyl ester of norbornenecarboxylic acid, butyrolactone ester of norbornenecarboxylic acid and maleic anhydride in a molar ratio of 40/10/50 and tetrahydrofuran in an amount necessary: for forming a solution having a reaction concentration of 60% by weight, and the solution was heated at 60° C. under a nitrogen gas stream. After the reaction temperature was stabilized, 2% by mole of a radical initiator (V-601 manufactured by Wako Pure Chemical Industries, Ltd.) was added to initiate a reaction. After heating for 12 hours, the reaction mixture was diluted twice with tetrahydrofuran and poured into a solvent mixture of hexane and isopropyl alcohol (1/1 by weight) to deposit white powder. The powder was collected by filtration and dried to obtain Resin (16).

Resin (16) was subjected to molecular weight analysis by a GPC method and it was found that a weight average molecular weight thereof indicated in terms of polystyrene was 8,300. A molar ratio of repeating units corresponding to the tert-butyl ester of norbornenecarboxylic acid, butyrolactone ester of norbornenecarboxylic acid and maleic anhydride determined from an NMR spectrum was 42/8/50.

Resins (17) to (27) were synthesized in a similar manner to Synthesis Example (2) respectively. The monomer unit composition ratio and weight average molecular weight of each of Resins (17) to (27) are shown in Table 2 below. In Table 2, Alicyclic Olefin Units 1, 2 and 3 denotes the repeating units of Resins (17) to (27) shown below in order from left to right, respectively.

TABLE 2

| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|
| 17 | 35 | 15 | — | 50 | 8,200 |
| 18 | 20 | 30 | — | 50 | 8,600 |
| 19 | 36 | 14 | — | 50 | 9,100 |
| 20 | 31 | 19 | — | 50 | 7,900 |
| 21 | 35 | 5 | 10 | 50 | 8,300 |
| 22 | 33 | 17 | — | 50 | 8,500 |
| 23 | 38 | 12 | — | 50 | 8,900 |
| 24 | 31 | 6 | 13 | 50 | 8,100 |
| 25 | 33 | 7 | 10 | 50 | 9,100 |
| 26 | 40 | 10 | — | 50 | 9,300 |
| 27 | 34 | 16 | — | 50 | 8,800 |

Structures of Resins (16) to (27) are shown below.

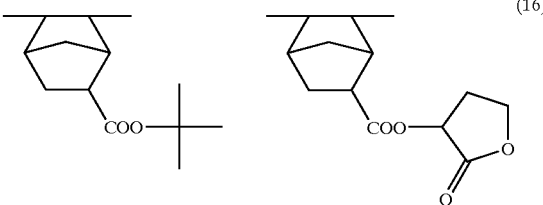

(16)

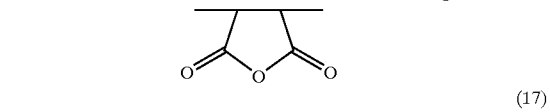

(17)

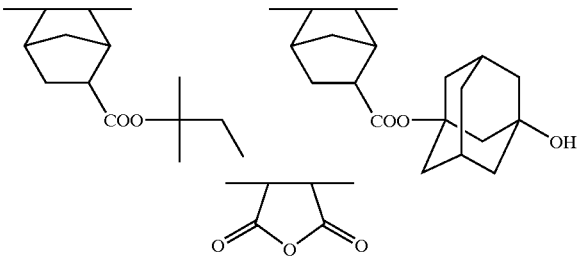

(18)

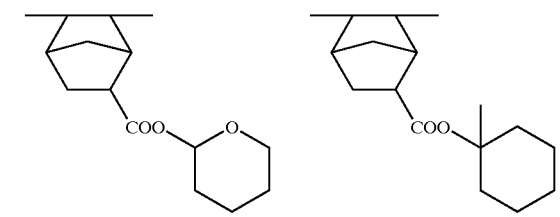

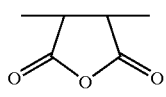
(19)
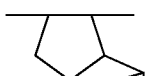
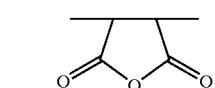
(20)
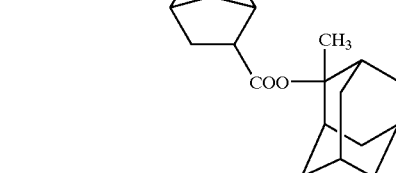
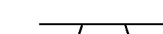
(21)
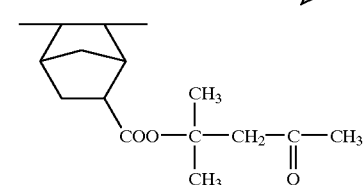
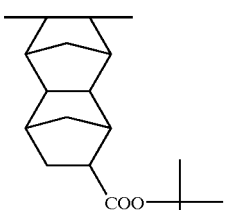
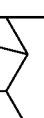
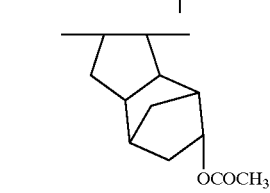
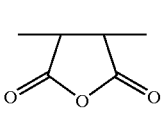
(22)
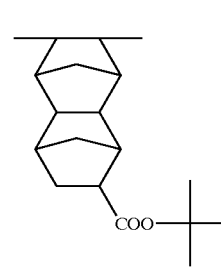
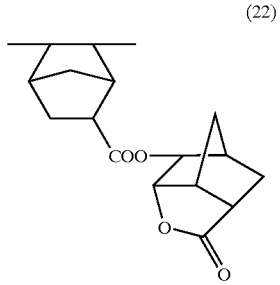
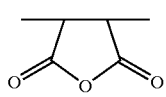
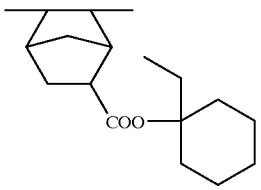
(23)
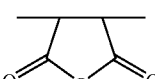
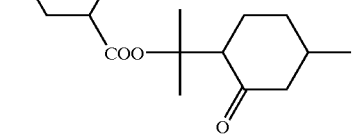
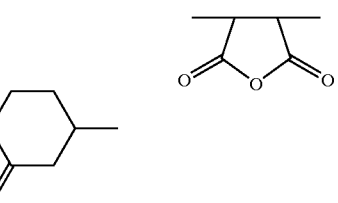
(24)
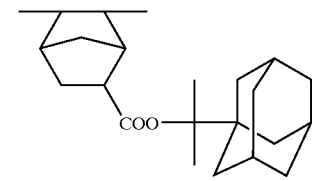
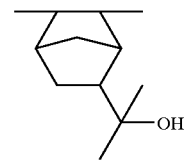
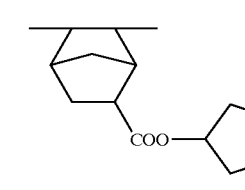
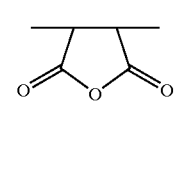
(25)
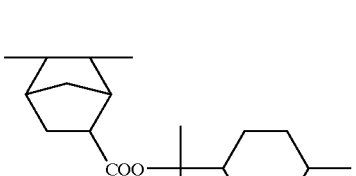
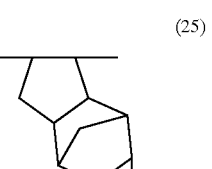
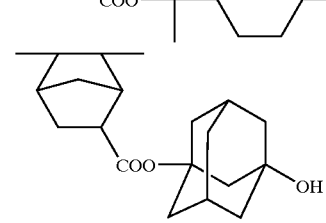
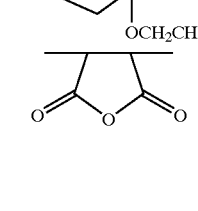
(26)
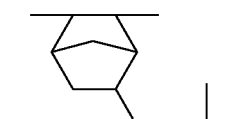
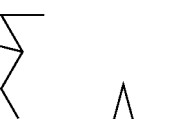
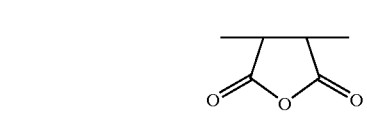
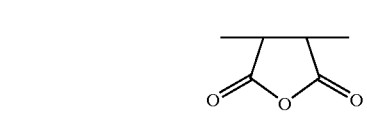

-continued

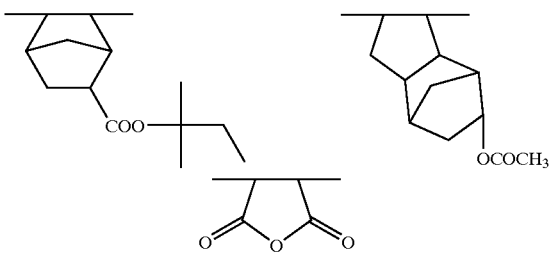

(27)

Synthesis Example 3

Synthesis of Resin (28) (Hybrid Type)

Into a reaction vessel were put norbornene, maleic anhydride, tert-butyl acrylate and 2-methylcyclohexyl-2-propyl acrylate in a molar ratio of 35/35/20/10 and dissolved in tetrahydrofuran to form a solution having a solid content of 60% by weight, and the solution was heated at 65° C. under a nitrogen gas stream. After the reaction temperature was stabilized, 1% by mole of a radical initiator (V-601 manufactured by Wako Pure Chemical Industries, Ltd.) was added to initiate a reaction. After heating for 8 hours, the reaction mixture was diluted twice with tetrahydrofuran and poured into hexane of five times in volume to deposit white powder. The powder was collected by filtration and dissolved in methyl ethyl ketone and the solution was poured into a mixed solvent of hexane and tert-butyl methyl ether (1/1 by weight) of five times in volume to reprecipitate. The white powder deposited was collected by filtration and dried to obtain Resin (28).

Resin (28) was subjected to molecular weight analysis by a GPC method and it was found that a weight average molecular weight thereof indicated in terms of polystyrene was 12,100. A molar ratio of repeating units corresponding to the norbornene, maleic anhydride, tert-butyl acrylate and 2-methylcyclohexyl-2-propyl acrylate determined from an NMR spectrum was 32/39/19/10.

Resins (29) to (41) were synthesized in a similar manner to Synthesis Example (3) respectively. The monomer unit composition ratio and weight average molecular weight of each of Resins (29) to (41) are shown in Table 3 below. In Table 3, Norbornene Unit, Acid Anhydride Unit and (Meth) acrylate Unit denotes the repeating units of Resins (29) to (41) shown below in order from left to right, respectively.

TABLE 3

| Resin | Norbornene Unit (mol %) | Acid Anhydride Unit (mol %) | (Meth) acrylate Unit (mol %) | Weight Average Molecular Weight |
|---|---|---|---|---|
| 29 | 20/15 | 40 | 15/10 | 11,900 |
| 30 | 32 | 37 | 20/8/3 | 10,500 |
| 31 | 16 | 21 | 36/27 | 13,900 |
| 32 | 15 | 22 | 34/29 | 12,300 |
| 33 | 17 | 20 | 33/30 | 12,400 |
| 34 | 18 | 24 | 32/26 | 13,000 |
| 35 | 15 | 19 | 36/30 | 12,700 |
| 36 | 15 | 20 | 29/10/26 | 13,100 |
| 37 | 17 | 21 | 31/31 | 12,800 |
| 38 | 18 | 17/3 | 30/32 | 13,300 |
| 39 | 16 | 19 | 31/12/11/11 | 12,600 |
| 40 | 20 | 22 | 58 | 14,700 |
| 41 | 23 | 28 | 35/14 | 13,300 |

Structures of Resins (28) to (41) are shown below.

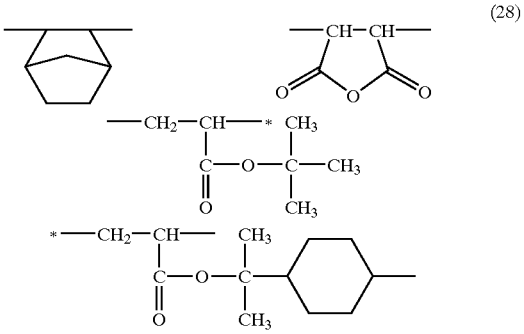

(28)

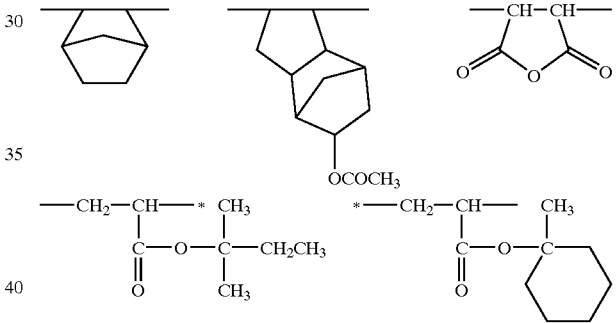

(29)

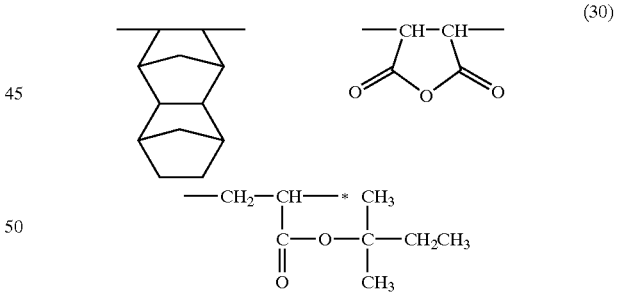

(30)

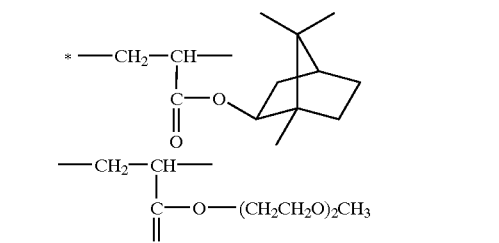

(31)

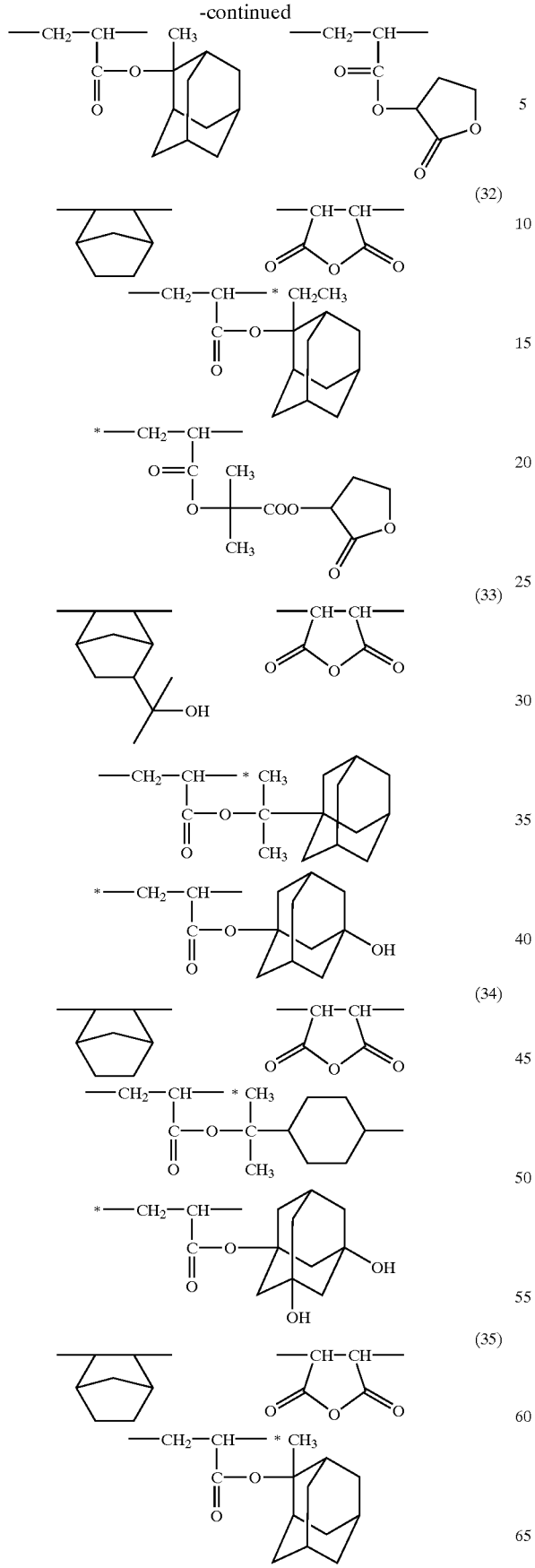

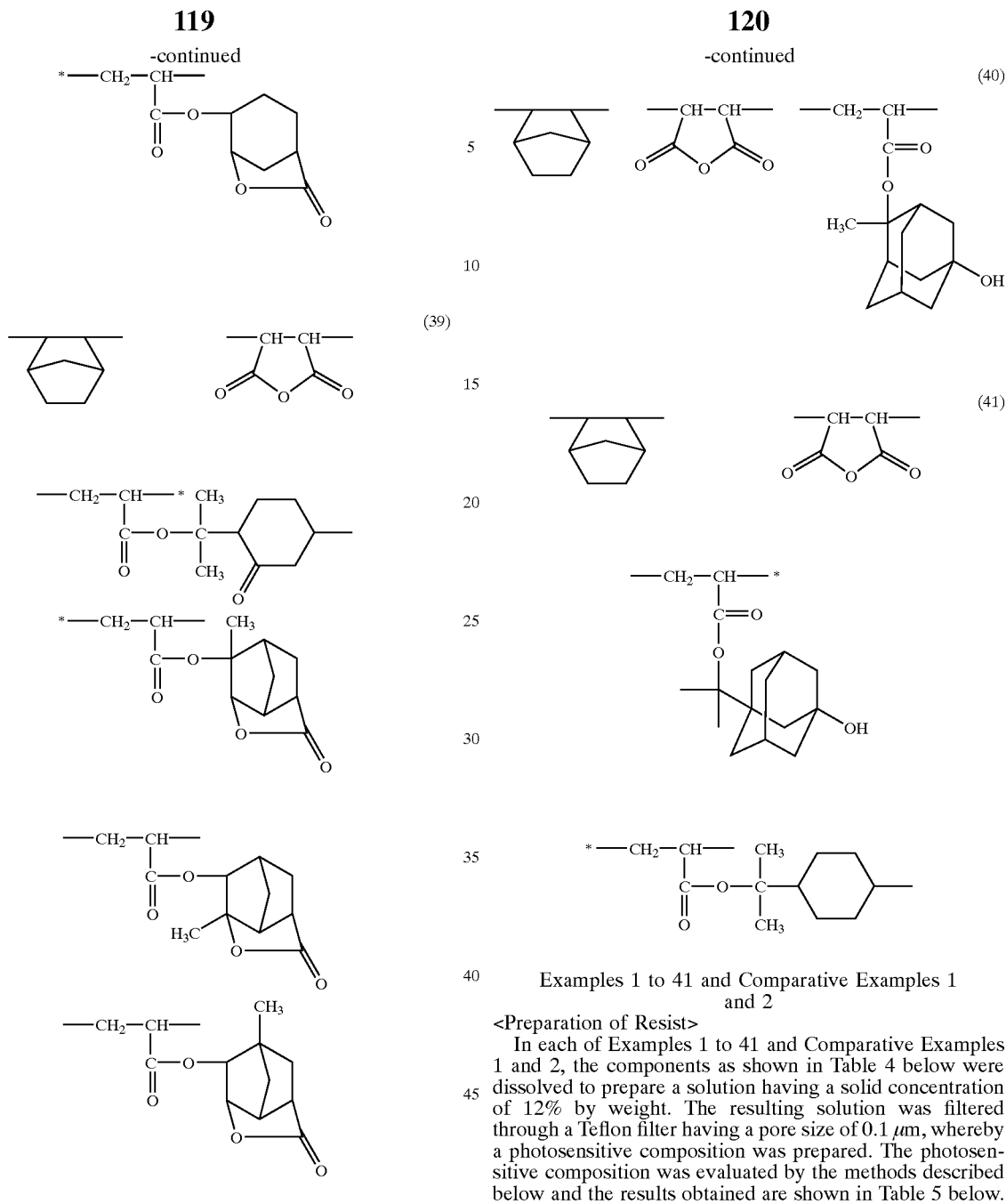

Examples 1 to 41 and Comparative Examples 1 and 2

<Preparation of Resist>

In each of Examples 1 to 41 and Comparative Examples 1 and 2, the components as shown in Table 4 below were dissolved to prepare a solution having a solid concentration of 12% by weight. The resulting solution was filtered through a Teflon filter having a pore size of 0.1 μm, whereby a photosensitive composition was prepared. The photosensitive composition was evaluated by the methods described below and the results obtained are shown in Table 5 below.

TABLE 4

|  | Resin (10 g) | Acid Generator (A1) (g) | Acid Generator (A2) (g) | Basic Compound (g) | Surface Active Agent (0.03 g) | Solvent (weight ratio) | Others (g) |
|---|---|---|---|---|---|---|---|
| Example 1 | Resin (1) | I-2 (0.2) | A2-1-1 (0.03) | DBN (0.02) | W-1 | A1 = 100 | — |
| Example 2 | Resin (2) | I-5 (0.1) I-1 (0.05) | A2-1-2 (0.02) | TPI (0.03) | W-1 | A1 = 100 | — |

TABLE 4-continued

| | Resin (10 g) | Acid Generator (A1) (g) | Acid Generator (A2) (g) | Basic Compound (g) | Surface Active Agent (0.03 g) | Solvent (weight ratio) | Others (g) |
|---|---|---|---|---|---|---|---|
| Example 3 | Resin (3) | I-12 (0.2) III-2 (0.3) | A2-1-3 (0.015) | TPSA (0.02) | W-2 | A1 = 100 | — |
| Example 4 | Resin (4) | I-11 (0.1) III-2 (0.3) | A2-1-4 (0.01) | HEP (0.01) | W-2 | A3/B2 = 80/20 | a2 (0.05) |
| Example 5 | Resin (5) | I-10 (0.15) | A2-1-6 (0.01) | — | W-3 | A2/B1 = 90/10 | a6 (0.01) |
| Example 6 | Resin (6) | I-12 (0.1) II-7 (0.7) | A2-1-7 (0.01) | — | W-3 | A4/B1 = 90/10 | LCB (1) |
| Example 7 | Resin (7) | I-11 (0.1) II-7 (0.2) III-1 (0.2) | A2-1-32 (0.02) | TPA (0.007) | W-4 | A1/B1 = 50/50 | |
| Example 8 | Resin (8) | I-11 (0.2) | A2-1-46 (0.01) | DBN (0.02) | W-4 | A1/B1 = 90/10 | — |
| Example 9 | Resin (9) | I-22 (0.15) A1-5-1 (0.5) | A2-1-39 (0.02) | TPI (0.03) | W-1 | A5/B2 = 90/10 | — |
| Example 10 | Resin (10) | III-1 (0.5) | A2-1-13 (0.02) | TPI (0.02) | W-1 | A1/B1 = 95/5 | a14 (0.1) |
| Example 11 | Resin (11) | II-8 (1) | A2-2-6 (0.02) | TPI (0.03) | W-2 | A1/B1 = 90/10 | a16 (0.2) |
| Example 12 | Resin (12) | I-17 (0.15) A1-7-1 (0.1) | A2-3-9 (0.05) | TPI (0.03) | W-2 | A1/B1 = 95/5 | |
| Example 13 | Resin (13) | III-11 (0.4) | A2-1-37 (0.01) | TPI (0.03) | W-3 | A1/B1 = 95/5 | — |
| Example 14 | Resin (14) | I-11 (0-1) III-15 (0.1) | A2-1-45 (0.3) | DBN (0.02) | W-3 | A1/B1 = 95/5 | — |
| Example 15 | Resin (15) | III-4 (0.5) | A2-1-40 (0.3) | TPI (0.03) | W-4 | A1/B1 = 80/20 | a4 (0.05) |
| Example 16 | Resin (16) | II-12 (0.5) III-1 (0.3) | A2-1-38 (0.02) | TPA (0.01) | W-4 | A1 = 100 | — |
| Example 17 | Resin (17) | I-11 (0.15) II-7 (0.7) | A2-1-7 (0.01) | TPI (0.03) | W-4 | A1 = 100 | a6 (0.01) |
| Example 18 | Resin (18) | I-5 (0.2) II-20 (0.1) | A2-1-8 (0.02) | DCMA (0.01) | W-4 | A1 = 100 | A8 (0.02) |
| Example 19 | Resin (19) | I-7 (0.1) II-5 (0.3) | A2-1-41 (0.01) | TPI (0.02) | W-4 | A1/B1 = 95/5 | — |
| Example 20 | Resin (20) | I-8 (0.15) II-9 (0.4) | A2-1-15 (0.1) | TPI (0.03) | W-4 | A1/B1 = 95/5 | — |
| Example 21 | Resin (21) | I-11 (0.1) III-1 (0.4) | A2-1-28 (0.03) | DBN (0.02) | W-1 | A1/B1 = 95/5 | — |
| Example 22 | Resin (22) | I-12 (0.15) III-2 (0.2) | A2-1-39 (0.02) | TPI (0.03) | W-1 | A1/B1 = 80/20 | — |
| Example 23 | Resin (23) | I-17 (0.1) III-15 (0.2) | A2-1-16 (0.01) | TPSA (0.02) | W-2 | A1/B1 = 90/10 | — |
| Example 24 | Resin (24) | I-8 (0.1) III-11 (0.2) | A2-1-12 (0.02) | HEP (0.01) | W-2 | A3/B2 = 80/20 | — |
| Example 25 | Resin (25) | I-12 (0.1) III-15 (0.4) | A2-3-2 (0.1) | — | W-3 | A2/B1 = 90/10 | — |
| Example 26 | Resin (26) | II-8 (0.4) III-1 (0.3) | A2-1-1 (0.01) | — | W-3 | A4/B1 = 90/10 | — |
| Example 27 | Resin (27) | II-7 (0.6) III-15 (0.3) | A2-1-2 (0.02) | TPA (0.007) | W-4 | A1/B1 = 50/50 | LCB (1) |
| Example 28 | Resin (28) | II-12 (0.5) III-1 (0.3) | A2-1-3 (0.015) | DBN (0.02) | W-4 | A1/B1 = 90/10 | — |
| Example 29 | Resin (29) | II-10 (0.5) III-1 (0.5) | A2-1-4 (0.01) | TPI (0.03) | W-1 | A5/B2 = 90/10 | — |
| Example 30 | Resin (30) | I-11 (0.1) II-8 (0.3) III-1 (0.3) | A2-1-6 (0.01) | TPI (0.02) | W-1 | A1/B1 = 95/5 | — |
| Example 31 | Resin (31) | I-2 (0.2) A1-4-1 (0.05) | A2-1-7 (0.01) | TPI (0.03) | W-2 | A1/B1 = 90/10 | — |
| Example 32 | Resin (32) | I-5 (0.1) I-1 (0.05) | A2-1-32 (0.02) | TPI (0.03) | W-2 | A1/B1 = 95/5 | — |
| Example 33 | Resin (33) | I-12 (0.2) III-2 (0.3) | A2-1-46 (0.01) | TPI (0.03) | W-3 | A1/B1 = 95/5 | — |
| Example 34 | Resin (34) | I-11 (0.1) III-1 (0.3) | A2-1-39 (0.02) | DBN (0.02) | W-3 | A1/B1 = 95/5 | — |

TABLE 4-continued

| | Resin (10 g) | Acid Generator (A1) (g) | Acid Generator (A2) (g) | Basic Compound (g) | Surface Active Agent (0.03 g) | Solvent (weight ratio) | Others (g) |
|---|---|---|---|---|---|---|---|
| Example 35 | Resin (35) | I-26 (0.15) A1-6-2 (0.1) | A2-1-13 (0.02) | TPI (0.03) | W-4 | A1/B1 = 80/20 | — |
| Example 36 | Resin (36) | I-12 (0.1) II-23 (0.7) | A2-2-6 (0.02) | TPI (0.01) | W-4 | A1/B1 = 80/20 | — |
| Example 37 | Resin (37) | I-23 (0.1) II-7 (0.2) III-1 (0.2) | A2-3-9 (0.05) | TPI (0.03) | W-4 | A1/B1 = 95/5 | — |
| Example 38 | Resin (38) | I-11 (0.2) | A2-1-37 (0.01) | DCMA (0.01) | W-4 | A1/B1 = 95/5 | — |
| Example 39 | Resin (39) | I-21 (0.15) | A2-1-45 (0.3) | TPI (0.02) | W-4 | A1/B1 = 95/5 | — |
| Example 40 | Resin (40) | III-19 (0.5) | A2-1-40 (0.3) | TPI (0.03) | W-4 | A1/B1 = 95/5 | — |
| Example 41 | Resin (41) | II-24 (1) | A2-1-38 (0.02) | DBN (0.02) | W-1 | A1/B1 = 95/5 | — |
| Comparative Example 1 | Resin (1) | I-2 (0.2) | — | DBN (0.02) | W-1 | A1 = 100 | — |
| Comparative Example 2 | Resin (1) | — | A2-1-1 (0.2) | DBN (0.02) | W-1 | A1 = 100 | — |

Explanation of the abbreviations in Table 4:

DBN: 1,5-Diazabicyclo[4.3.0]non-5-ene
TPI: 2,4,5-Triphenylimidazole
TPSA: Triphenylsulfonium acetate
HEP: N-Hydroxyethylpiperidine
DCMA: Dicyclohexylmethylamine
TPA: Tripentylamine
LCB: tert-Butyl lithocholate
W-1: Megafax F176 (manufactured by Dainippon Ink and Chemicals, Inc.) (fluorine-base)
W-2: Megafac R08 (manufactured by Dainippon Ink and Chemicals, Inc.) (fluorine- and siliconbase)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)
A1: Propylene glycol methyl ether acetate
A2: 2-Hepnanone
A3: Ethyl ethoxypropionate
A4: γ-Butylolactone
A5: Cyclohexanone
B1: Propylene glycol methyl ether
B2: Ethyl lactate <Evaluation of Pattern>

On a silicon substrate which had been subjected to a hexamethyldisilazane treatment was uniformly coated a reflection preventing film (ARC 25 manufactured by Brewer Science, Inc.) at a thickness of 600 angstroms by a spin coater, dried at 100° C. for 90 seconds on a hot plate, and further dried by heating at 190° C. for 240 seconds. Then, each of the photosensitive compositions described above was coated thereon by a spin coater and dried at 120° C. for 90 seconds to form a resist film having a thickness of 0.30 $\mu$m. The resist film was subjected to exposure using an ArF excimer laser stepper (manufacture by ISI Co., Ltd.; NA=0.6) through a mask and heated at 120° C. for 90 seconds on a hot plate immediately after the exposure. Then the resist film was developed with a 2.38% by weight aqueous tetramethylammonium hydroxide solution at 23° C. for 60 seconds, rinsed with pure water for 30 seconds, and dried to form a line pattern.

Sensitivity:

The sensitivity was expressed by an exposure amount necessary for reproducing a mask pattern of 0.16 $\mu$m.

Resolution:

The resolution was expressed using a limiting resolution in the exposure amount necessary for reproducing a mask pattern of 0.16 $\mu$m.

Pitch Dependency:

A line width of isolated line (line and space: 1/10) in the exposure amount necessary for reproducing a mask pattern of 0.16 $\mu$m (line and space: 1/1) was measured and a difference between the line width and 0.16 $\mu$m was determined to evaluate the pitch dependency (nm). As the value is smaller, the pitch dependency is smaller and better.

The results of evaluation are shown in Table 5.

TABLE 5

| Example | Sensitivity (mJ/cm$^2$) | Resolution ($\mu$m) | Pitch Dependency (nm) |
|---|---|---|---|
| 1 | 15 | 0.105 | 5 |
| 2 | 18 | 0.11 | 5 |
| 3 | 17 | 0.11 | 6 |
| 4 | 16 | 0.105 | 7 |
| 5 | 20 | 0.11 | 9 |
| 6 | 18 | 0.11 | 7 |
| 7 | 19 | 0.105 | 5 |
| 8 | 17 | 0.105 | 6 |
| 9 | 18 | 0.11 | 7 |
| 10 | 20 | 0.105 | 6 |
| 11 | 16 | 0.11 | 7 |
| 12 | 15 | 0.11 | 6 |
| 13 | 20 | 0.105 | 8 |
| 14 | 17 | 0.105 | 7 |
| 15 | 19 | 0.105 | 8 |
| 16 | 18 | 0.115 | 6 |
| 17 | 15 | 0.12 | 7 |
| 18 | 18 | 0.115 | 10 |
| 19 | 17 | 0.12 | 8 |
| 20 | 16 | 0.12 | 8 |

TABLE 5-continued

| Example | Sensitivity (mJ/cm²) | Resolution (μm) | Pitch Dependency (nm) |
|---|---|---|---|
| 21 | 20 | 0.115 | 6 |
| 22 | 19 | 0.12 | 5 |
| 23 | 17 | 0.115 | 7 |
| 24 | 18 | 0.115 | 5 |
| 25 | 20 | 0.12 | 9 |
| 26 | 16 | 0.115 | 8 |
| 27 | 15 | 0.12 | 8 |
| 28 | 20 | 0.12 | 7 |
| 29 | 17 | 0.12 | 10 |
| 30 | 19 | 0.115 | 5 |
| 31 | 18 | 0.12 | 9 |
| 32 | 15 | 0.115 | 10 |
| 33 | 19 | 0.115 | 6 |
| 34 | 18 | 0.115 | 6 |
| 35 | 20 | 0.12 | 7 |
| 36 | 20 | 0.12 | 5 |
| 37 | 19 | 0.12 | 7 |
| 38 | 17 | 0.115 | 6 |
| 39 | 18 | 0.115 | 5 |
| 40 | 20 | 0.115 | 9 |
| 41 | 16 | 0.12 | 8 |
| Comparative Example1 | 19 | 0.13 | 23 |
| Comparative Example2 | >100 | Not resolved | Not resolved |

It is apparent from the results shown in Table 5 that the positive photosensitive composition of the present invention exhibits the excellent sensitivity, resolution and pitch dependency.

According to the present invention, the positive photosensitive composition, which has the small pitch dependency in addition to the excellent sensitivity and resolution, can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive photosensitive composition comprising (A1) a compound that generates an alkanesulfonic acid in which the α-position is substituted with a fluorine atom upon irradiation of an actinic ray or radiation, (A2) an onium salt of an alkanesulfonic acid in which the α-position is not substituted with a fluorine atom, and (B) a resin that has a monocyclic or polycyclic alicyclic hydrocarbon structure, does not contain an aromatic aroup and is decomposed by the action of an acid to increase a solubility rate in an alkali developing solution.

2. The positive photosensitive composition as claimed in claim 1, wherein the onium salt of component (A2) is a sulfonium salt, an iodonium salt or an ammonium salt.

3. The positive photosensitive composition as claimed in claim 1, wherein the onium salt of an alkanesulfonic acid in which the α-position is not substituted with a fluorine atom of component (A2) is a compound represented by the following formula (A2-1), (A2-2) or (A2-3):

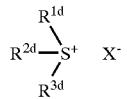
(A2-1)

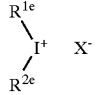
(A2-2)

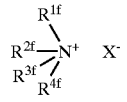
(A2-3)

wherein $R^{1d}$, $R^{2d}$ and $R^{3d}$, which may be the same or different, each independently represent an organic residue, or two of $R^{1d}$, $R^{2d}$ and $R^{3d}$ may be combined with each other to form a ring, and the ring may contain an oxygen atom, a sulfur atom, an ester bond, an amido bond or a carbonyl group; $R^{1e}$, $R^{2e}$, $R^{1f}$, $R^{2f}$, $R^{3f}$ and $R^{4f}$, which may be the same or different, each independently represent a substituted or unsaturated alkyl group or a substituted or unsaturated aryl group; $R^{1f}$, $R^{2f}$, $R^{3f}$ and $R^{4f}$ each may represents a hydrogen atom; and $X^-$ represents an alkanesulfonic acid anion in which the carbon atom at the α-position is not substituted with a fluorine atom.

4. The positive photosensitive composition as claimed in claim 1, wherein the resin of component (B) is a resin containing at least one repeating unit selected from a repeating unit having a partial structure including an alicyclic hydrocarbon represented by formula (pI), (pII), (pIII), (pIV), (pV) or (pVI) described below and a repeating unit represented by formula (II) described below:

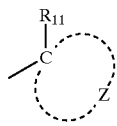
(pI)

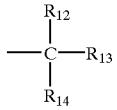
(pII)

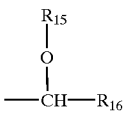
(pIII)

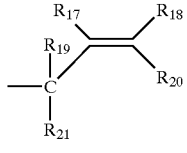
(pIV)

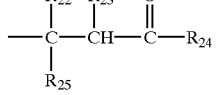
(pV)

-continued (pVI)

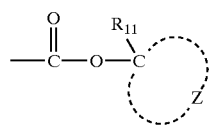

wherein $R_{11}$ represents a methyl group, an ethyl group, an n-propyl group, an isobutyl group or a sec-butyl group; Z represents an atomic group necessary for forming an alicyclic hydrocarbon group together with the carbon atom; $R_{12}$ to $R_{16}$ each independently represent a straight chain or branched alkyl group having from 1 to 4 carbon atoms or an alicyclic hydrocarbon group, provided that at least one of $R_2$ to $R_{14,}$ and either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring, (II)

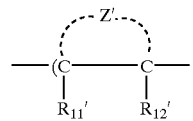

wherein $R_{11}'$ and $R^{12'}$, which may be the same or different, each independently represent a hydrogen atom, a cyano group, a halogen atom or an alkyl group which may have a substituent; and Z' represents an atomic group necessary for forming an alicyclic structure, which may be substituted, together with the connected two carbon atoms (C—C).

5. The positive photosensitive composition as claimed in claim 4, wherein the repeating unit represented by formula (II) is a repeating unit represented by the following formula (II-A) or (II-B):

(II-A)

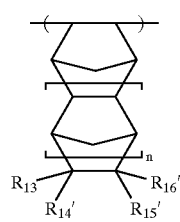

(II-B)

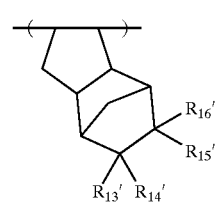

wherein $R_{13}'$ to $R_{16}'$, which may be the same or different, each independently represents a hydrogen atom, a halogen atom, a cyano group, —COOH, —COOR$_5$, a group capable of decomposing by the action of acid, —C(=O)—X—A'—R$_{17}'$, an alkyl group which may have a substituent or a cyclic hydrocarbon group which may have a substituent; $R_5$ represents an alkyl group which may have a substituent, a cyclic hydrocarbon group which may have a substituent or a group represented by Y; X represents an oxygen atom, a sulfur atom, —NH—, —NHSO$_2$— or —NHSO$_2$NH—; A' represents a single bond or a divalent linkage group, or at least two of $R_{13}'$ to $R_{16}'$ may be combined with each other to form a ring; n represents 0 or 1; $R_7'$ represents —COOH, —COOR$_5$, —CN, a hydroxy group, an alkoxy group which may have a substituent, —CO—NH—R$_6$, —CO—NH—SO$_2$—R$_6$ or a group represented by Y; $R_6$ represents an alkyl group which may have a substituent or a cyclic hydrocarbon group which may have a substituent; and the group represented by Y has the following formula:

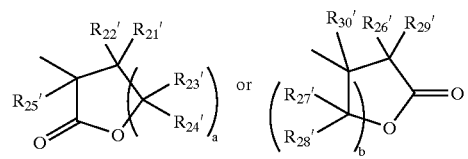

wherein $R_{21}'$ to $R_{30}'$, which may be the same or different, each independently represents a hydrogen atom or an alkyl group which may have a substituent; and a and b each represent 1 or 2.

6. The positive photosensitive composition as claimed in claim 1, wherein the resin of component (B) further contains a repeating unit having a group represented by the following formula (VIII):

(VIII)

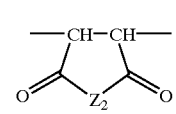

wherein $Z_2$ represents —O— or —N(R$_{41}$)—; $R_{41}$, represents a hydrogen atom, a hydroxy group, an alkyl group, a haloalkyl group or —O—SO$_2$—R$_{42}$; and $R_{42}$ represents an alkyl group, a haloakyl group, a cycloalkyl group or a camphol residue.

7. The positive photosensitive composition as claimed in claim 1 further comprising a basic compound.

8. The positive photosensitive composition as claimed in claim 7, wherein the basic compound is a compound having a structure represented by any one of the following formulas (A) to (E):

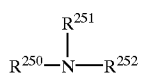
(A)

wherein $R^{250}$, $R^{251}$ and $R^{252}$, which may be the same or different, each independently represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{250}$ and $R^{251}$ may be combined with each other to form a ring,

(B)

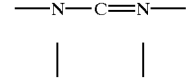
(C)

(D)

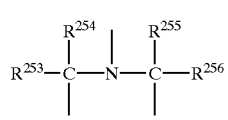
(E)

wherein $R^{253}$, $R^{254}$, $R^{255}$ and $R^{256}$, which may be the same or different, each independently represent an alkyl group having from 1 to 6 carbon atoms.

9. The positive photosensitive composition as claimed in claim 1 further comprising a fluorine-base and/or silicon-base surface active agent.

10. A positive photosensitive composition comprising (A1) a compound that generates an alkanesulfonic acid in which the α-position is substituted with a fluorine atom upon irradiation of an actinic ray or radiation. (A2) an onium salt of an alkanesulfonic acid in which the α-position is not substituted with a fluorine atom, and (B) a resin that has a monocyclic or polycyclic alicyclic hydrocarbon structure and is decomposed by the action of an acid to increase a solubility rate in an alkali developing solution, wherein the resin of component (B) contains a repeating unit having a lactone structure.

11. The positive photosensitive composition as claimed in claim 10, wherein the repeating unit having a lactone structure is represented by the following formula (IV):

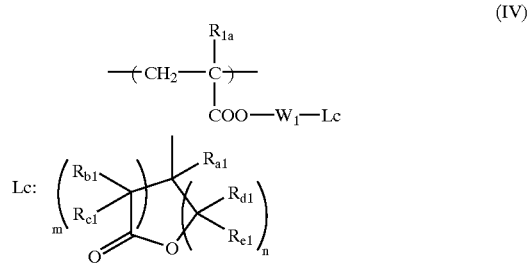
(IV)

wherein $R_{1a}$ represents a hydrogen atom or a methyl group; $W_1$ represents a single bond, an alkylene group, an ether group, a thioether group, a carbonyl group, an ester group or a combination of two or more thereof; $R_{a1}$, $R_{b1}$, $R_{c1}$, $R_{d1}$ and $R_{e1}$, which may be the same or different, each independently represent a hydrogen atom or an alkyl group having from 1 to 4 carbon atoms; and m and n, which may be the same or different, each independently represent an integer of from 0 to 3, provided that the sum total of m and n is from 2 to 6.

12. The positive photosensitive composition as claimed in claim 10, wherein the resin of component (B) further contains a repeating unit having a group represented by the following formula (VII):

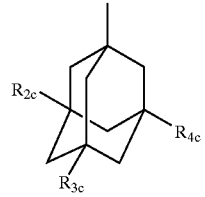
(VII)

wherein $R_{2c}$, $R_{3c}$ and $R_{4c}$, which may be the same or different, each represent a hydrogen atom or a hydroxy group, provided that at least one of $R_{2c}$, $R_{3c}$ and $R_{4c}$ represents a hydroxy group.

13. A positive photosensitive composition comprising (A1) a compound that generates an alkanesulfonic acid in which the α-position is substituted with a fluorine atom upon irradiation of an actinic ray or radiation, (A2) an onium salt of an alkanesulfonic acid in which the α-position is not substituted with a fluorine atom, and (B) a resin that has a monocyclic or polycyclic alicyclic hydrocarbon structure and is decomposed by the action of an acid to increase a solubility rate in an alkali developing solution, wherein the compound of component (A1) is a sulfonium salt.

14. The positive photosensitive composition as claimed in claim 13, wherein the compound that generates an alkanesulfonic acid in which the α-position is substituted with a fluorine atom upon irradiation of an actinic ray or radiation of component (A1) is a sulfonium salt, which is composed of an anion portion and a cation portion, represented by the following formula (A1):

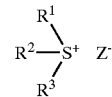
(A1)

wherein $R^1$, $R^2$ and $R^3$, which may be the same or different, each independently represent an organic residue, or two of $R^1$, $R^2$ and $R^3$ may be combined with each other to form a ring, and the ring may contain an oxygen atom, a sulfur atom, an ester bond, an amido bond or a carbonyl group; and $Z^-$ represents a counter anion, which is an alkanesulfonic acid anion in which the carbon atom at the α-position is substituted with a fluorine.

15. The positive photosensitive composition as claimed in claim 14, wherein the sulfonium salt is a compound represented by formula (A1) wherein $R^1$, $R^2$ and $R^3$, which may be the same or different, each represent an aryl group.

16. The positive photosensitive composition as claimed in claim 14, wherein the sulfonium salt is a compound represented by formula (A1) wherein $R^1$, $R^2$ and $R^3$, which may be the same or different, each independently represent an organic residue that does not contain an aromatic ring.

17. The positive photosensitive composition as claimed in claim 13, wherein the sulfonium salt is a compound represented by the following formula (A1-3):

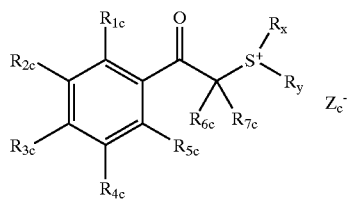

(A1-3)

wherein $R^{1c}$ to $R_{5c}$, which may be the same or different, each independently represent a hydrogen atom, an alkyl group, an alkoxy group or a halogen atom; $R_{6c}$ and $R_{7c}$, which may be the same or different, each independently represent a hydrogen atom, an alkyl group or an aryl group; $R_x$ and $R_y$, which may be the same or different, each independently represent an alkyl group, a 2-oxoalkyl group, an alkoxycarbonylmethyl group, an allyl group or a vinyl group, or two or more of $R_{1c}$ to $R_{7c}$ and $R_x$ and $R_y$ may be combined with each other to form a ring structure, respectively, and the ring structure may contain an oxygen atom, a sulfur atom, an ester bond or an amido bond; and $Z_c^-$ represents an alkanesulfonic acid anion in which the carbon atom at the α-position is substituted with a fluorine atom.

18. A positive photosensitive composition comprising (A1) a compound that generates an alkanesulfonic acid in which the α-position is substituted with a fluorine atom upon irradiation of an actinic ray or radiation, (A2) an onium salt of an alkanesulfonic acid in which the α-position is not substituted with a fluorine atom, and (B) a resin that has a monocyclic or polycyclic alicyclic hydrocarbon structure and is decomposed by the action of an acid to increase a solubility rate in an alkali developing solution, wherein the resin of component (B) further contains a repeating unit having a group represented by any one of the following formulae (V-1) to (V-4):

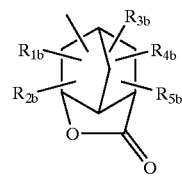

(V-1)

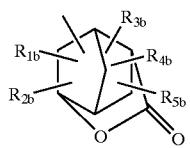

(V-2)

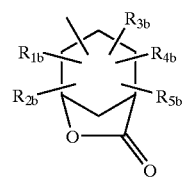

(V-3)

-continued

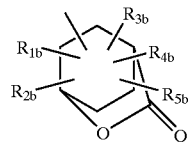

(V-4)

wherein $R_{1b}$, $R_{2b}$, $R_{3b}$, $R_{4b}$ and $R_{5b}$, which may be the same or different, each independently represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

19. The positive photosensitive composition as claimed in claim 18, wherein the resin of component (B) further contains a repeating unit having a group represented by the following formula (VII):

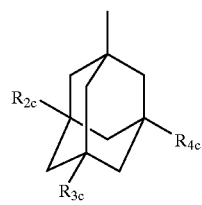

(VII)

wherein $R_{2c}$, $R_{3c}$ and $R_{4c}$, which may be the same or different, each represent a hydrogen atom or a hydroxy group, provided that a least one of $R_{2c}$, $R_{3c}$ and $R_{4c}$ represents a hydroxy group.

20. A positive photosensitive composition comprising (A1) a compound that generates an alkanesulfonic acid in which the α-position is substituted with a fluorine atom upon irradiation of an actinic ray or radiation, (A2) an onium salt of an alkanesulfonic acid in which the α-position is not substituted with a fluorine atom, and (B) a resin that has a monocyclic or polycyclic alicyclic hydrocarbon structure and is decomposed by the action of an acid to increase a solubility rate in an alkali developing solution, wherein the resin of component (B) further contains a repeating unit having a group represented by the following formula (VI):

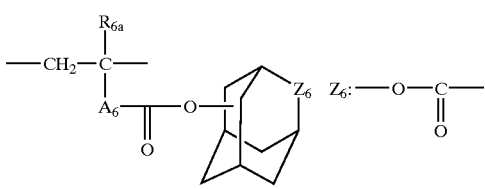

(VI)

or

wherein $A_6$ represents a single bond, an alkylene group, a cycloalkylene group, an ether group, a thioether group, a carbonyl group, an ester group or a combination of two or more thereof; $R_{6a}$ represents a hydrogen atom, an alkyl group having from 1 to 4 carbon atoms, a cyano group or a halogen atom.

21. A positive photosensitive composition comprising (A1) a compound that generates an alkanesulfonic acid in which the α-position is substituted with a fluorine atom upon irradiation of an actinic ray or radiation, (A2) an onium salt of an alkanesulfonic acid in which the α-position is not substituted with a fluorine atom, and (B) a resin that has a monocyclic or polycyclic alicyclic hydrocarbon structure and is decomposed by the action of an acid to increase a solubility rate in an alkali developing solution, wherein the resin of component (B) further contains a repeating unit having a group represented by the following formula (VII):

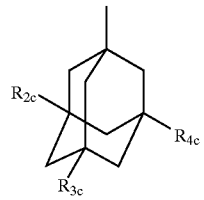

(VII)

wherein $R_{2c}$, $R_{3c}$ and $R_{4c}$, which may be the same or different, each represent a hydrogen atom or a hydroxy group, provided that at least one of $R_{2c}$, $R_{3c}$ and $R_{4c}$ represents a hydroxy group.

* * * * *